United States Patent
Kim et al.

(10) Patent No.: US 10,727,181 B2
(45) Date of Patent: Jul. 28, 2020

(54) FUSE STRUCTURE HAVING AIR DUMMY FUSES AND SEMICONDUCTOR DEVICE INCLUDING THE SAME

(71) Applicant: SK hynix Inc., Gyeonggi-do (KR)

(72) Inventors: Jae-Hong Kim, Gyeonggi-do (KR); Seo-Woo Nam, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/196,651

(22) Filed: Nov. 20, 2018

(65) Prior Publication Data

US 2019/0109089 A1 Apr. 11, 2019

Related U.S. Application Data

(63) Continuation of application No. 15/646,860, filed on Jul. 11, 2017, now Pat. No. 10,163,782, which is a
(Continued)

(30) Foreign Application Priority Data

Feb. 4, 2016 (KR) .................. 10-2016-0014089

(51) Int. Cl.
*H01L 23/52* (2006.01)
*H01L 23/532* (2006.01)
(Continued)

(52) U.S. Cl.
CPC ...... *H01L 23/5256* (2013.01); *H01L 21/7682* (2013.01); *H01L 23/522* (2013.01);
(Continued)

(58) Field of Classification Search
CPC ............... H01L 23/5256; H01L 23/522; H01L 23/5283; H01L 23/53228; H01L 23/5329;
(Continued)

(56) References Cited

U.S. PATENT DOCUMENTS 5,608,257 A * 3/1997 Lee .................... H01L 23/5258
257/529
6,271,574 B1 * 8/2001 Delpech ............. H01L 23/5256
257/529
(Continued)

FOREIGN PATENT DOCUMENTS

| CN | 101159258 | 4/2008 |
|---|---|---|
| CN | 101814491 | 8/2010 |

(Continued)

OTHER PUBLICATIONS

Office Action issued by the Chinese Intellectual Property Office dated Aug. 5, 2019.
(Continued)

*Primary Examiner* — Ida M Soward
(74) *Attorney, Agent, or Firm* — IP & T Group LLP

(57) ABSTRACT

A fuse structure includes a fusing line including a first portion, a second portion, and a central portion between the first portion and the second portion; and a dummy fuse neighboring the fusing line, the dummy fuse may include: a first air dummy fuse including a plurality of first air gaps extending in a first direction parallel to the fusing line; and a second air dummy fuse including a second air gap extending in a second direction crossing the fusing line.

7 Claims, 38 Drawing Sheets

Related U.S. Application Data continuation of application No. 15/196,988, filed on Jun. 29, 2016, now Pat. No. 9,735,104.

(51) Int. Cl.
| | |
|---|---|
| *H01L 27/11* | (2006.01) |
| *H01L 29/06* | (2006.01) |
| *H01L 23/525* | (2006.01) |
| *H01L 23/522* | (2006.01) |
| *H01L 49/02* | (2006.01) |
| *H01L 21/768* | (2006.01) |
| *H01L 23/528* | (2006.01) |
| *H01L 27/112* | (2006.01) |

(52) U.S. Cl.
CPC ...... *H01L 23/5283* (2013.01); *H01L 23/5329* (2013.01); *H01L 23/53228* (2013.01); *H01L 23/53295* (2013.01); *H01L 27/11206* (2013.01); *H01L 28/00* (2013.01); *H01L 29/0649* (2013.01)

(58) Field of Classification Search
CPC ......... H01L 23/53295; H01L 27/11206; H01L 28/00; H01L 29/0649
See application file for complete search history.

(56) References Cited

U.S. PATENT DOCUMENTS

| | | | |
|---|---|---|---|
| 6,295,721 B1* | 10/2001 | Tsai | .................... H01L 23/5258 257/209 |
| 6,486,526 B1 | 11/2002 | Narayan et al. | |
| 6,566,729 B1* | 5/2003 | Okada | ................ H01L 23/5258 257/209 |
| 6,586,815 B2 | 7/2003 | Ohhashi | |
| 6,649,997 B2* | 11/2003 | Koike | ................. H01L 23/5254 257/529 |
| 6,806,107 B1* | 10/2004 | Wu | .......................... H01L 22/34 257/48 |
| 6,858,914 B2 | 2/2005 | Nanjo et al. | |
| 6,972,474 B2* | 12/2005 | Hashimoto | ......... H01L 23/5258 257/209 |
| 7,892,926 B2 | 2/2011 | Barth et al. | |
| 8,541,264 B2* | 9/2013 | Lin | ..................... H01L 23/5258 257/529 |
| 8,592,941 B2 | 11/2013 | Gambino et al. | |
| 8,681,527 B2* | 3/2014 | Obayashi | ................ G11C 17/18 257/529 |
| 8,937,365 B2* | 1/2015 | Minami | ............... H01L 23/5256 257/209 |
| 9,099,469 B2* | 8/2015 | Choi | .................... H01L 23/5256 |
| 2008/0315355 A1* | 12/2008 | Oda | ................... H01L 23/5256 257/529 |
| 2014/0008759 A1 | 1/2014 | Jang | |
| 2016/0049367 A1* | 2/2016 | Rou | .................. H01L 21/76897 257/506 |
| 2016/0064173 A1* | 3/2016 | Bukacek | .............. H01H 85/042 337/159 |

FOREIGN PATENT DOCUMENTS

| | | |
|---|---|---|
| CN | 102104043 | 9/2015 |
| TW | 201535666 | 4/2013 |
| TW | 201316494 | 9/2015 |

OTHER PUBLICATIONS

Office Action issued by the Taiwanese Patent Office dated Dec. 18, 2019.

* cited by examiner

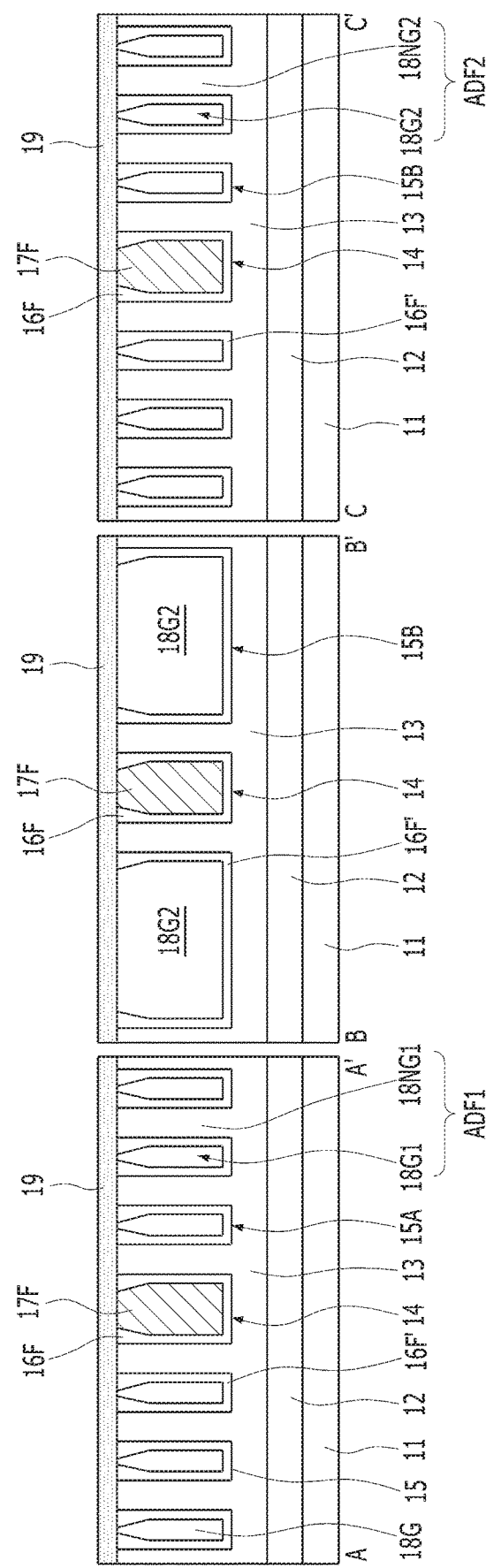

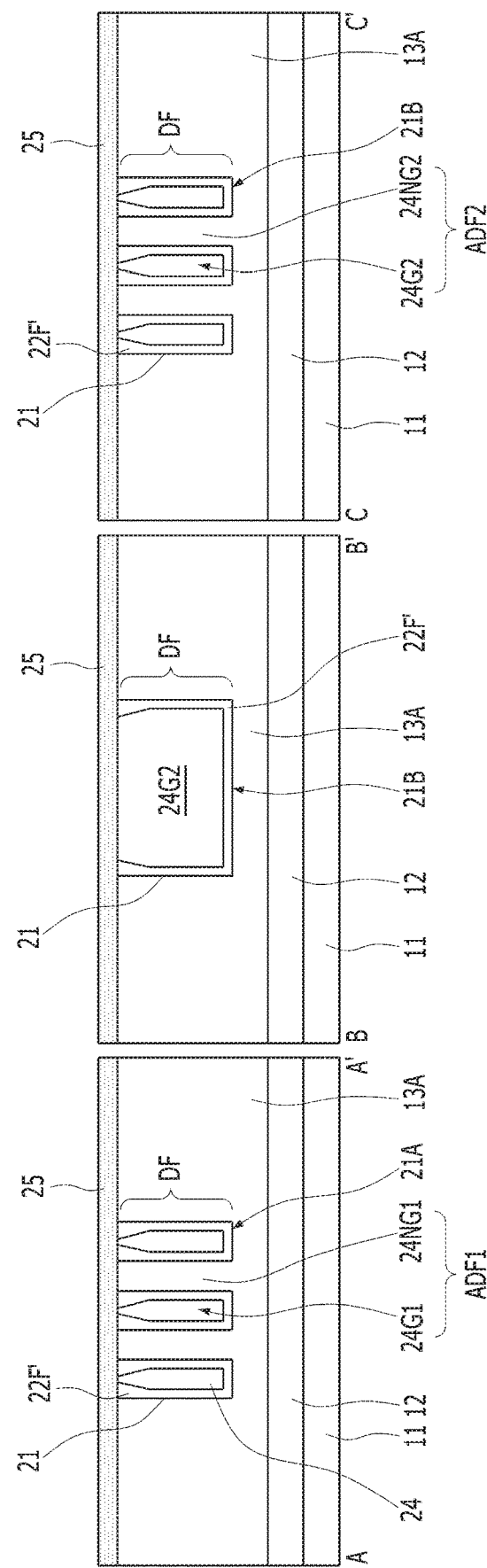

FUSE STRUCTURE HAVING AIR DUMMY FUSES AND SEMICONDUCTOR DEVICE INCLUDING THE SAME

CROSS-REFERENCE TO RELATED APPLICATION

This application is a continuation of U.S. patent application Ser. No. 15/646,860 filed on Jul. 11, 2017 which is a continuation of U.S. patent application Ser. No. 15/196,988 filed on Jun. 29, 2016 and now issued as U.S. Pat. No. 9,735,104, which claims priority under 35 U.S.C. § 119(a) to Korean Patent Application No. 10-2016-0014089 filed on Feb. 4, 2016 in the Korean Intellectual Property Office. The disclosure of each of the foregoing application is incorporated herein by reference in its entirety.

TECHNICAL FIELD

Exemplary embodiments relate to a semiconductor device and, more particularly, to a semiconductor device including a fuse structure.

DISCUSSION OF THE RELATED ART

Recently, as electronic appliances trend toward miniaturization, low power consumption, high performance, multi-functionality, and so on, semiconductor devices capable of storing information in various electronic appliances such as a computer, a portable communication device, and so on have been demanded in the art. Such semiconductor devices include an e-fuse.

SUMMARY

Various embodiments are directed to a fuse structure capable of improving cutting yield, and a method for manufacturing the same.

Also, various embodiments are directed to a semiconductor device capable of improving reliability, and a method for manufacturing the same.

In an embodiment, a fuse structure may include: a fusing line including a first portion, a second portion, and a central portion between the first portion and the second portion; and a dummy fuse neighboring the fusing line, the dummy fuse may include: a first air dummy fuse including a plurality of first air gaps extending in a first direction parallel to the fusing line; and a second air dummy fuse including a second air gap extending in a second direction crossing the fusing line. The dummy fuse may be disposed at the same level as the fusing line, and may be disposed on both sides of the fusing line. The dummy fuse may be disposed at a lower level than the fusing line, and may overlap with the fusing line. The dummy fuse may be disposed at a level that is higher than the level of the fusing line, and may overlap with the fusing line. The second air gap may be disposed on the same straight line as the central portion of the fusing line. The first air dummy fuse may further include a plurality of first non-air gaps between the plurality of first air gaps. The second air dummy fuse may further include a plurality of second non-air gaps which may be arrayed in the second air gap. The first non-air gaps and the second non-air gaps may have a dielectric constant higher than the first air gaps and the second air gap. The first non-air gaps and the second non-air gaps may include a dielectric material. The first non-air gaps and the second non-air gaps may include an ultra-low-k material. The first air gaps and the second air gap may have elongated (line) elements, respectively. The first air gaps and the second air gap may have widths smaller than the fusing line. The second air gap may have a width larger than the first air gaps. The second air dummy fuse may have an area smaller than the first air dummy fuse. The fusing line may include copper. The dummy fuse may be formed in an ultra-low-k material.

In an embodiment, a fuse structure may include: a fusing line including a first portion, a second portion, and a central portion between the first portion and the second portion; a first dummy fuse may be disposed at a lower level than the fusing line, and overlapping with the fusing line; a second dummy fuse may be disposed on both sides of the fusing line, and disposed at the same level as the fusing line; and a third dummy fuse may be disposed at a level that may be higher than the level of the fusing line, and overlapping with the fusing line, each of the first to third dummy fuses may include: a first air dummy fuse including a plurality of first air gaps extending in a first direction parallel to the fusing line; and a second air dummy fuse including a second air gap extending in a second direction crossing the fusing line. The second air gap may be disposed on the same straight line as the central portion of the fusing line. Each of the first to third dummy fuses may further include a plurality of first non-air gaps between the plurality of first air gaps and a plurality of second non-air gaps which may be arrayed in the second air gap. The first non-air gaps and the second non-air gaps may have a dielectric constant higher than the first air gaps and the second air gap. The first non-air gaps and the second non-air gaps may include a dielectric material. The first non-air gaps and the second non-air gaps may include an ultra-low-k material. The first air gaps and the second air gap may have elongated (line) elements, respectively. The first air gaps and the second air gap may have widths smaller than the fusing line. The second air dummy fuse may have an area smaller than the first air dummy fuse. The fusing line may include an electrically programmable material. The fusing line may include copper. Each of the first to third dummy fuses may be formed in an ultra-low-k material.

In an embodiment, a semiconductor device may include: a fuse structure including a copper e-fuse; and a transistor coupled to any one portion of the fuse structure, the fuse structure including: a fusing line including a first portion, a second portion, and a central portion between the first portion and the second portion; a dummy fuse neighboring the fusing line, the dummy fuse including: a first air dummy fuse including a plurality of first air gaps extending in a first direction parallel to the fusing line; and a second air dummy fuse including a second air gap extending in a second direction crossing the fusing line.

In an embodiment, a method for manufacturing a fuse structure may include: forming a fusing line over a substrate; and forming a dummy fuse which neighbors the fusing line, the forming of the dummy fuse may include: forming a first air dummy fuse which includes a plurality of first air gaps extending in a first direction parallel to the fusing line; and forming a second air dummy fuse which may include a second air gap extending in a second direction crossing the fusing line. The forming of the dummy fuse may include: forming a dielectric layer; forming dummy trenches by etching portions of the dielectric layer; forming, over the dummy trenches, a barrier layer which may have overhangs positioned over top edges of the dummy trenches; forming a metal layer over the barrier layer to form the first air gaps and the second air gap in the dummy trenches; removing the metal layer to open the first air gaps and the second air gap; and forming a capping layer which covers the first air gaps and the second air gap. The dummy trenches may be formed to include a plurality of first portions extending in the first direction parallel to the fusing line, and a second portion extending in the second direction crossing the fusing line, and the first air gaps may be formed in the first portions, and the second air gap may be formed in the second portion. The dummy trenches and the air dummy fuses may be formed on both sides of the fusing line at the same level as the fusing line. The dummy trenches and the air dummy fuses may be formed at a lower level than the fusing line thereby overlapping with the fusing line in a vertical direction. The dummy trenches and the air dummy fuses may be formed at a level that is higher than the level of the fusing line thereby overlapping with the fusing line in a vertical direction. The forming of the dummy fuse may include: forming a dielectric layer; forming dummy trenches, which include first portions and a second portion having a width larger than the first portions, by etching portions of the dielectric layer; forming, over the dummy trenches, a barrier layer which may have overhangs positioned over top edges of the dummy trenches; forming a metal layer over the barrier layer thereby forming the first air gaps in the first portions of the dummy trenches; removing the metal layer to leave a dummy metal layer in the second portion of the dummy trenches and open the first air gaps; forming a capping layer which covers the first air gaps and the dummy metal layer; forming an opening, which partially exposes the dummy metal layer, in the capping layer; and removing the dummy metal layer through the opening to form the second air gap. The opening may be formed to be positioned at a central portion of the dummy metal layer. The dummy metal layer may be removed by wet etching. The forming of the dummy trenches may be performed so that the first portions extend in the first direction parallel to the fusing line and the second portion extends in the second direction crossing the fusing line. The forming of the dummy fuse may include: forming a first dummy fuse at a lower level than the fusing line; forming a second dummy fuse at the same as the fusing line; and forming a third dummy fuse at a level that may be higher than the level of the fusing line.

In an embodiment, a method for manufacturing a semiconductor device may include: preparing a substrate which includes a driver region and a fuse region; forming a driving element over the substrate in the driver region; forming, over the driving element, multi-level metal lines coupled to the driving element; forming a fusing line which may be positioned over the substrate in the fuse region and disposed at the same level as any one metal line among the multi-level metal lines; and forming a dummy fuse which neighbors the fusing line, the forming of the dummy fuse may include: forming a first air dummy fuse which includes a plurality of first air gaps extending in a first direction parallel to the fusing line; and forming a second air dummy fuse which includes a second air gap extending in a second direction crossing the fusing line. The forming of the dummy fuse may include: forming a dielectric layer; forming dummy trenches by etching portions of the dielectric layer; forming, over the dummy trenches, a barrier layer which may have overhangs positioned over top edges of the dummy trenches; forming a metal layer over the barrier layer thereby forming the first air gaps and the second air gap in the dummy trenches; removing the metal layer to open the first air gaps and the second air gap; and forming a capping layer which covers the first air gaps and the second air gap. The dummy trenches may be formed to comprise a plurality of first portions extending in the first direction parallel to the fusing line, and a second portion extending in the second direction crossing the fusing line, and the first air gaps may be formed in the first portions, and the second air gap is formed in the second portion. The dummy trenches and the air dummy fuses may be formed on both sides of the fusing line at the same level as the fusing line. The dummy trenches and the air dummy fuses may be formed at a lower level than the fusing line thereby overlapping with the fusing line in a vertical direction. The dummy trenches and the air dummy fuses may be formed at a level that is higher than the level of the fusing line thereby overlapping with the fusing line in a vertical direction. The forming of the dummy fuse may include: forming a dielectric layer; forming dummy trenches, which include first portions and a second portion having a width larger than the first portions, by etching portions of the dielectric layer; forming, over the dummy trenches, a barrier layer which has overhangs positioned over top edges of the dummy trenches; forming a metal layer over the barrier layer thereby forming the first air gaps in the first portions of the dummy trenches; removing the metal layer to leave a dummy metal layer in the second portion of the dummy trenches and open the first air gaps; forming a capping layer which covers the first air gaps and the dummy metal layer; forming an opening which partially exposes the dummy metal layer, in the capping layer; and removing the dummy metal layer through the opening to form the second air gap. The opening may be formed to be positioned at a central portion of the dummy metal layer. The dummy metal layer may be removed by wet etching. The forming of the dummy trenches may be performed so that the first portions extend in the first direction parallel to the fusing line and the second portion extends in the second direction crossing the fusing line. The forming of the dummy fuse may include: forming a first dummy fuse at a lower level than the fusing line; forming a second dummy fuse at the same as the fusing line; and forming a third dummy fuse at a level that may be higher than the level of the fusing line. The forming of the multi-level metal lines may include: forming a first metal line at the same level as the first dummy fuse; forming a second metal line at the same level as the second dummy fuse and the fusing line; and forming a third metal line at the same level as the third dummy fuse.

BRIEF DESCRIPTION OF THE DRAWINGS

FIGS. 12A to 12D are views illustrating a method for manufacturing the fuse structure of FIG. 4A.

FIGS. 13A to 13F are views illustrating a method for manufacturing the fuse structure of FIG. 6A.

DETAILED DESCRIPTION

Figure 1:
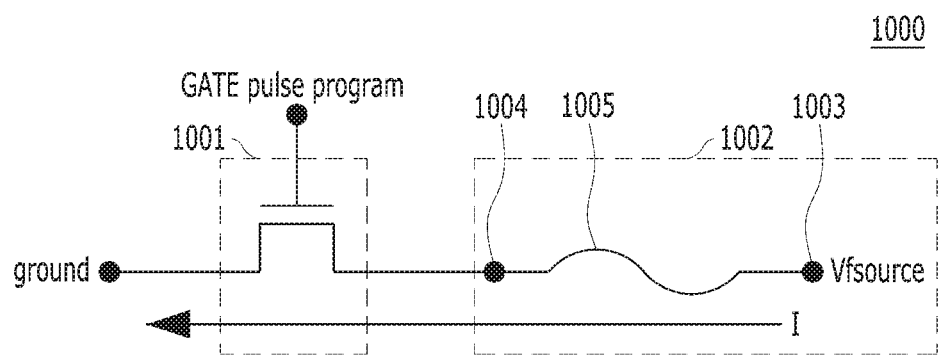
FIG. 1 is a simplified diagram illustrating a conventional e-fuse circuit.

Various embodiments of the present invention will be described below in more detail with reference to the accompanying drawings. The present invention may, however, be embodied in different forms and should not be construed as being limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments of the present invention. When a first layer is referred to as being "on" a second layer or "on" a substrate, it not only refers to a case where the first layer is formed directly on the second layer or the substrate but also a case where a third layer exists between the first layer and the second layer or the substrate.

Embodiments of the present disclosure will be described herein with reference to cross-sectional views, plan views and a block simplified diagram that are schematic illustrations of idealized embodiments of the present disclosure. As such, variations from the shapes of the illustrations as a result, for example, of manufacturing techniques and/or tolerances, are to be expected. Thus, embodiments of the present disclosure should not be construed as limited to the particular shapes illustrated herein but are to include deviations in shapes that result, for example, from manufacturing processes. Thus, the regions illustrated in the figures are schematic in nature and their shapes are not intended to illustrate the actual shape of a region of a device and are not intended to limit the scope of the invention.

An e-fuse is cut by applying an electrical pulse program to a gate array in a state where a predetermined fusing voltage (Vfsource) is applied to a metal line used in a back end of line (BEOL) process. It is generally necessary to cut the e-fuse under precise conditions including employing the ultra-precise fusing voltage (Vfsource) and gate pulse program.

FIG. 1 is a simplified diagram illustrating a conventional e-fuse circuit 1000.

Referring to FIG. 1, the e-fuse circuit 1000 may include a fusing line 1005 which is electrically programmable. The e-fuse circuit 1000 may include a gate array diver 1001 and a fuse part 1002. The fuse part 1002 may be constructed by an anode 1003, a cathode 1004, and the fusing line 1005.

In the state in which a specified voltage Vfsource is applied to the anode 1003, a gate pulse program is applied to the gate array driver 1001. Accordingly, current I flows suddenly from the fusing line 1005 to the ground. As Joule heating and electro-migration (EM) occur in the fusing line 1005 by the current I, a phenomenon may occur in which the fusing line 1005 is blown. Current flowing through the gate array driver 1001, is controlled by the gate pulse program, and may be harmonized with the voltage Vfsource which is applied to the anode 1003, for inducing the fusing line 1005 to be blown.

Figure 2:
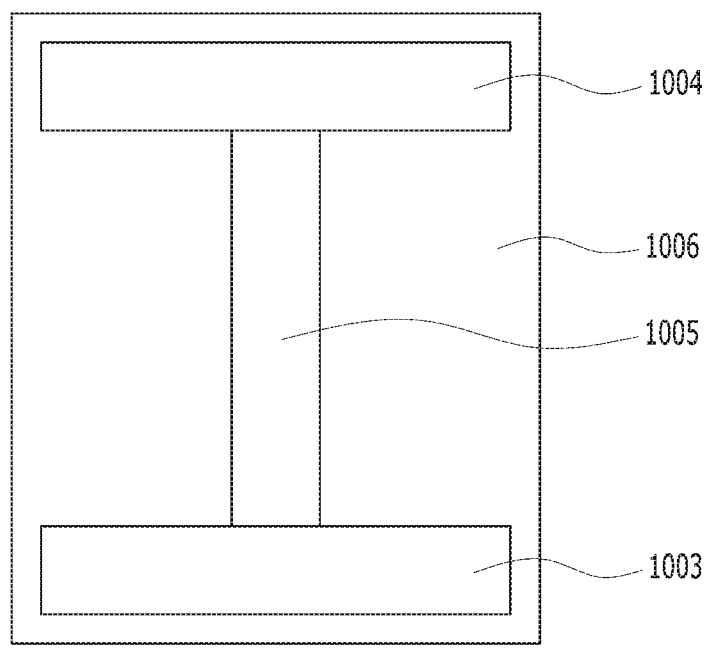
FIG. 2 is a plan view of the conventional e-fuse.
Figure 3A:
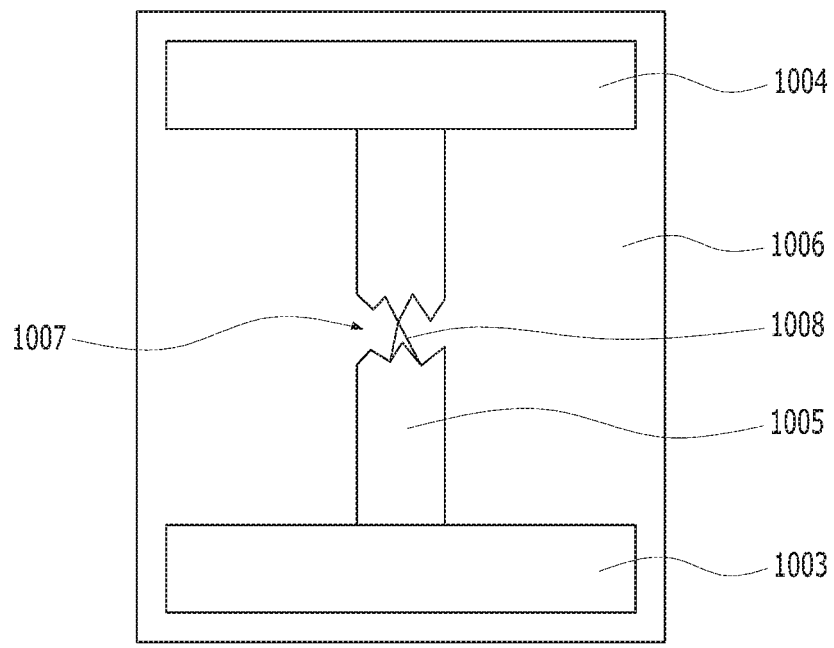
FIGS. 3A to 3C are plan views illustrating examples of blown states of an e-fuse.
Figure 3B:
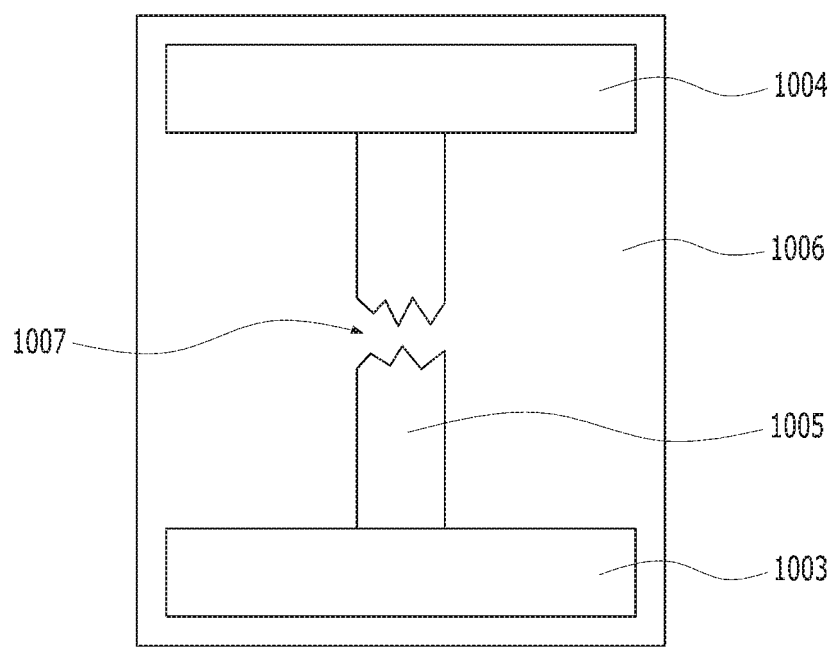
Figure 3C:
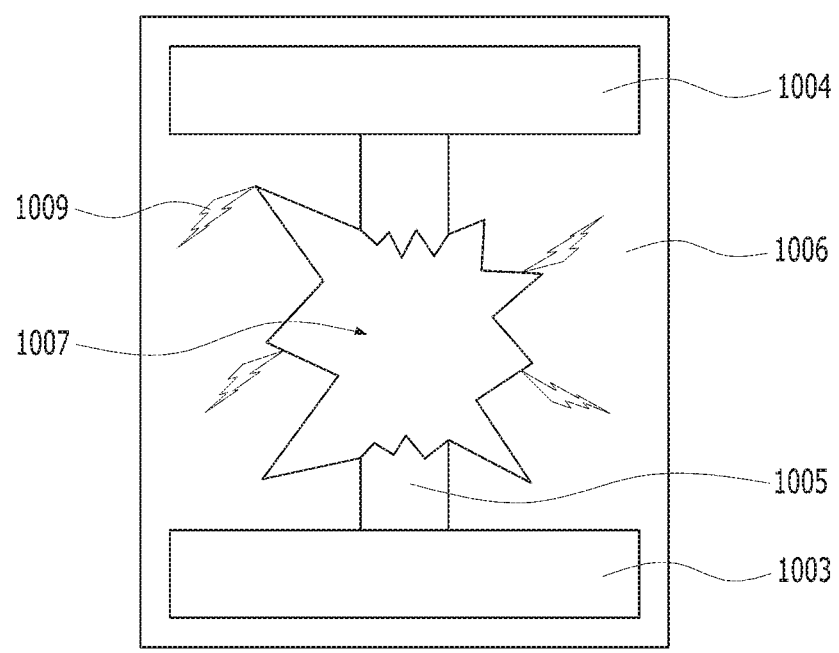

FIG. 2 is a plan view of the conventional e-fuse. FIGS. 3A to 3C are plan view illustrations of examples of blown states of the conventional e-fuse.

Referring to FIG. 2, the e-fuse may include an anode 1003, and a cathode 1004, which are connected with a fusing line 1005. The e-fuse may be surrounded by an interlayer dielectric layer 1006.

The fusing line 1005 may be cut to have various shapes according to the blowing conditions. The fusing line 1005 should be cut under a standard blowing condition for appropriate and stable blowing.

FIG. 3A shows a state in which the fusing line 1005 is cut by applying a blowing condition that is insufficient when compared to the standard blowing condition. Because the fusing line 1005 is cut under the insufficient blowing condition, a blowing space 1007 between cut portions of the fusing line 1005 is substantially narrow. Due to this fact, as a time goes by after the fusing line 1005 is cut, a reconnection, that is, a rebonding 1008 may occur by migration of copper, or the like. Therefore, cutting yield may be decreased.

FIG. 3B shows a state in which the fusing line 1005 is cut by applying the standard blowing condition. As described above, it is necessary to ultra-precisely calculate a condition including a fusing voltage Vfsource and a gate pulse program. Moreover, the standard blowing condition should be applied according to the state of the fusing line 1005. For example, within-wafer non-uniformity and wafer-to-wafer non-uniformity, it is difficult to realize the standard blowing condition.

Thus, in order to cut the fusing line 1005 while securing a sufficient blowing space 1007, cutting yield should be secured by using a somewhat excessive blowing condition.

FIG. 3C shows a state in which the fusing line 1005 is cut by applying an excessive blowing condition. Since the excessive blowing condition is used, explosive cutting occurs and a part of the surrounding interlayer dielectric layer 1006 is also removed, resulting in the formation of a substantially larger blowing space 1007 than when a standard blowing condition is employed. In this case, it may be difficult to ensure that the fusing line 1005 is cut at only a central portion thereof. Hence, the cut fusing line 1005 may have a poor appearance. In addition, in the case where explosive cutting is severe, cracks 1009 may be formed in the remaining interlayer dielectric layer 1006.

In the following embodiments of the present invention, an air dummy is formed in the vicinity of a fusing line. The air dummy, allows the fusing line to be cut in a more predictable and stable manner than existing conventional designs. As a result, the cutting yield may also be increased substantially.

Figure 4A:
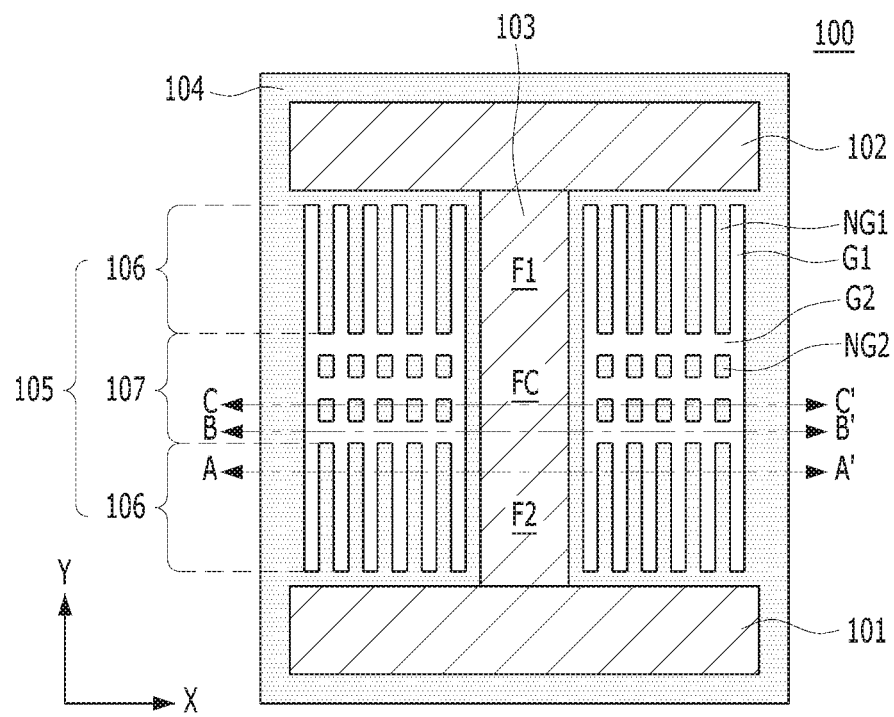
FIG. 4A is a plan view illustrating a fuse structure, according to a first embodiment of the present invention.
Figure 4B:
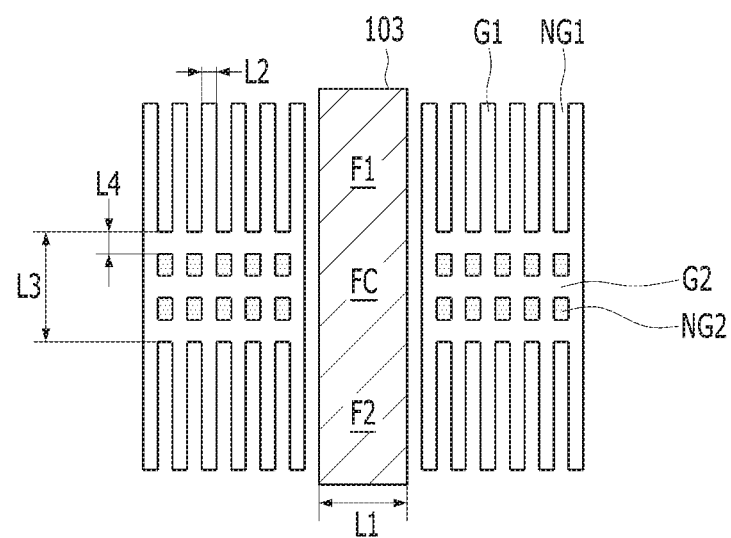
FIG. 4B is a detailed view of the dummy fuse of FIG. 4A.
Figure 4C:
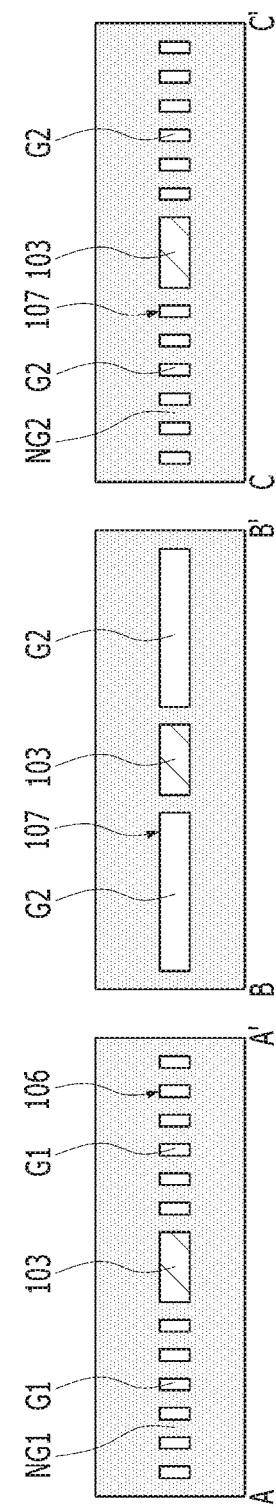
FIG. 4C is a cross-sectional views taken along the lines A-A', B-B' and C-C' of FIG. 4A.

FIG. 4A is a plan view illustrating a fuse structure 100 including a dummy fuse 105, according to a first embodiment of the present invention. FIG. 4B is a more detailed view of the dummy fuse 105 of FIG. 4A. FIG. 4C shows cross-sectional views of the dummy fuse 105 taken along the lines A-A', B-B' and C-C' of FIG. 4A.

Referring to FIGS. 4A to 4C, a fuse structure 100 may include a first electrode 101, a second electrode 102, and a fusing line 103 linking the first and second electrodes 101 and 102. The first electrode 101 may be a cathode, and the second electrode 102 may be an anode. The fusing line 103 may include a conductive material. The fusing line 103 may be an electrically programmable material. The fusing line 103 may be simply referred to as an e-fuse. The fusing line 103 may, for example, include copper (Cu). The first electrode 101, the second electrodes 101 and 102 and the fusing line 103 may be an integral structure. The first electrode 101, the second electrode 102 and the fusing line 103 may be formed of the same material. For example, all of the first electrode 101, the second electrode 102 and the fusing line 103 may be or include, for example, copper. The fusing line 103 may be an elongated element extending along a first direction Y. However, we note that the fusing line 103 may extend in any one direction. The fusing line 103 may include a first portion F1, a second portion F2, and a central portion FC disposed between the first and second portions F1 and F2. The fusing line 103 may be surrounded by a dielectric layer 104. The dielectric layer 104 may have an ultra-low dielectric constant lower than 3.9. For example, the dielectric layer 104 may be formed of an ultra-low-k material.

The fuse structure 100 may further include the dummy fuse 105 which neighbors the fusing line 103. The dummy fuse 105 may be formed in the dielectric layer 104. The dummy fuse 105 may include a first air dummy fuse 106 and a second air dummy fuse 107.

The first air dummy fuse 106 may include a plurality of first air elongated gaps G1 (line gaps) extending in the first direction Y in parallel to the fusing line 103 and spaced apart in a second direction X at a regular interval. The first air gaps G1 may each have a width in the second direction X that is smaller than the width of the fusing line 103. For example, as illustrated in FIG. 4B, the fusing line 103 may have a first width L1 in the second direction X, the first air gaps G1 may have a second width L2 in the second direction X, with the second width L2 being smaller than the first width L1. The first air gaps G1 may have rectangular elongated shapes as viewed from the top. The plurality of first air gaps G1 may neighbor the first and second portions F1 and F2 of the fusing line 103. The first air dummy fuse 106 may further include a plurality of first non-air gaps NG1 formed between the plurality of first air gaps G1. The first non-air gaps NG1 may have a dielectric constant higher than the first air gaps G1. The first non-air gaps NG1 may have an ultra-low dielectric constant lower than 3.9. The first non-air gaps NG1 may be portions of the dielectric layer 104. The first non-air gaps NG1 may be formed of an ultra-low-k material. The first non-air gaps may have the same shape as the first air gaps G1.

The second air dummy fuse 107 may include a second air gap G2 which may be an elongated element extending in the second direction X. The second air gap G2 may have a width larger than the width of the first air gaps G1. For example, the second air gap G2 may have a third width L3, wherein the third width L3 is larger than the second width L2. The second air gap G2 may have a rectangular shape. The second air gap G2 may be arranged on the same straight line as the central portion FC of the fusing line 103. That is to say, the second air gap G2 may neighbor the central portion FC of the fusing line 103. The second air dummy fuse 107 may further include a plurality of second non-air gaps NG2 arranged, for example, as an array of two rows of spaced apart square shaped pillars within the second air gap G2. The second non-air gaps NG2 may have a dielectric constant higher than the second air gap G2. The second non-air gaps NG2 may have an ultra-low dielectric constant lower than 3.9. The second non-air gaps NG2 may be portions of the dielectric layer 104. The second non-air gaps NG2 may be formed of an ultra-low-k material. The second air dummy fuse 107 may have an area smaller than the first air dummy fuse 106. The first and second air dummy fuses 106 and 107 may be coupled with each other as illustrated in FIG. 4A, to form the air dummy fuse 105 having an overall shape resembling a double-ended, toothed comb-like structure, with the second air dummy fuse 107 disposed between two symmetrically identical first air dummy fuses 106.

The dummy fuse 105 may be disposed at the same level as the fusing line 103 between the anode and the cathode electrodes 102 and 101 on both sides of the fusing line 103.

According to the above descriptions, in the first air dummy fuse 106, the first air gaps G1 and the first non-air gaps NG1 are alternately disposed along the X direction. Therefore, heat transfer speed is slowed down when compared to a region which may be constructed by only the first non-air gaps NG1. When heat transfer speed is slowed down, because self Joule heating is large, blowing may easily occur. In this way, due to the first air dummy fuse 106, the fusing line 103 may be more easily cut even by small Joule heating and electro-migration (EM) phenomena.

In the second air dummy fuse 107, the second air gap G2 and the second non-air gaps NG2 are mixed. The second air gap G2 is formed in the second direction X crossing with the first air gaps G1. Hence, in the second direction X, the air rate of the second air dummy fuse 107 is higher than the air rate of the first air dummy fuse 106. Thus, by employing the second air dummy fuse 107, a region which has lower heat conductivity is formed. This region plays the role of increasing heat density and thermal capacity. In other words, by disposing the second air gap G2 in the direction crossing with the fusing line 103, the blowing position of the fusing line 103 may be adjusted.

By the first and second air dummy fuses 106 and 107, it is possible to prevent occurrence of a rebonding due to movement of a fuse material, for example of copper, during blowing of the fuse. As a consequence, reliability of the fuse blowing may be improved. Moreover, the first and second air dummy fuses 106 and 107 may act as a crack stopper during blowing, reducing or preventing formation of cracking in the dielectric 104.

By adjusting the areas and densities of the first and second air dummy fuses 106 and 107, blowing efficiency may be improved.

As a result, by forming the first and second air dummy fuses 106 and 107, a blowing condition may be optimized.

Figure 5A:
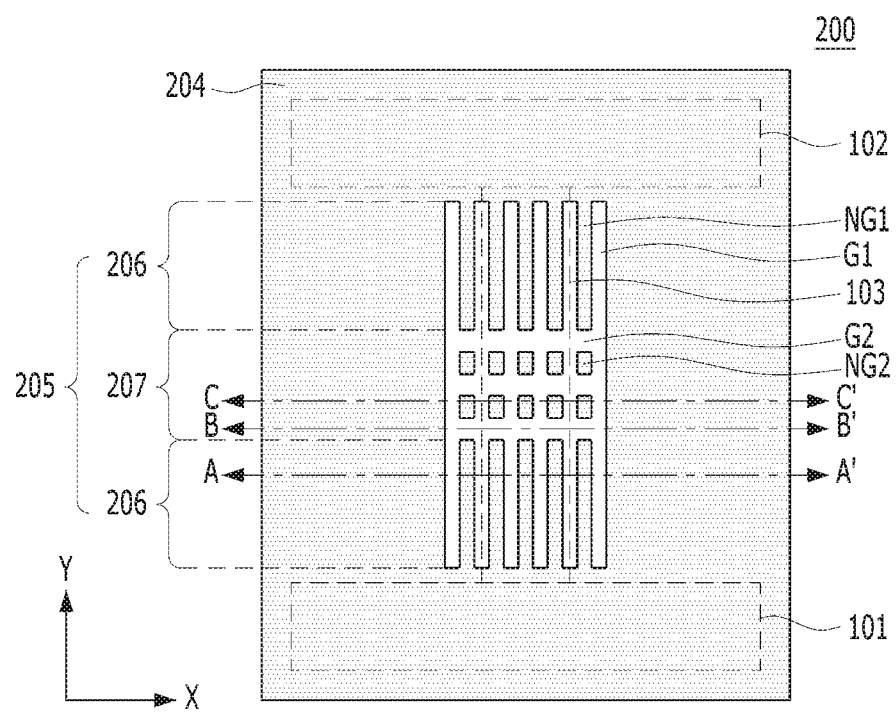
FIG. 5A is a plan view illustrating a fuse structure, according to a second embodiment of the present invention.
Figure 5B:
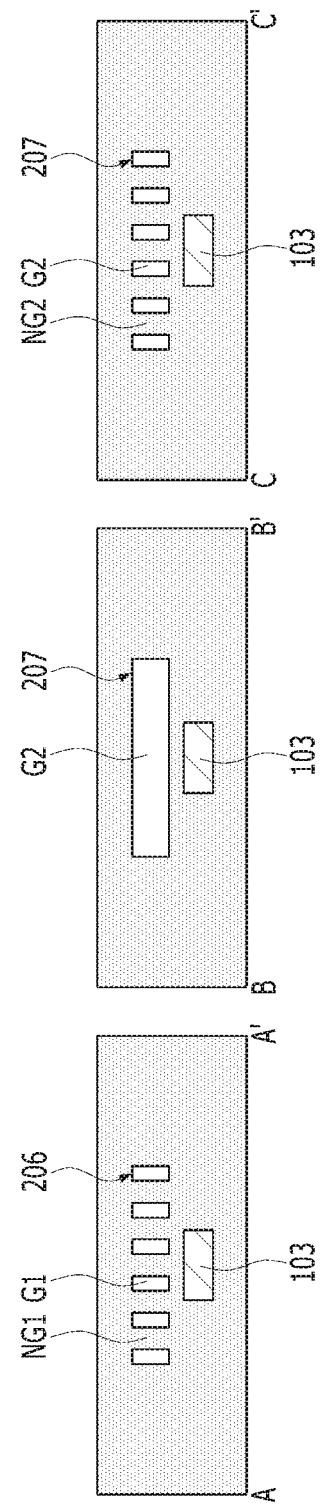
FIG. 5B is a cross-sectional views taken along the lines A-A', B-B', and C-C' of FIG. 5A.

FIG. 5A is a plan view illustrating a fuse structure, according to a second embodiment of the present invention. FIG. 5B shows cross-sectional views taken along the lines A-A', B-B' and C-C of FIG. 5A. Some components of a fuse structure 200 according to the second embodiment are similar to those of the fuse structure 100 and hence will not be described in detail.

Referring to FIGS. 5A and 5B, the fuse structure 200 may include a first electrode 101, a second electrode 102, and a fusing line 103 between the first and second electrodes 101 and 102. The first electrode 101 may be a cathode, and the second electrode 102 may be an anode. The fusing line 103 may include a conductive material. The fusing line 103 may be an electrically programmable material. For example, the fusing line 103 may include copper (Cu). The first and second electrodes 101 and 102 and the fusing line 103 may be an integral structure. The first and second electrodes 101 and 102 and the fusing line 103 may be formed of the same material. For example, all of the first and second electrodes 101 and 102 and the fusing line 103 may be or include, for example, copper. The fusing line 103 may be an elongated element. The fusing line 103 may extend in any one direction. For example, the fusing line 103 may extend in a first direction Y, as in the embodiment illustrated in FIG. 5A, and may include a first portion F1, a second portion F2, and a central portion FC between the first and second portions F1 and F2.

The fuse structure 200 may further include a dummy fuse 205 which neighbors the fusing line 103. Unlike the first embodiment, the dummy fuse 205 may be disposed at a level that is higher than the level of the fusing line 103. According to the illustrated example of FIG. 5A, the dummy fuse 205 may be formed over the fusing line 103. Portions of the dummy fuse 205 may partially or entirely overlap with the fusing line 103 in the vertical direction. The dummy fuse 205 may be formed in a dielectric layer 204. The dielectric layer 204 may be formed over the fusing line 103. The dielectric layer 204 may have an ultra-low dielectric constant lower than 3.9. For example, the dielectric layer 204 may be formed of an ultra-low-k material. The dummy fuse 205 may include a first air dummy fuse 206 and a second air dummy fuse 207.

The first air dummy fuse 206 may include a plurality of first air gaps G1. The first air gaps G1 may extend in the first direction Y parallel to the fusing line 103. The first air gaps G1 may be elongated elements. The first air gaps G1 may have a width smaller than the fusing line 103. The first air gaps G1 may be elongated elements having a rectangular shape. The plurality of first air gaps G1 may be formed over the first and second portions F1 and F2 of the fusing line 103. The first air dummy fuse 206 may further include a plurality of first non-air gaps NG1 disposed between the plurality of first air gaps G1. The first non-air gaps NG1 may have a dielectric constant higher than the first air gaps G1. The first non-air gaps NG1 may have an ultra-low dielectric constant lower than 3.9. The first non-air gaps NG1 may be portions of the dielectric layer 204. The first non-air gaps NG1 may be formed of an ultra-low-k material. The first non-air gaps may have the same shape as the first air gaps G1.

The second air dummy fuse 207 may include a second air gap G2. The second air gap G2 may extend in a second direction X crossing with the fusing line 103. The second air gap G2 may be an elongated element extending in the X direction. The second air gap G2 may have a width larger than the first air gaps G1. The second air gap G2 may have a rectangular shape as viewed from the top. The second air gap G2 may be formed over the central portion FC of the fusing line 103. The second air dummy fuse 207 may further include a plurality of second non-air gaps NG2. The second non-air gaps NG2 as shown in FIG. 5A have a square shape as viewed from a top plan view and are spaced apart at a regular interval in two parallel rows extending in the X-direction. It is noted that the shape as well as the spacing and the number of rows of the second non-air gaps NG2 may be modified. The second non-air gaps NG2 may have a dielectric constant higher than the second air gap G2. The second non-air gaps NG2 may have an ultra-low dielectric constant lower than 3.9. The second non-air gaps NG2 may be portions of the dielectric layer 204. The second non-air gaps NG2 may be formed of an ultra-low-k material. The second air dummy fuse 207 may have an area smaller than the first air dummy fuse 206. The first and second air dummy fuses 206 and 207 may be coupled with each other. As the first and second air dummy fuses 206 and 207 are coupled with each other they form the dummy fuse 205 which has the same shape as the dummy fuse 105 of FIG. 4A.

Figure 6A:
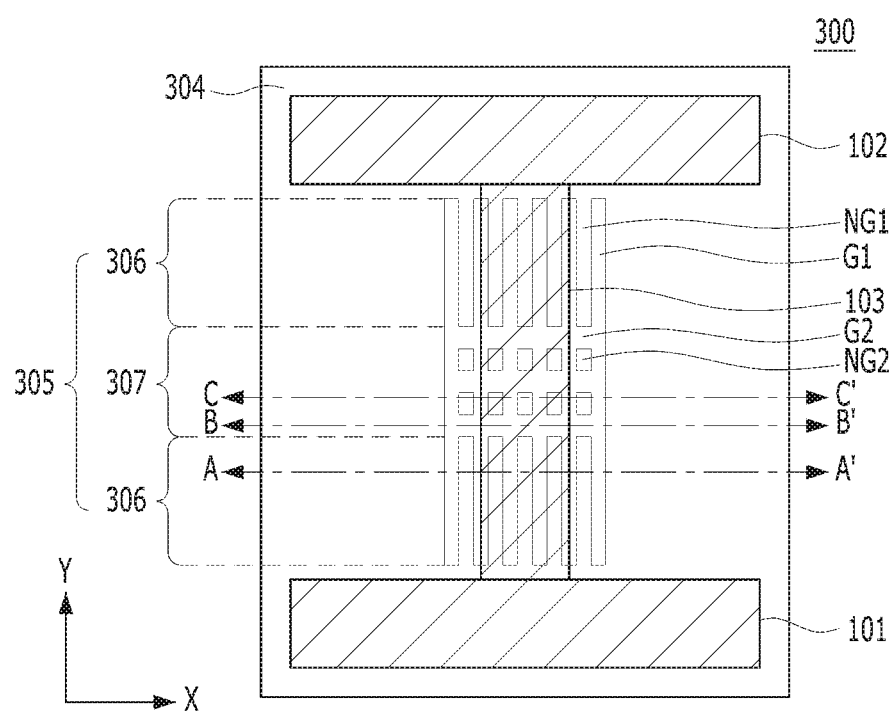
FIG. 6A is a plan view illustrating a fuse structure, according to a third embodiment of the present invention.
Figure 6B:
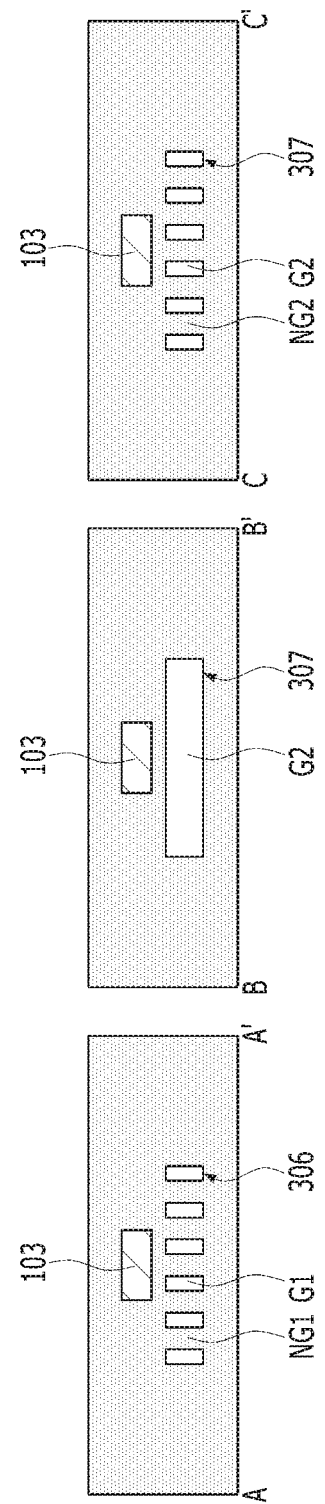
FIG. 6B is a cross-sectional views taken along lines A-A', B-B', and C-C' of FIG. 6A.

FIG. 6A is a plan view illustrating a fuse structure according to a third embodiment of the present invention. FIG. 6B shows cross-sectional views taken along the lines A-A', B-B' and C-C' of FIG. 6A. Some components of a fuse structure 300 according to a third embodiment are similar to those of the fuse structure 100 according to the first embodiment and the fuse structure 200 according to the second embodiment of the present invention. In fact, the fuse structure 300 is similar to the fuse structure 200 except, that unlike the air dummy fuse 205 which is positioned over the fusing line 103 of the fuse structure 200, the air dummy fuse 305 is positioned below the fusing line 103 of the fuse structure 300.

Referring to FIGS. 6A and 6B, the fuse structure 300 may include a first electrode 101, a second electrode 102, and a fusing line 103 between the first and second electrodes 101 and 102. The first electrode 101 may be a cathode, and the second electrode 102 may be an anode. The fusing line 103 may include a conductive material. The fusing line 103 may be an electrically programmable material. For example, the fusing line 103 may include copper (Cu). The first and second electrodes 101 and 102 and the fusing line 103 may be an integral structure. The first and second electrodes 101 and 102 and the fusing line 103 may be formed of the same material. For example, all of the first and second electrodes 101 and 102 and the fusing line 103 may be or include, for example, copper. The fusing line 103 may be an elongated element. The fusing line 103 may extend in a first direction Y. However, we note that the fusing line may extend in any direction provided that it links the first and second electrodes 101 and 102. The fusing line 103 may include a first portion F1, a second portion F2, and a central portion FC between the first and second portions F1 and F2.

The fuse structure 300 may further include a dummy fuse 305 which neighbors the fusing line 103. Unlike the first and second embodiments, the dummy fuse 305 may be disposed at a lower level than the fusing line 103. The dummy fuse 305 may be formed under the fusing line 103. Portions of the dummy fuse 305 may partially or entirely overlap with the fusing line 103 in the vertical direction. The dummy fuse 305 may be formed in a dielectric layer 304. The dielectric layer 304 may be formed under the fusing line 103. The dielectric layer 304 may have an ultra-low dielectric constant lower than 3.9. For example, the dielectric layer 304 may be formed of an ultra-low-k material. The dummy fuse 305 may include a first air dummy fuse 306 and a second air dummy fuse 307.

The first air dummy fuse 306 may include a plurality of first air gaps G1. The first air gaps G1 may extend in the first direction Y parallel to the fusing line 103. The first air gaps G1 may be elongated (line) elements. The first air gaps G1 may have a width smaller than the fusing line 103. The first air gaps G1 may have rectangular elongated shapes as viewed from the top. The plurality of first air gaps G1 may be formed under the first and second portions F1 and F2 of the fusing line 103. The first air dummy fuse 306 may further include a plurality of first non-air gaps NG1 disposed between the plurality of first air gaps G1. The first non-air gaps NG1 may have a dielectric constant higher than the first air gaps G1. The first non-air gaps NG1 may have an ultra-low dielectric constant lower than 3.9. The first non-air gaps NG1 may be portions of the dielectric layer 304. The first non-air gaps NG1 may be formed of an ultra-low-k material. The first non-air gaps may have the same shape as the first air gaps G1.

The second air dummy fuse 307 may include a second air gap G2. The second air gap G2 may extend in a second direction X crossing with the fusing line 103. The second air gap G2 may be an elongated element. The second air gap G2 may have a width larger than the first air gaps G1. The second air gap G2 may have a rectangular shape. The second air gap G2 may be formed under the central portion FC of the fusing line 103. The second air dummy fuse 307 may further include a plurality of second non-air gaps NG2. The second non-air gaps NG2 may have a dielectric constant higher than the second air gap G2. The second non-air gaps NG2 may have an ultra-low dielectric constant lower than 3.9. The second non-air gaps NG2 may be portions of the dielectric layer 304. The second non-air gaps NG2 may be formed of an ultra-low-k material. The second air dummy fuse 307 may have an area smaller than the first air dummy fuse 306. The first and second air dummy fuses 306 and 307 may be coupled with each other. As the first and second air dummy fuses 306 and 307 are coupled with each other they form the dummy fuse 305 which has the same shape as the dummy fuse 105 of FIG. 4A.

Figure 7:
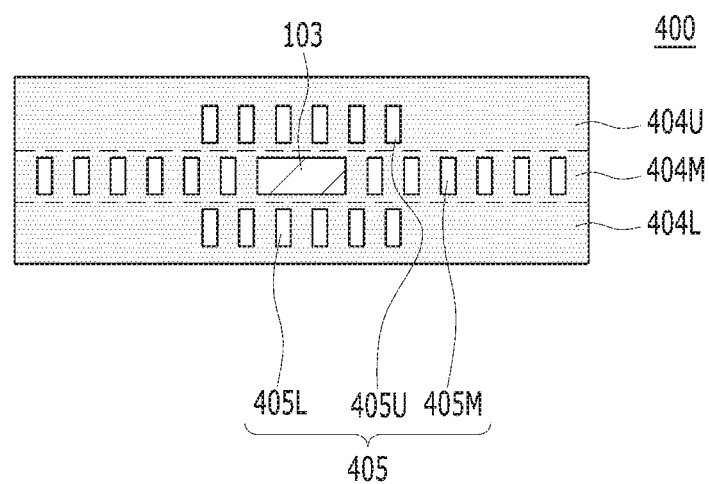
FIG. 7 is a cross-sectional view illustrating a fuse structure, according to a fourth embodiment of the present invention.

FIG. 7 is a cross-sectional view illustrating a fuse structure 400, according to a fourth embodiment of the present invention. Some components of the fuse structure 400 are similar to those of the fuse structures 100, 200 and 300 according to the first to third embodiments of the present invention.

Referring to FIGS. 4A, 5A, 6A and 7, the fuse structure 400 may include a first electrode 101, a second electrode 102, and a fusing line 103 between the first and second electrodes 101 and 102. The first electrode 101 may be a cathode, and the second electrode 102 may be an anode. The fusing line 103 may include a conductive material. The fusing line 103 may be an electrically programmable material. For example, the fusing line 103 may include copper (Cu). The first and second electrodes 101 and 102 and the fusing line 103 may be an integral structure. The first and second electrodes 101 and 102 and the fusing line 103 may be formed of the same material. For example, all of the first and second electrodes 101 and 102 and the fusing line 103 may be or include, for example, copper. The fusing line 103 may be an elongated element. The fusing line 103 may extend in a first direction Y. However, we note that the fusing line may extend in any direction provided that it links the first and second electrodes 101 and 102. The fusing line 103 may include a first portion F1, a second portion F2, and a central portion FC between the first and second portions F1 and F2.

The fuse structure 400 may further include a dummy fuse 405 which neighbors the fusing line 103. The dummy fuse 405 of the fourth embodiment may include a first dummy fuse 405L, a second dummy fuse 405M, and a third dummy fuse 405U. The first dummy fuse 405L may be disposed at a lower level than the fusing line 103. The second dummy fuse 405M may be disposed at the same level as the fusing line 103. The third dummy fuse 405U may be disposed at a level that is higher than the level of the fusing lines 103. For example, the first dummy fuse 405L may be formed under the fusing line 103, and the third dummy fuse 405U may be formed over the fusing line 103. The second dummy fuse 405M may be formed on both sides of the fusing line 103. The first dummy fuse 405L and the third dummy fuse 405U may partially or entirely overlap with the fusing line 103 in the vertical direction. The second dummy fuse 405M may not overlap with the fusing line 103 in the vertical direction.

The second dummy fuse 405M corresponds to the dummy fuse 105 of the first embodiment of the present invention. For example, the second dummy fuse 405M may include the first and second air dummy fuses 106 and 107 of the first embodiment (see FIG. 4A). The first and second air dummy fuses 106 and 107 may be coupled with each other. As the first and second air dummy fuses 106 and 107 are coupled with each other they form the second dummy fuse 405M which has the same shape as the dummy fuse 105 of FIG. 4A.

The first dummy fuse 405L corresponds to the dummy fuse 305 of the third embodiment of the present invention. For example, the first dummy fuse 405L may include the first and second air dummy fuses 306 and 307 of the third embodiment (see FIG. 6A), The first and second air dummy fuses 306 and 307 may be coupled with each other. As the first and second air dummy fuses 306 and 307 are coupled with each other they form the first dummy fuse 405L which has the same shape as the dummy fuse 305 of FIG. 6A.

The third dummy fuse 405U corresponds to the dummy fuse 205 of the second embodiment of the present invention. For example, the third dummy fuse 405U may include the first and second air dummy fuses 206 and 207 of the second embodiment (see FIG. 5A). The first and second air dummy fuses 206 and 207 may be coupled with each other. As the first and second air dummy fuses 206 and 207 are coupled with each other they form the dummy fuse 405U which has the same shape as the air dummy fuse 205 of FIG. 5A.

The first to third dummy fuses 405L to 405U may be formed in a first interlayer dielectric layer 404L, a second interlayer dielectric layer 404M and a third interlayer dielectric layer 404U, respectively. The first to third interlayer dielectric layers 404L to 404U may be an ultra-low-k material.

Figure 8:
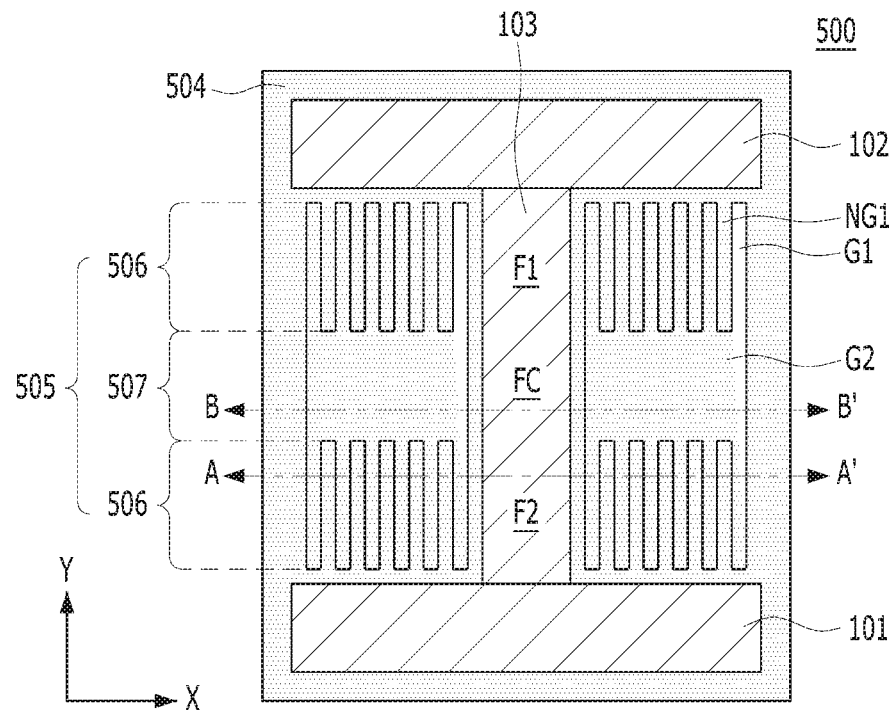
FIG. 8 is a plan view illustrating a fuse structure, according to a fifth embodiment of the present invention.

FIG. 8 is a plan view illustrating a fuse structure 500, according to a fifth embodiment of the present invention.

Referring to FIG. 8, the fuse structure 500 may include a first electrode 101, a second electrode 102, and a fusing line 103 between the first and second electrodes 101 and 102. The first electrode 101 may be a cathode, and the second electrode 102 may be an anode. The fusing line 103 may include a conductive material. The fusing line 103 may be an electrically programmable material. For example, the fusing line 103 may include copper (Cu). The first and second electrodes 101 and 102 and the fusing line 103 may be an integral structure. The first and second electrodes 101 and 102 and the fusing line 103 may be formed of the same material. For example, all of the first and second electrodes 101 and 102 and the fusing line 103 may be or include, for example, copper. The fusing line 103 may be an elongated element. As illustrated, the fusing line 103 may extend in a first direction Y. However, we note that the fusing line may extend in any direction provided that it links the first and second electrodes 101 and 102. The fusing line 103 may include a first portion F1, a second portion F2, and a central portion FC between the first and second portions F1 and F2, The fusing line 103 may be surrounded by a dielectric layer 504. The dielectric layer 504 may have an ultra-low dielectric constant lower than 3.9. For example, the dielectric layer 504 may be formed of an ultra-low-k material.

The fuse structure 500 may further include a dummy fuse 505 which neighbors the fusing line 103. The dummy fuse 505 may be formed in a dielectric layer 504. The dummy fuse 505 may include a first air dummy fuse 506 and a second air dummy fuse 507.

The first air dummy fuse 506 may include a plurality of first air gaps G1. The first air gaps G1 may extend in the first direction Y parallel to the fusing line 103. The first air gaps G1 may be elongated (line) elements. The first air gaps G1 may have a width smaller than the fusing line 103 (see FIG. 4B). The first air gaps G1 may have rectangular elongated shapes as viewed from the top. The plurality of first air gaps G1 may neighbor the first and second portions F1 and F2 of the fusing line 103. The first air dummy fuse 506 may further include a plurality of first non-air gaps NG1 disposed between the plurality of first air gaps G1. The first non-air gaps NG1 may have a dielectric constant higher than the first air gaps G1. The first non-air gaps NG1 may have an ultra-low dielectric constant lower than 3.9. The first non-air gaps NG1 may be portions of the dielectric layer 504. The first non-air gaps NG1 may be formed of an ultra-low-k material. The first non-air gaps may have the same shape as the first air gaps G1.

The second air dummy fuse 507 may include a second air gap G2. The second air gap G2 may extend in a second direction X crossing with the fusing line 103. The second air gap G2 may be an elongated element. The second air gap G2 may have a width larger than the fusing line 103 (see FIG. 4B). The second air gap G2 may have a rectangular shape. The second air gap G2 may be arranged on the same straight line as the central portion FC of the fusing line 103. That is to say, the second air gap G2 may neighbor the central portion FC of the fusing line 103. Unlike the first embodiment, the second air dummy fuse 507 are not formed with any second non-air gaps NG2. That is to say, the second air dummy fuse 507 may be constructed with only the second air gap G2. Therefore, the second air gap G2 of the second air dummy fuse 507 may have a larger area than the second air gap G2 of the first embodiment of the present invention. The first and second air dummy fuses 506 and 507 may be coupled with each other.

The dummy fuse 505 may be disposed at the same level as the fusing line 103. The dummy fuse 505 may be formed on both sides of the fusing line 103.

According to the above descriptions, in the first air dummy fuse 506, the first air gaps G1 and the first non-air gaps NG1 may be mixed. Therefore, heat transfer speed is slowed down when compared to a region which may be constructed by only the first non-air gaps NG1. When heat transfer speed is slowed down, because self Joule heating is large, blowing may easily occur. In this way, due to the presence of the first air dummy fuse 506, the fusing line 103 may be cut more evenly by small Joule heating and EM phenomena.

The second air dummy fuse 507 may be constructed by only the second air gap G2. The second air gap G2 may be formed in the second direction X crossing with the first air gaps G1. In the second direction X, the air rate of the second air dummy fuse 507 may be higher than the air rate of the first air dummy fuse 506. Accordingly, by employing the second air dummy fuse 507, a region which has a lower heat conductivity may be formed. This region plays the role of increasing heat density and thermal capacity. In other words, by disposing the second air gap G2 in the direction crossing with the fusing line 103, the blowing position of the fusing line 103 may be adjusted.

By the first and second air dummy fuses 506 and 507, it is possible to prevent occurrence of a rebonding due to movement of the fuse material, for example of the copper, during blowing of the fuse. As a consequence, reliability of blowing may be improved. Moreover, the first and second air dummy fuses 506 and 507 may play the role of a crack stopper during blowing reducing or preventing formation of cracks in the dielectric 504.

By adjusting the areas and densities of the first and second air dummy fuses 506 and 507, the fuse blowing efficiency may be improved.

As a result, by forming the first and second air dummy fuses 506 and 507, a blowing condition of the fuse may be optimized.

Figure 9:
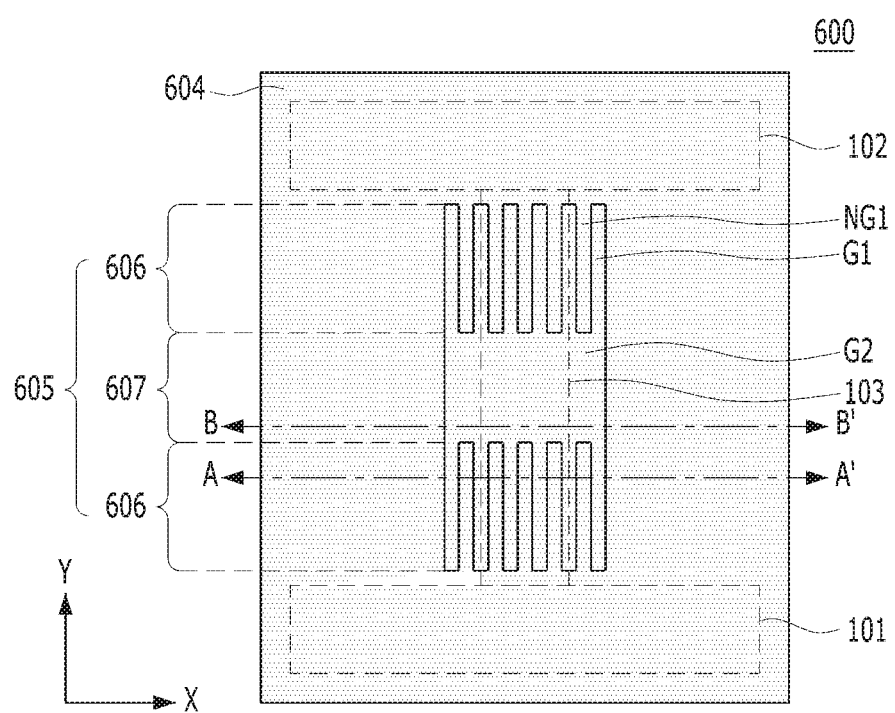
FIG. 9 is a plan view illustrating a fuse structure, according to a sixth embodiment of the present invention.

FIG. 9 is a plan view illustrating a fuse structure, according to a sixth embodiment of the present invention. Some components of a fuse structure 600 according to a sixth embodiment are similar to those of the fuse structure 200 according to the second embodiment of the present invention.

Referring to FIG. 9, the fuse structure 600 may include a first electrode 101, a second electrode 102, and a fusing line 103 between the first and second electrodes 101 and 102. The first electrode 101 may be a cathode, and the second electrode 102 may be an anode. The fusing line 103 may include a conductive material. The fusing line 103 may be an electrically programmable material. For example, the fusing line 103 may include copper (Cu). The first and second electrodes 101 and 102 and the fusing line 103 may be an integral structure. The first and second electrodes 101 and 102 and the fusing line 103 may be formed of the same material. For example, all of the first and second electrodes 101 and 102 and the fusing line 103 may be or include, for example, copper. The fusing line 103 may be an elongated element. The fusing line 103 may extend in a first direction Y. However, we note that the fusing line may extend in any direction provided that it links the first and second electrodes 101 and 102. The fusing line 103 may include a first portion F1, a second portion F2, and a central portion FC between the first and second portions F1 and F2.

The fuse structure 600 may further include a dummy fuse 605 which neighbors the fusing line 103. The dummy fuse 605 may be disposed at a level that is higher than the level of the fusing line 103. The dummy fuse 605 may be formed over the fusing line 103. Portions of the dummy fuse 605 may partially or entirely overlap with the fusing line 103. The dummy fuse 605 may be formed in a dielectric layer 604. The dielectric layer 604 may be formed over the fusing line 103. The dielectric layer 604 may have an ultra-low dielectric constant lower than 3.9. For example, the dielectric layer 604 may be formed of an ultra-low-k material. The dummy fuse 605 may include a first air dummy fuse 606 and a second air dummy fuse 607.

The first air dummy fuse 606 may include a plurality of first air gaps G1. The first air gaps G1 may extend in the first direction Y parallel to the fusing line 103. The first air gaps G1 may be elongated (line) elements. The first air gaps G1 may have a width smaller than the fusing line 103. The first air gaps G1 may have rectangular elongated shapes as viewed from the top. The plurality of first air gaps G1 may be formed over the first and second portions F1 and F2 of the fusing line 103. The first air dummy fuse 606 may further include a plurality of first non-air gaps NG1 disposed between the plurality of first air gaps G1. The first non-air gaps NG1 may have a dielectric constant higher than the first air gaps G1. The first non-air gaps NG1 may have an ultra-low dielectric constant lower than 3.9. The first non-air gaps NG1 may be portions of the dielectric layer 604. The first non-air gaps NG1 may be formed of an ultra-low-k material. The first non-air gaps may have the same shape as the first air gaps G1.

The second air dummy fuse 607 may include a second air gap G2. The second air gap G2 may extend in a second direction X crossing with the fusing line 103. The second air gap G2 may be an elongated element. The second air gap G2 may have a width equal to or larger than the fusing line 103. The second air gap G2 may have a rectangular shape. The second air gap G2 may be formed over the central portion FC of the fusing line 103. The second air dummy fuse 607 may include only the second air gap G2. In other words, the second air dummy fuse 607 may not include any second non-air gaps NG2 of the second embodiment of the present invention. The second air dummy fuse 607 may have an area larger than the first air dummy fuse 606. The first and second air dummy fuses 606 and 607 may be coupled with each other. As the first and second air dummy fuses 606 and 607 are coupled with each other they form the dummy fuse 605 which has the same shape as the dummy fuse 505 of FIG. 8.

Figure 10:
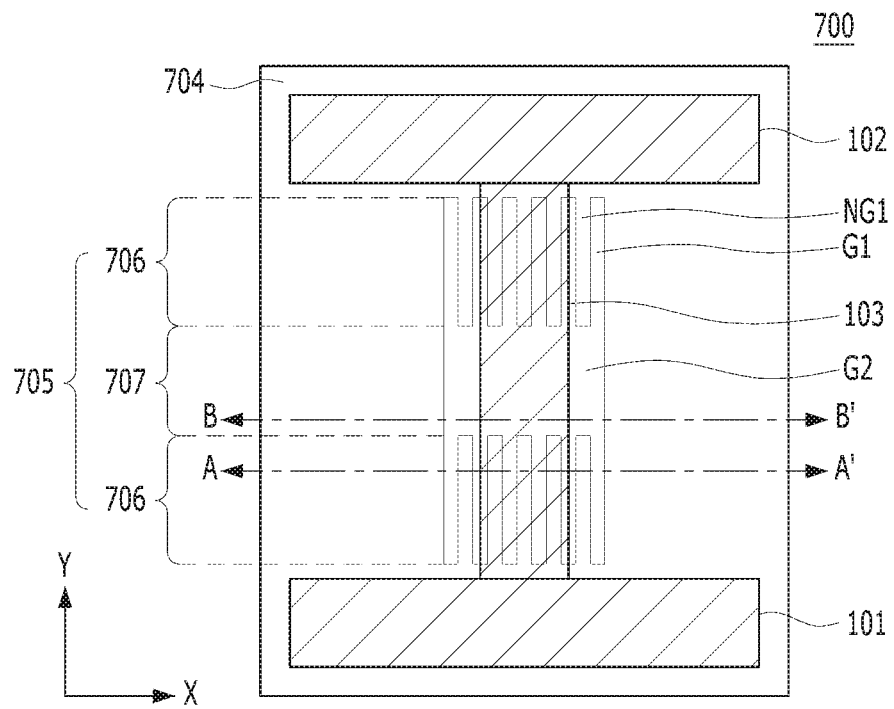
FIG. 10 is a plan view illustrating a fuse structure, according to a seventh embodiment of the present invention.

FIG. 10 is a plan view illustrating a fuse structure according to a seventh embodiment of the present invention. Some components of a fuse structure 700 according to a seventh embodiment are similar to those of the fuse structure 300 according to the third embodiment of the present invention.

Referring to FIG. 10, a fuse structure 700 may include a first electrode 101, a second electrode 102, and a fusing line 103 between the first and second electrodes 101 and 102. The first electrode 101 may be a cathode, and the second electrode 102 may be an anode. The fusing line 103 may include a conductive material. The fusing line 103 may be an electrically programmable material. For example, the fusing line 103 may include copper (Cu). The first and second electrodes 101 and 102 and the fusing line 103 may be an integral structure. The first and second electrodes 101 and 102 and the fusing line 103 may be formed of the same material. For example, all of the first and second electrodes 101 and 102 and the fusing line 103 may be or include, for example, copper. The fusing line 103 may be an elongated element. The fusing line 103 may extend in a first direction Y. However, we note that the fusing line may extend in any direction provided that it links the first and second electrodes 101 and 102. The fusing line 103 may include a first portion F1, a second portion F2, and a central portion FC between the first and second portions F1 and F2.

The fuse structure 700 may further include a dummy fuse 705 which neighbors the fusing line 103. The dummy fuse 705 may be disposed at a lower level than the fusing line 103. The dummy fuse 705 may be formed under the fusing line 103. Portions of the dummy fuse 705 may partially or entirely overlap with the fusing line 103. The dummy fuse 705 may be formed in a dielectric layer 704. The dielectric layer 704 may be formed under the fusing line 103. The dielectric layer 704 may have an ultra-low dielectric constant lower than 3.9. For example, the dielectric layer 704 may be formed of an ultra-low-k material. The dummy fuse 705 may include a first air dummy fuse 706 and a second air dummy fuse 707.

The first air dummy fuse 706 may include a plurality of first air gaps G1. The first air gaps G1 may extend in the first direction Y parallel to the fusing line 103. The first air gaps G1 may be elongated (line) elements. The first air gaps G1 may have a width smaller than the fusing line 103. The first air gaps G1 may have rectangular elongated shapes as viewed from the top. The plurality of first air gaps G1 may be formed under the first and second portions F1 and F2 of the fusing line 103. The first air dummy fuse 706 may further include a plurality of first non-air gaps NG1 disposed between the plurality of first air gaps G1. The first non-air gaps NG1 may have a dielectric constant higher than the first air gaps G1. The first non-air gaps NG1 may have an ultra-low dielectric constant lower than 3.9. The first non-air gaps NG1 may be portions of the dielectric layer 704. The first non-air gaps NG1 may be formed of an ultra-low-k material. The first non-air gaps NG1 may have the same shape as the first air gaps G1.

The second air dummy fuse 707 may include a second air gap G2. The second air gap G2 may extend in a second direction X crossing with the fusing line 103. The second air gap G2 may be an elongated element. The second air gap G2 may have a width equal to or larger than the fusing line 103. The second air gap G2 may have a rectangular shape. The second air gap G2 may be formed under the central portion FC of the fusing line 103. The second air dummy fuse 707 may be constructed by only the second air gap G2. In other words, the second air dummy fuse 707 may not include the plurality of second non-air gaps NG2 of the third embodiment of the present invention. The second air dummy fuse 707 may have an area larger than the first air dummy fuse 706. The first and second air dummy fuses 706 and 707 may be coupled with each other. As the first and second air dummy fuses 706 and 707 are coupled with each other they form the dummy fuse 705 which has the same shape as the dummy fuse 605 of FIG. 9.

Figure 11:
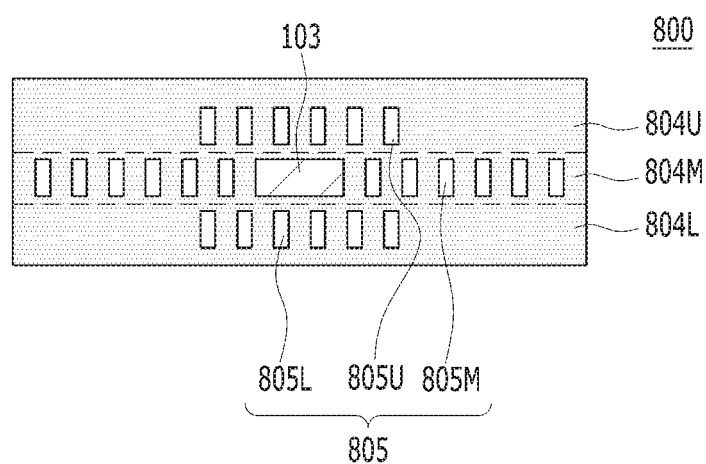
FIG. 11 is a cross-sectional view illustrating a fuse structure, according to an eighth embodiment of the present invention.

FIG. 11 is a cross-sectional view illustrating a fuse structure 800, according to an eighth embodiment of the present invention. Some components of a fuse structure 800 are similar to those of the fuse structure 400 according to the fourth embodiment of the present invention. Also, some components of the fuse structure 800 are similar to those of the fuse structures 400, 500 and 600 according to the fifth to seventh embodiments of the present invention.

Referring to FIGS. 8, 9, 10 and 11, the fuse structure 800 may include a first electrode 101, a second electrode 102, and a fusing line 103 between the first and second electrodes 101 and 102. The first electrode 101 may be a cathode, and the second electrode 102 may be an anode. The fusing line 103 may include a conductive material. The fusing line 103 may be an electrically programmable material. For example, the fusing line 103 may include copper (Cu). The first and second electrodes 101 and 102 and the fusing line 103 may be an integral structure. The first and second electrodes 101 and 102 and the fusing line 103 may be formed of the same material. For example, all of the first and second electrodes 101 and 102 and the fusing line 103 may be or include, for example, copper. The fusing line 103 may be an elongated element. The fusing line 103 may extend in a first direction Y. However, we note that the fusing line may extend in any direction provided that it links the first and second electrodes 101 and 102. The fusing line 103 may include a first portion F1, a second portion F2, and a central portion FC between the first and second portions F1 and F2.

The fuse structure 800 may further include a dummy fuse 805 which neighbors the fusing line 103. The dummy fuse 805 of the eighth embodiment may include a first dummy fuse 805L, a second dummy fuse 805M, and a third dummy fuse 805U. The first dummy fuse 805L may be disposed at a lower level than the fusing line 103. The second dummy fuse 805M may be disposed at the same level as the fusing line 103. The third dummy fuse 805U may be disposed at a level that is higher than the level of the fusing lines 103. For example, the first dummy fuse 805L may be formed under the fusing line 103, and the third dummy fuse 805U may be formed over the fusing line 103. The second dummy fuse 805M may be formed on both sides of the fusing line 103. The first dummy fuse 805L and the third dummy fuse 805U may partially or entirely overlap with the fusing line 103 in the vertical direction. The second dummy fuse 805M may not overlap with the fusing line 103 in the vertical direction.

The second dummy fuse 805M corresponds to the dummy fuse 505 of the fifth embodiment of the present invention. For example, the second dummy fuse 805M may include the first and second air dummy fuses 506 and 507 of the fifth embodiment (see FIG. 8). The first and second air dummy fuses 506 and 507 may be coupled with each other. The second air dummy fuse 507 may be constructed by only the second air gap G2. As the first and second air dummy fuses 506 and 507 are coupled with each other they form the second dummy fuse 805M which has the same shape as the dummy fuse 505 of FIG. 8.

The first dummy fuse 805L corresponds to the dummy fuse 705 of the seventh embodiment of the present invention. For example, the first dummy fuse 805L may include the first and second air dummy fuses 706 and 707 of the seventh embodiment (see FIG. 10). The first and second air dummy fuses 706 and 707 may be coupled with each other. The second air dummy fuse 707 may be constructed by only the second air gap G2. As the first and second air dummy fuses 706 and 707 are coupled with each other they form the first dummy fuse 805L which has the same shape as the dummy fuse 705 of FIG. 10.

The third dummy fuse 805U corresponds to the dummy fuse 605 of the sixth embodiment of the present invention. For example, the third dummy fuse 805U may include the first and second air dummy fuses 606 and 607 of the sixth embodiment (see FIG. 9). The first and second air dummy fuses 606 and 607 may be coupled with each other. The second air dummy fuse 607 may be constructed by only the second air gap G2. As the first and second air dummy fuses 606 and 607 are coupled with each other they form the third dummy fuse 805U which has the same shape as the dummy fuse 605 of FIG. 9.

The first to third dummy fuse 805L to 805U may be formed in a first interlayer dielectric layer 804L, a second interlayer dielectric layer 804M and a third interlayer dielectric layer 804U, respectively. The first to third interlayer dielectric layers 804L to 804U may be an ultra-low-k material.

The fuse structures 100, 200, 300, 400, 500, 600, 700 and 800 according to the embodiments may be formed in a back end of line (BEOL) process.

FIGS. 12A to 12D are views taken in correspondence to the lines A-A', B-B' and C-C' of FIG. 4A for illustrating a method for manufacturing the fuse structure 100 of FIG. 4A.

Figure 12A:
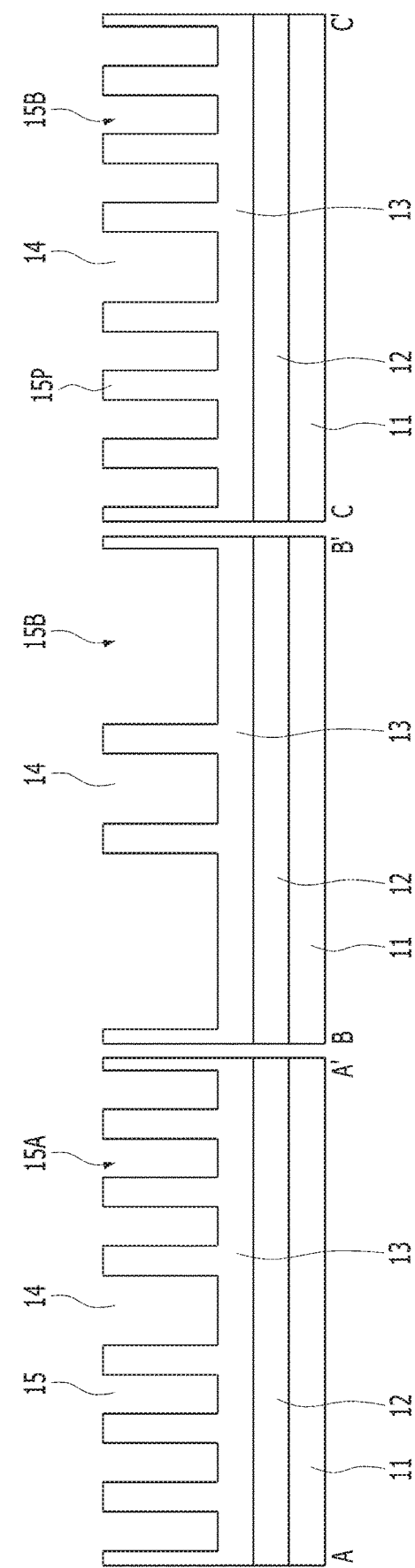

As shown in FIG. 12A, a substrate 11 is prepared. The substrate 11 may be a material that is appropriate for semiconductor processing. The substrate 11 may be or include a semiconductor substrate. The substrate 11 may be formed of a silicon-containing material. The substrate 11 may be or include silicon, monocrystalline silicon, polysilicon, amorphous silicon, silicon germanium, monocrystalline silicon germanium, polycrystalline silicon germanium, carbon-doped silicon, a combination thereof, or a multi-layer thereof. The substrate 11 may be or include another semiconductor material, such as, germanium. The substrate 11 may be or include a III/V group semiconductor substrate. The substrate 11, may be or include a compound semiconductor substrate such as, GaAs. The substrate 11 may be or include a silicon-on-insulator (SOI) substrate.

An isolation layer 12 may be formed in the substrate 11. The isolation layer 12 may be a shallow trench isolation (STI) region. The isolation layer 12 may be formed by filling a dielectric material in a shallow trench, for example, an isolation trench employing the STI technique. The isolation layer 12 may include a silicon oxide, a silicon nitride or a combination thereof.

An interlayer dielectric layer 13 may be formed on the substrate 11. The interlayer dielectric layer 13 may include a low-k material. The interlayer dielectric layer 13 may include an ultra-low-k (ULK) material.

A fuse trench 14 may then be formed, for example, by etching the interlayer dielectric layer 13. The fuse trench 14 may be an elongated element extending in a first direction Y, which has a first width L1 as shown in FIGS. 4A and 4B. The fuse trench 14 may be a single trench.

A plurality of dummy trenches 15 may be formed. The dummy trenches 15 may be formed at the same time when forming the fuse trench 14 or after forming the fuse trench 14, The dummy trenches 15 may be formed, for example, by etching portions of the interlayer dielectric layer 13. The dummy trenches 15 may be formed on both sides of the fuse trench 14. The dummy trenches 15 may include a plurality of first portions 15A which are elongated elements extending in the first direction Y and spaced apart at a regular interval in the second direction X (see FIG. 4A). Each of the plurality of the first elongated portions 15A may have a width L2 (see FIG. 4B). The dummy trenches 15 further include a second portion 15B extending in the second direction X and having a width L3. The first and second portions 15A and 15B may communicate with each other. The dummy trenches 15 may be formed at a higher density than the fuse trenches 14. When viewed in the first direction Y, the first portions 15A of the dummy trenches 15 may have a width that is narrower than the width of the fuse trench 14. The first portions 15A of the dummy trenches 15 are portions where the first air gaps G1 of FIG. 4A are to be formed, and the second portions 15B of the dummy trenches 15 is a portion where the second air gaps G2 of FIG. 4A are to be formed. When forming the dummy trenches 15, a plurality of pillars 15P may be formed in the second portion 15B. The plurality of pillars 15P correspond to the second non-air gaps NG2 of FIG. 4A. Therefore, the space to be gapfilled by a subsequent metal layer 17 in the second portion 15B of the dummy trenches 15 is decreased due to the presence of the pillars 15P. For example, as shown in FIG. 4B, the second portion 15B of the dummy trenches 15 provide a narrow gapfill space having a fourth width L4, due to the presence of the pillars 15P.

The fuse trench 14 and the dummy trenches 15 may be disposed at the same level. The fuse trench 14 and the dummy trenches 15 may have the same depth.

Figure 12B:
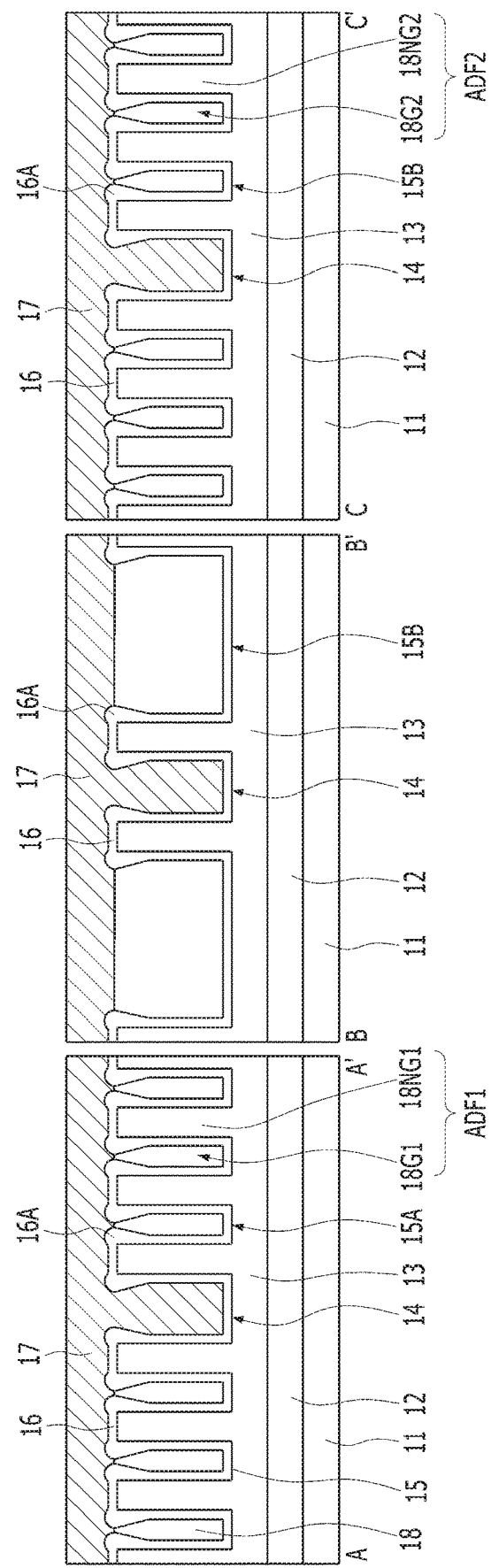

As shown in FIG. 12B, a barrier layer 16 may be formed. The barrier layer 16 may be formed on the fuse trench 14 and the dummy trenches 15. The barrier layer 16 may include overhangs 16A.

The metal layer 17 may be formed to fill the fuse trench 14 on the barrier layer 16. While portions of the metal layer 17 may be formed above the dummy trenches 15, the metal layer does not fill the dummy trenches 15 because the widths of the dummy trenches 15 are too narrow, thus preventing the metal layer from entering the insides of the dummy trenches 15. Hence, the insides of the dummy trenches 15 remain empty to form the air gaps 18 when the metal layer 17 is formed. The entrances of the air gaps 18 may be capped by the metal layer 17. The metal layer 17 may include any suitable metal. The metal layer 17 may be or include, for example, a transition metal. The metal layer 17 may be or include, for example, copper. The metal layer 17 may be formed, for example, by electroplating. After addition of the metal layer 17, a plurality of air gaps 18 are formed including a plurality of first air gaps 18G1 and one second air gap 18G2. The first air gaps 18G1 are formed in the first portions 15A of the dummy trenches 15 whereas the second air gap 18G2 is formed in the second portion 15B of the dummy trenches 15.

The barrier layer 16 may be or include, for example, titanium, a titanium nitride, a tungsten nitride or a combination thereof. The barrier layer 16 may be formed, for example, by physical vapor deposition (PVD). In the case of using physical vapor deposition, the barrier layer 16 having poor step coverage. Therefore, as the barrier layer 16 may be deposited in excess on top edges of the fuse trench 14 and the dummy trenches 15 and overhangs 16A may be formed. To facilitate formation of the air gaps 18, the width of the dummy trenches 15 is designed to be sufficiently small so that the entrances of the dummy trenches 15 are closed by the overhangs 16A which are formed during the deposition process of the barrier layer 16. This way, the dummy trenches are not gapfilled by the subsequent electroplating of copper to thereby form the air gaps 18. Therefore, the widths of the dummy trenches 15 are important in forming the air gaps 18.

Figure 12C:
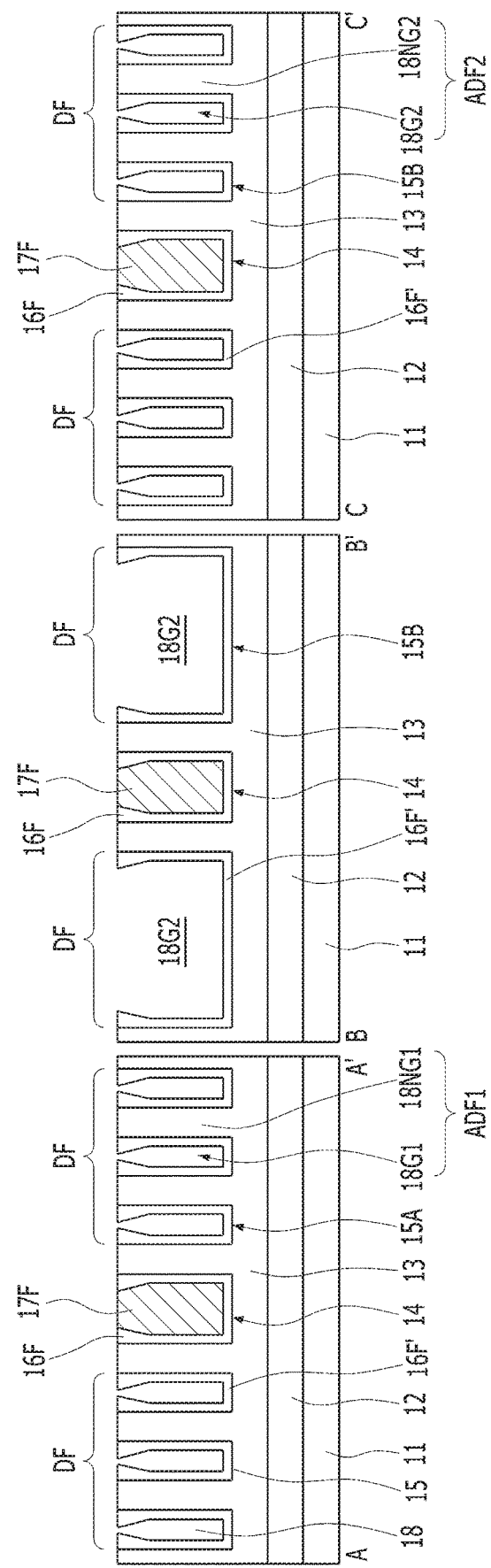

As shown in FIG. 12C, the metal layer 17 may be planarized. Accordingly, a fusing line 17F may be formed in the fuse trench 14. The fusing line 17F are not formed in the dummy trenches 15. Also, following planarization of the metal layer 17, the air gaps 18 may be opened. After planarizing the metal layer 17, the barrier layer 16 may also be removed from the top surface of the interlayer dielectric layer 13 leaving a fuse barrier 16F remaining in the fuse trench 14. Dummy barriers 16F' may also remain in the dummy trenches 15.

The air gaps 18 may include the plurality of first air gaps 18G1 and one second air gap 18G2. A plurality of first non-air gaps 18NG1 may be formed between the plurality of first air gaps 18G1. A plurality of second non-air gaps 18NG2 having pillar shapes may be arrayed in the second air gap 18G2. The plurality of first and second non-air gaps 18NG1 and 18NG2 are portions of the interlayer dielectric layer 13. The second non-air gaps 18NG2 correspond to the pillars 15P of FIG. 12A.

The plurality of first air and non-air gaps 18G1 and 18NG1 may form a first air dummy fuse ADF1. The second air and non-air gaps 18G2 and 18NG2 may form a second air dummy fuse ADF2. The first and second air dummy fuses ADF1 and ADF2 correspond to the first and second air dummy fuses 106 and 107 of FIG. 4A, respectively.

As described above, a dummy fuse DF may be formed on both sides of the fusing line 17F. The fusing line 17F and the dummy fuse DF may be formed at the same level. The dummy fuse DF may include the first and second air dummy fuses ADF1 and ADF2. The first air dummy fuse ADF1 may include the first air gaps 18G1 and the first non-air gaps 18NG1. The second air dummy fuse ADF2 may include the second air gap 18G2 and the second non-air gaps 18NG2.

As shown in FIG. 12D, a capping layer 19 may be formed. The capping layer 19 may be formed on the interlayer dielectric layer 13 including the fusing line 17F and the dummy fuse DF. The capping layer 19 may include, for example, a nitride. The dummy fuse DF, that is, tops of the air gaps 18, may be closed by the capping layer 19. The capping layer 19 may cover the tops of the fusing line 17F and the air gaps 18. The capping layer 19 may serve as an etch stop layer which prevents the air gaps 18 from being exposed during a subsequent process.

FIGS. 13A to 13F are views taken in correspondence to the lines A-A', B-B' and C-C' of FIG. 6A illustrating a method for manufacturing the fuse structure 300 of FIG. 6A.

Figure 13A:
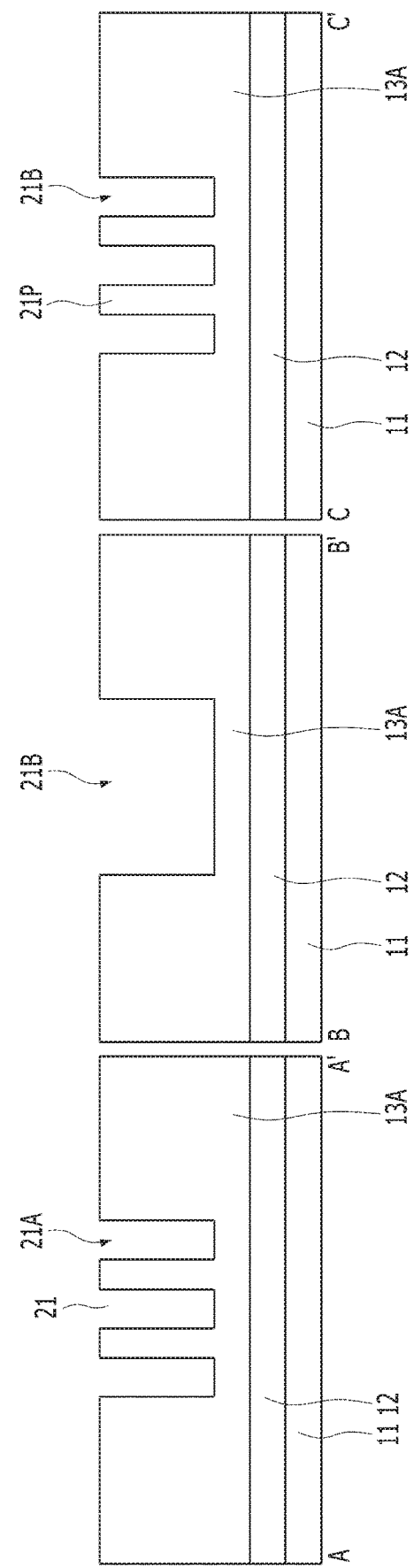

As shown in FIG. 13A, an isolation layer 12 may be formed in a substrate 11 and a first interlayer dielectric layer 13A may be formed on the isolation layer 12. The first interlayer dielectric layer 13A may include a low-k material. The first interlayer dielectric layer 13A may include an ultra-low-k material.

A plurality of dummy trenches 21 may be formed. The dummy trenches 21 may be formed, for example, by etching portions of the first interlayer dielectric layer 13A. The dummy trenches 21 may be positioned under a fusing line to be formed subsequently.

The dummy trenches 21 may include a plurality of first portions 21A extending in the first direction Y (see FIG. 6A). The plurality of first portions 21A of the dummy trenches 21 may be spaced apart at a regular interval along the second direction X (see FIG. 6A). The dummy trenches 21 may further include a second portion 21B extending in the second direction X. The first and second portions 21A and 213 may communicate with each other. Referring again to FIG. 6A, the first portions 21A of the dummy trenches 21 are portions where the first air gaps G1 are to be formed, and the second portion 21B of the dummy trenches 21 is a portion where the second air gap G2 is to be formed. When viewed in the second direction X of FIG. 6A, a plurality of pillars 21P may be formed in the second portion 213 of the dummy trenches 21. Therefore, a second air gap 24G2 may be formed in the second portion 21B by the pillars 21P when depositing a subsequent first metal layer 23.

Figure 13B:
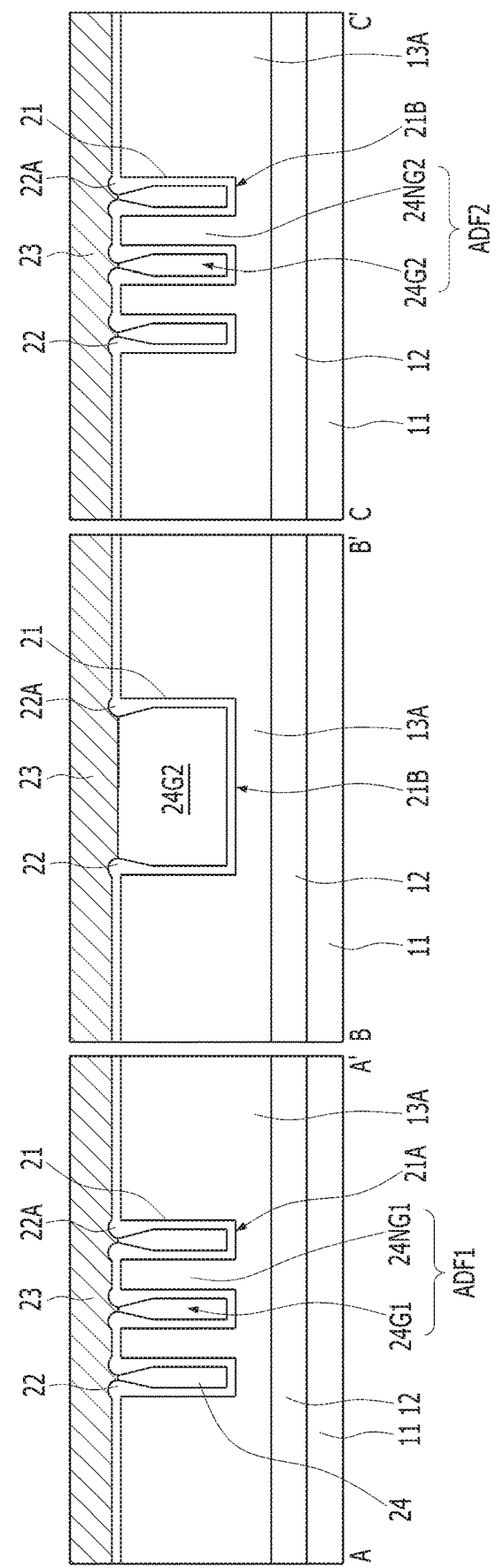

As shown in FIG. 13B, a first barrier layer 22 may be formed. The first barrier layer 22 may be formed on the dummy trenches 21. The first barrier layer 22 may include overhangs 22A.

The first metal layer 23 may be formed. While portions of the first metal layer 23 may be formed in the dummy trenches 21, metal layer does not fill the dummy trenches 21 because the widths of the dummy trenches 21 are sufficiently narrow so that the insides of the dummy trenches 21 may remain empty to become air gaps 24 when the first metal layer 23 is formed. The entrances of the air gaps 24 may be capped by the first metal layer 23. The first metal layer 23 may be or include any suitable metal, such as, a transition metal. The first metal layer 23 may be or include copper. The first metal layer 23 may be formed, for example, by electroplating. A plurality of air gaps 24 may be formed. For example, the air gaps 24 may include a plurality of first air gaps 24G1 and one second air gap 24G2. The first air gaps 24G1 may be formed in the first portions 21A of the dummy trenches 21. The second air gap 24G2 may be formed in the second portion 21B of the dummy trenches 21.

The first barrier layer 22 may be or include, for example, titanium, a titanium nitride, a tungsten nitride or a combination thereof. The first barrier layer 22 may be formed, for example, by physical vapor deposition (PVD). In the case of using physical vapor deposition, the first barrier layer 22 may have poor step coverage. Therefore, as the first barrier layer 22 is deposited in excess on top edges of the dummy trenches 21, the overhangs 22A may be formed. To facilitate formation of the air gaps 24, the width of the dummy trenches 21 is designed to be sufficiently small so that the entrances of the dummy trenches 21 are closed by the overhangs 22A which are formed during the deposition process of the first barrier layer 22. Thus, the entrances of the dummy trenches 21 may not be gapfilled by the subsequent electroplating of the copper layer, thereby forming the air gaps 24. Therefore, the widths of the dummy trenches 21 are important in forming the air gaps 24.

Figure 13C:
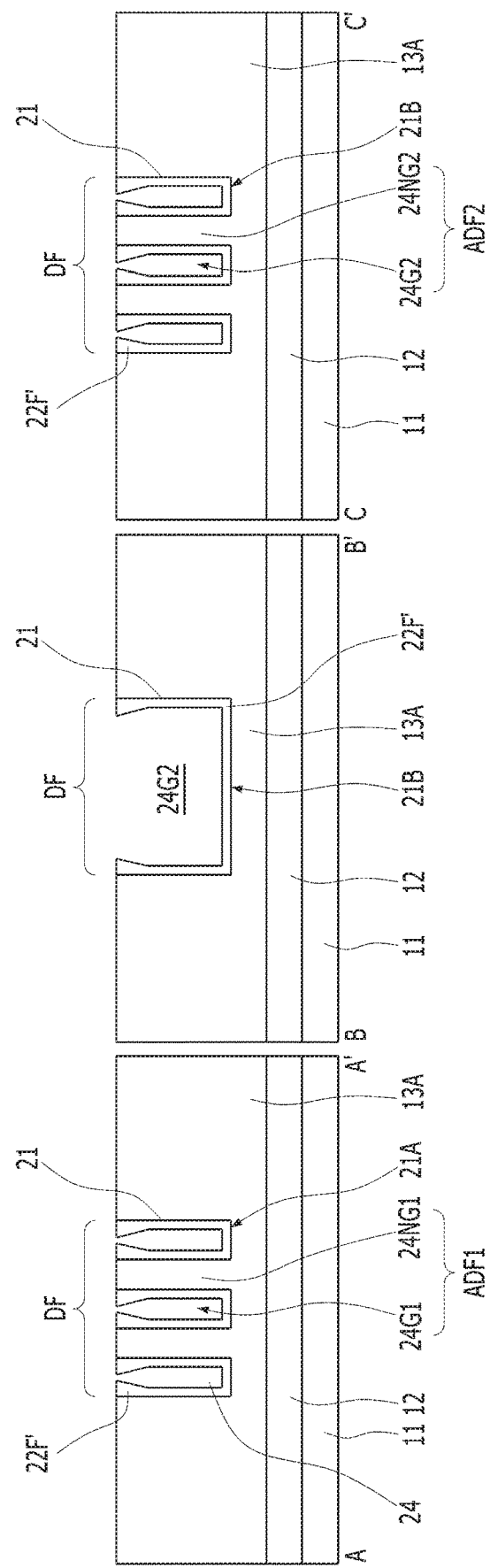

As shown in FIG. 13C, the first metal layer 23 may be planarized. Accordingly, the air gaps 24 may remain in the dummy trenches 21. After planarizing the first metal layer 23, the first barrier layer 22 may be removed from the top surface of the first interlayer dielectric layer 13A. Accordingly, dummy barriers 22F' may remain in the dummy trenches 21.

The air gaps 24 may include the plurality of first air gaps 24G1 and one second air gap 24G2. A plurality of first non-air gaps 24NG1 may be formed between the plurality of first air gaps 24G1. A plurality of second non-air gaps 24NG2 which have pillar shapes may be arrayed in the second air gap 24G2. The plurality of first and second non-air gaps 24NG1 and 24NG2 may be portions of the first interlayer dielectric layer 13A. The second non-air gaps 24NG2 correspond to the pillars 21P of FIG. 13A.

The plurality of first and second air gaps 24G1 and 24NG1 may form a first air dummy fuse ADF1. The second air and non-air gaps 24G2 and 24NG2 may form a second air dummy fuse ADF2. The first and second air dummy fuses ADF1 and ADF2 correspond to the first and second air dummy fuses 306 and 307 of FIG. 6A, respectively.

As described above, a dummy fuse DF may be formed. The dummy fuse DF may include the first and second air dummy fuses ADF1 and ADF2.

As shown in FIG. 13D, a first capping layer 25 may be formed. The first capping layer 25 may be formed on the first interlayer dielectric layer 13A including the dummy fuse DF. The first capping layer 25 may be or include, for example, a nitride. The top of the dummy fuse DF may be closed by the first capping layer 25. The first capping layer 25 may cover tops of the air gaps 24. The first capping layer 25 may serve as an etch stop layer which prevents the air gaps 24 from being exposed during a subsequent process.

Figure 13E:
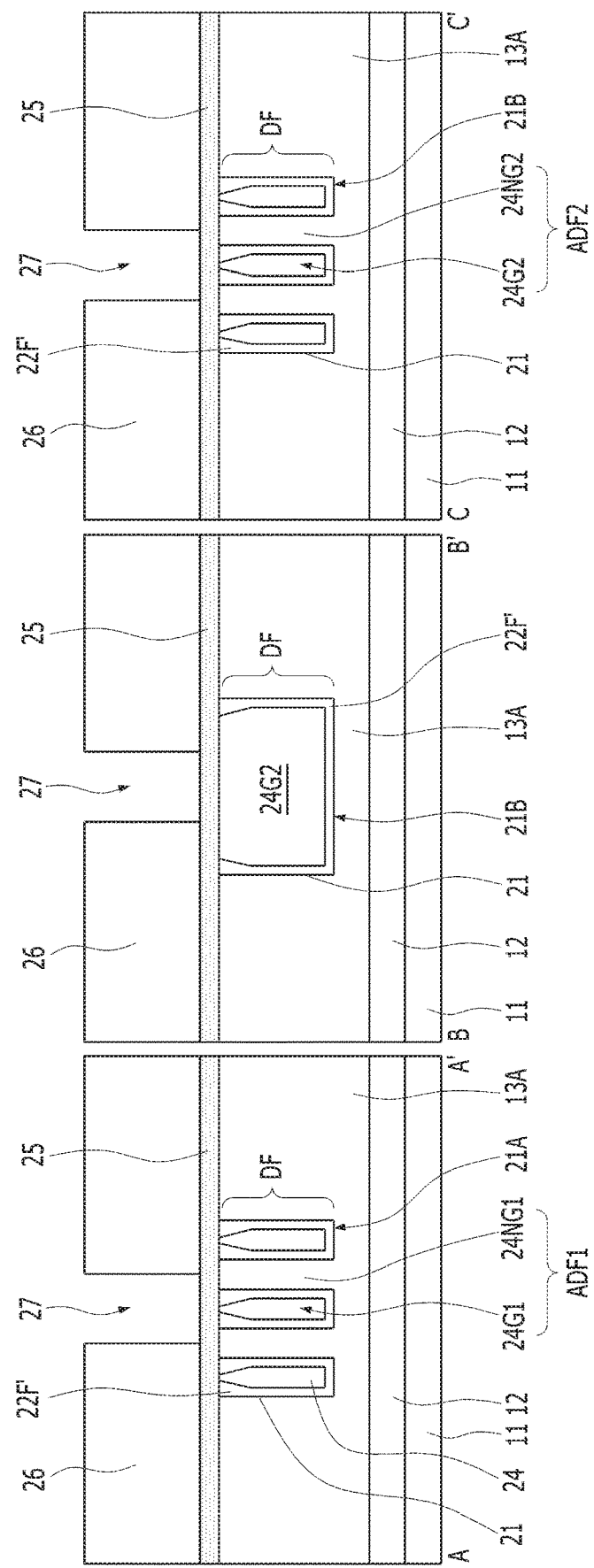

As shown in FIG. 13E, a second interlayer dielectric layer 26 may be formed on the first capping layer 25. The second interlayer dielectric layer 26 may include a low-k material. The second interlayer dielectric layer 26 may include an ultra-low-k material.

A fuse trench 27 may be formed. The fuse trench 27 may be formed, for example, by etching the second interlayer dielectric layer 26. The fuse trench 27 may be an elongated element extending in the first direction Y. The fuse trench 27 may extend in the same direction as the first portions 21A of the dummy trenches 21. The fuse trench 27 may be a single trench. The fuse trench 27 may have a width larger than the first portions 21A of the dummy trenches 21.

Figure 13F:
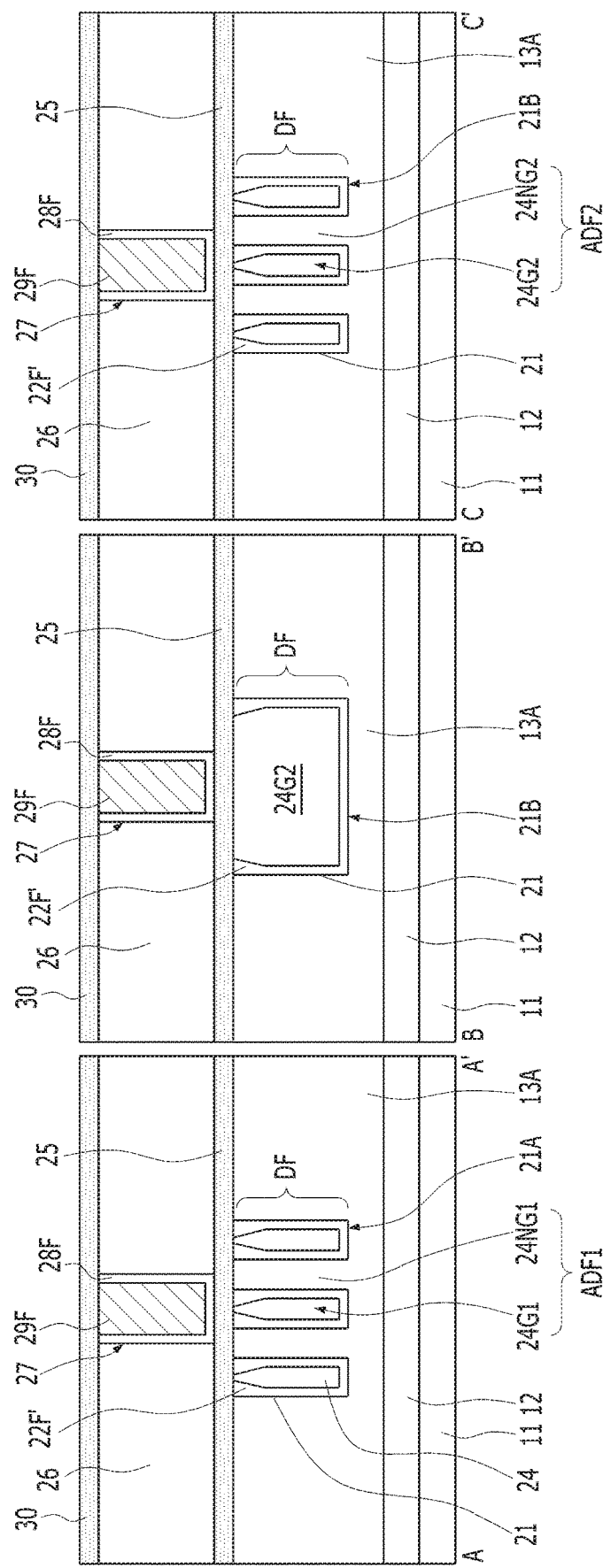

As shown in FIG. 13F, a fuse barrier 28F and a fusing line 29F may be formed in the fuse trench 27. The fusing line 29F and the fuse barrier 28F may be formed by depositing and then planarizing, for example, through chemical mechanical polishing (CMP) a second barrier layer and a second metal layer.

The fusing line 29F may partially or entirely overlap with the dummy fuse DF in the vertical direction. Therefore, the dummy fuse DF may be positioned at a lower level than the fusing line 29F.

Next, a second capping layer 30 may be formed on the fusing line 29F, the fuse barrier 28F and the second interlayer dielectric layer 26. The second capping layer 30 and the first capping layer 25 may be formed, for example, from the same material.

Figure 14A:
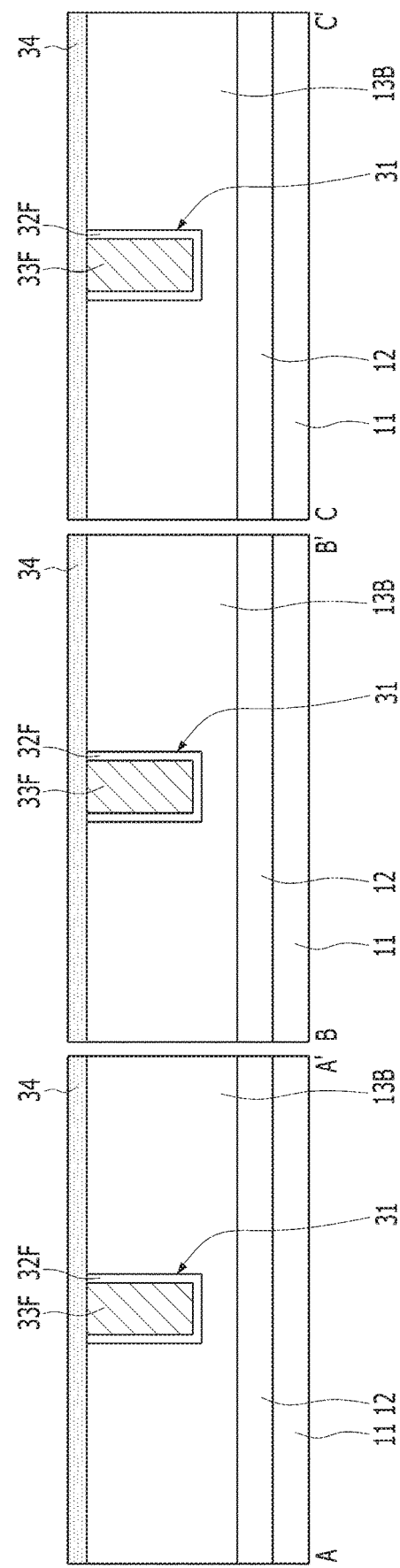
FIGS. 14A and 14B are views illustrating a method for manufacturing the fuse structure of FIG. 5A.
Figure 14B:
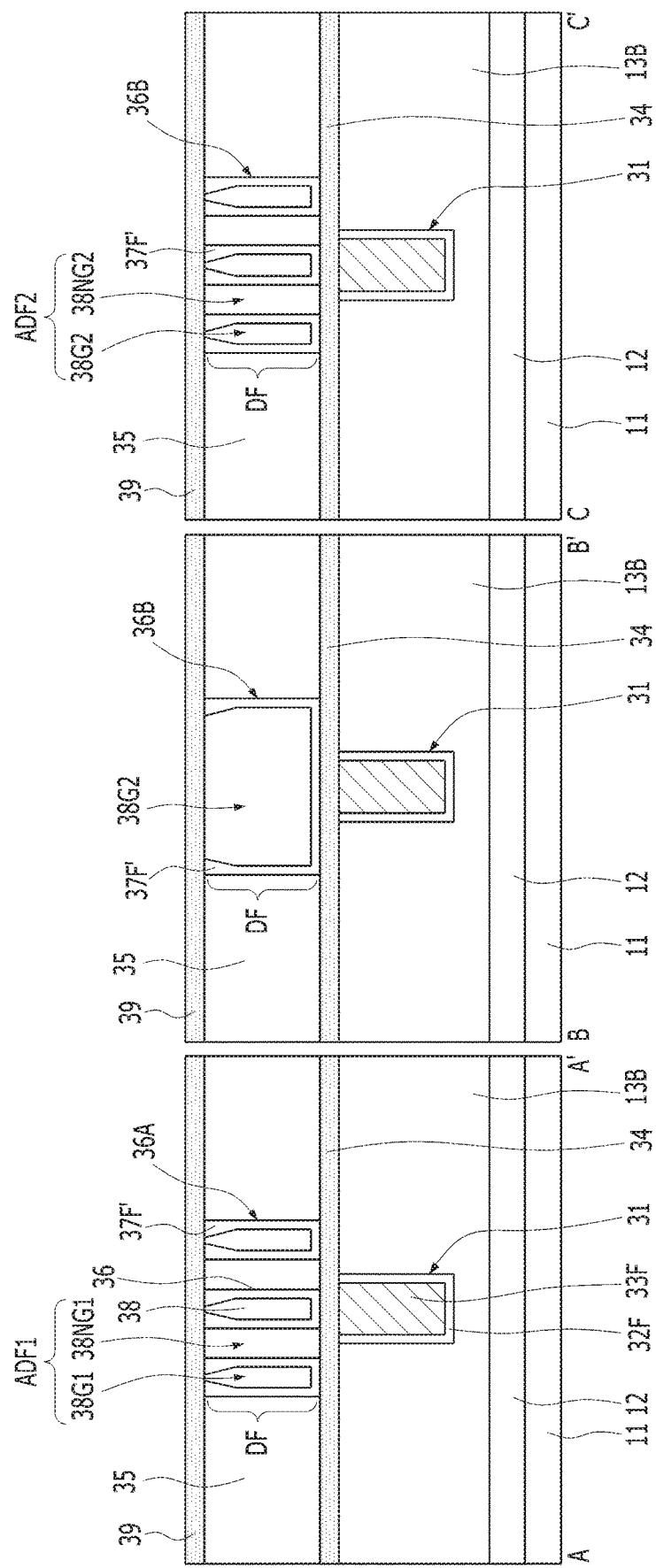

FIGS. 14A and 14B are views taken in correspondence to the lines A-A', B-B' and C-C' of FIG. 5A illustrating a method for manufacturing the fuse structure 200 of FIG. 5A.

As shown in FIG. 14A, an isolation layer 12 may be formed in a substrate 11 and a first interlayer dielectric layer 13B may be formed on the isolation layer 12. The first interlayer dielectric layer 13B may include a low-k material. The first interlayer dielectric layer 13B may include an ultra-low-k material.

A fuse trench 31 may be formed. The fuse trench 31 may be formed, for example, by etching the first interlayer dielectric layer 13B. The fuse trench 31 may be an elongated element extending in any one direction. The fuse trench 31 may be a single trench. Referring to FIG. 5A, the fuse trench 31 may extend in the first direction Y.

A fuse barrier 32F and a fusing line 33F may be formed in the fuse trench 31. The fusing line 33F and the fuse barrier 32F may be formed by depositing and then planarizing, for example, through CMP a barrier layer and a metal layer.

Next, a first capping layer 34 may be formed on the fusing line 33F, the fuse barrier 32F and the first interlayer dielectric layer 13B. The first capping layer 34 may be or include, for example, a nitride.

As shown in FIG. 14B, a second interlayer dielectric layer 35 may be formed on the first capping layer 34.

A plurality of dummy trenches 36 may be formed. The dummy trenches 36 may be formed, for example, by etching portions of the second interlayer dielectric layer 35. The dummy trenches 36 may be positioned over the fusing line 33F.

The dummy trenches 36 may include a plurality of first portions 36A extending in the first direction Y. The plurality of first portions 36A of the dummy trenches 36 may be spaced apart at a regular interval in the second direction X (see FIG. 5A). The dummy trenches 36 may further include a second portion 36B. The second portion 36B may extend in the second direction X. The first and second portions 36A and 36B may communicate with each other.

Dummy barriers 37F' and a dummy fuse DF may be formed in the dummy trenches 36. The dummy barriers 37F'' and the dummy fuse DF may be formed by depositing and then planarizing, for example, through CMP a barrier layer and a metal layer. The dummy fuse DF may include air gaps 38. The air gaps 38 may be formed as described above. The dummy fuse DF may include a first air dummy fuse ADF1 and a second air dummy fuse ADF2. The first air dummy fuse ADF1 may include first air gaps 38G1 and first non-air gaps 38NG1. The second air dummy fuse ADF2 may include a second air gap 38G2 and second non-air gaps 38NG2. The first and second air dummy fuses ADF1 and ADF2 correspond to the first and second air dummy fuses 206 and 207 of FIG. 5A, respectively. The dummy fuse DF may be disposed at a level that is higher than the level of the fusing line 33F. The fusing line 33F may partially or entirely overlap with the dummy fuse DF in the vertical direction.

Next, a second capping layer 39 may be formed on the second interlayer dielectric layer 35 including the dummy fuse DF.

The fuse structure 400 of FIG. 7 may be formed by combining the methods described with reference to FIGS. 12A to 12D, FIGS. 13A to 13F and FIGS. 14A and 14B. For example, a dummy fuse of a lower level than a fusing line may be formed by the method of FIGS. 13A to 13F. Next, a dummy fuse may be formed by the method of FIGS. 12A to 12D at the same level as the fusing line. Finally, a dummy fuse at an upper level than the level of the fusing line may be formed by the method of FIGS. 14A and 14B.

FIGS. 15A to 15E are views taken in correspondence to the lines A-A' and B-B' of FIG. 8 illustrating a method for manufacturing the fuse structure 500 of FIG. 8. The method of FIGS. 15A to 15E is similar to the method of FIGS. 12A to 12D.

Figure 15A:
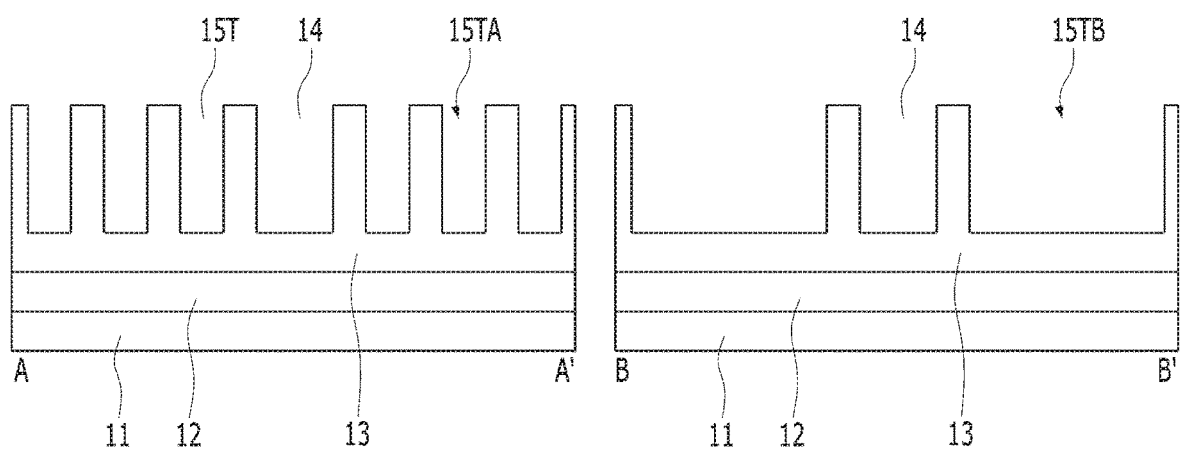
FIGS. 15A to 15E are views illustrating a method for manufacturing the fuse structure of FIG. 8.

As shown in FIG. 15A, an isolation layer 12 may be formed in a substrate 11. The isolation layer 12 may be an STI region.

An interlayer dielectric layer 13 may be formed on the substrate 11. The interlayer dielectric layer 13 may include a low-k material. The interlayer dielectric layer 13 may include an ultra-low-k material.

A fuse trench 14 may be formed. The fuse trench 14 may be formed, for example, by etching the interlayer dielectric layer 13. The fuse trench 14 may be an elongated element extending in any one direction, for example, the first direction Y of FIG. 8. The fuse trench 14 may be a single trench.

A plurality of dummy trenches 15T may be formed. The dummy trenches 15T may be formed at the same time when forming the fuse trench 14 or after forming the fuse trench 14. The dummy trenches 15T may be formed, for example, by etching portions of the interlayer dielectric layer 13. The dummy trenches 15T may be formed on both sides of the fuse trench 14. The dummy trenches 15T may have a narrow width than the fuse trench 14. The dummy trenches 15T may include a plurality of first portions 15TA extending in the first direction Y. The plurality of first portions 15TA of the dummy trenches 15T may be spaced apart at a regular interval in the second direction X (see FIG. 8). The dummy trenches 15T may further include a second portion 15TB extending in the second direction X. The first and second portions 15TA and 15TB may communicate with each other. The dummy trenches 15T may be formed with a higher density than the fuse trench 14. When viewed in the first direction Y, the first portions 15TA of the dummy trenches 15T may have a width narrower than the fuse trench 14. Unlike FIG. 12A, when forming the dummy trenches 15T, a plurality of pillars are not formed in the second portion 15TB. Therefore, the second portion 15TB of the dummy trenches 15T may be a single trench having a rectangular shape. Also, the second portion 15TB of the dummy trenches 15T may have an area wider than the second portion 15B of FIG. 12A.

The fuse trench 14 and the dummy trenches 15T may be disposed at the same level. The fuse trench 14 and the dummy trenches 15T may have the same depth.

Figure 15B:
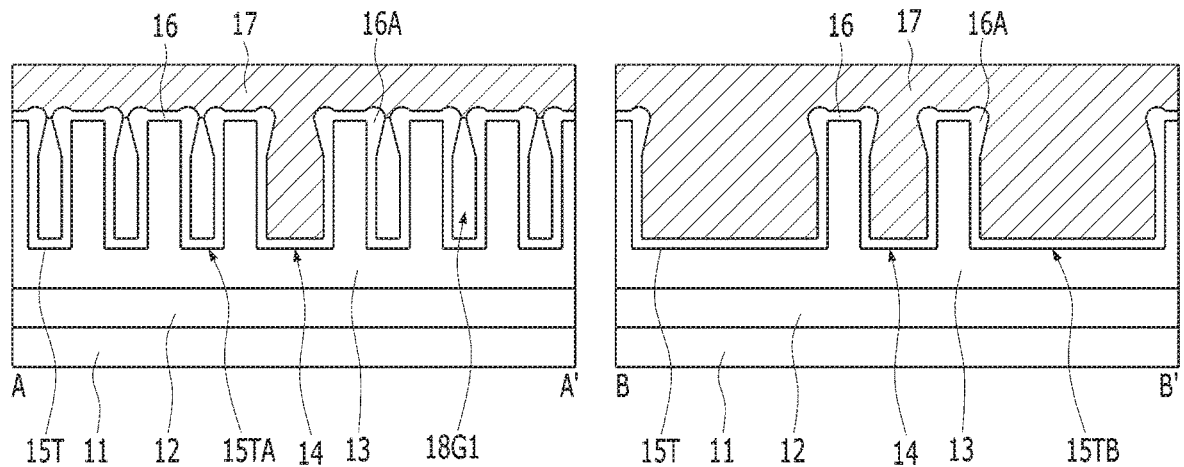

As shown in FIG. 15B, a barrier layer 16 may be formed. The barrier layer 16 may be formed on the fuse trench 14 and the dummy trenches 15T. The barrier layer 16 may include overhangs 16A.

A metal layer 17 may be formed. The metal layer 17 may fill the fuse trench 14 on the barrier layer 16. While portions of the metal layer 17 may be formed in the dummy trenches 15T, metal layer do not fill the first portions 15TA of the dummy trenches 15T because the width of the first portions 15TA of the dummy trenches 15T is narrow, therefore the insides of the first portions 15TA of the dummy trenches 15T remain empty to become first air gaps 18G1 when forming the metal layer 17. Entrances of the first air gaps 18G1 may be capped by the metal layer 17. The metal layer 17 may be or include, for example, copper. The metal layer 17 may be formed, for example, by electroplating. The first air gaps 18G1 may be formed in the first portions 15TA of the dummy trenches 15T. Because the second portion 15TB of the dummy trenches 15T has a width larger than the first portions 15TA, the metal layer 17 may fill the second portion 15TB of the dummy trenches 15T on the barrier layer 16.

The barrier layer 16 may be or include, for example, titanium, a titanium nitride, a tungsten nitride or a combination thereof. The barrier layer 16 may be formed, for example, by physical vapor deposition (PVD). In the case of using physical vapor deposition, the barrier layer 16 may have poor step coverage. Therefore, as the barrier layer 16 is deposited in excess on top edges of the fuse trench 14 and the dummy trenches 15T, the overhangs 16A may be formed. Entrances of the first portions 15TA of the dummy trenches 15T may be closed by the overhangs 16A of the barrier layer 16, and the first air gaps 18G1 may be formed when forming the metal layer 17. Therefore, the width of the first portions 15TA of the dummy trenches 15T is important in forming the first air gaps 18G1.

Figure 15C:
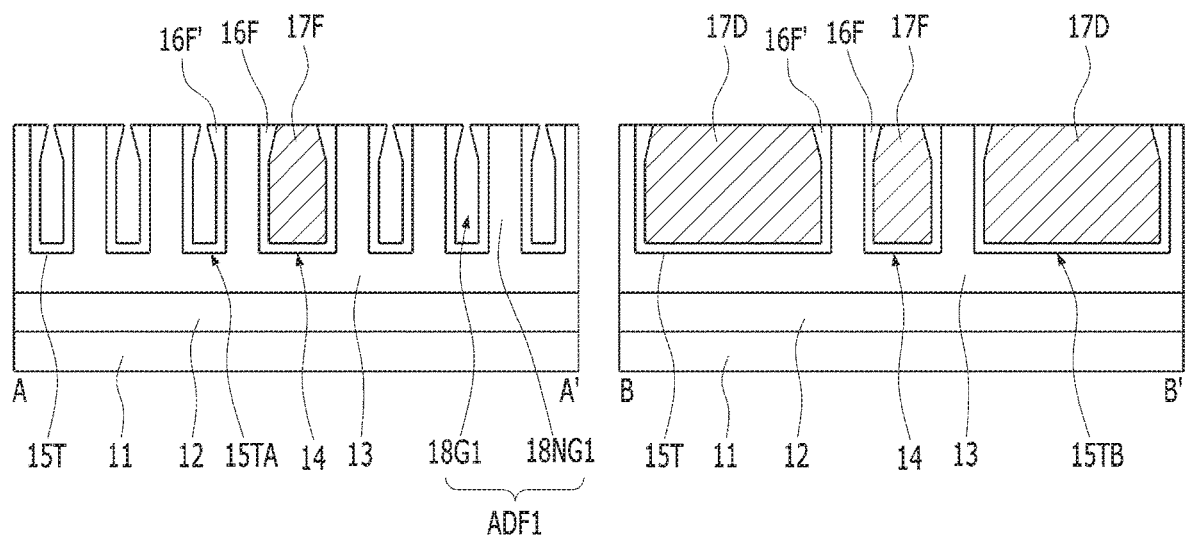

As shown in FIG. 15C, the metal layer 17 may be planarized. Accordingly, a fusing line 17F may be formed in the fuse trench 14. The metal layer 17 may not remain in the first portions 15TA of the dummy trenches 15T, and the first air gaps 18G1 may be opened. A dummy metal layer 17D may remain in the second portion 15TB of the dummy trenches 15T. After planarizing the metal layer 17, the barrier layer 16 may be removed from the top surface of the interlayer dielectric layer 13. Hence, a fuse barrier 16F may remain in the fuse trench 14. Dummy barriers 16F' may remain in the first portions 15TA of the dummy trenches 15T.

A plurality of first non-air gaps 18NG1 may be formed between the plurality of first air gaps 18G1. The plurality of first non-air gaps 18NG1 may be portions of the interlayer dielectric layer 13.

The plurality of first air and non-air gaps 18G1 and 18NG1 may form a first air dummy fuse ADF1, The first air dummy fuse ADF1 corresponds to the first air dummy fuse 506 of FIG. 8.

As described above, the first air dummy fuse ADF1 may be formed on both sides of the fusing line 17F. The fusing line 17F and the first air dummy fuse ADF1 may be formed at the same level.

Figure 15D:
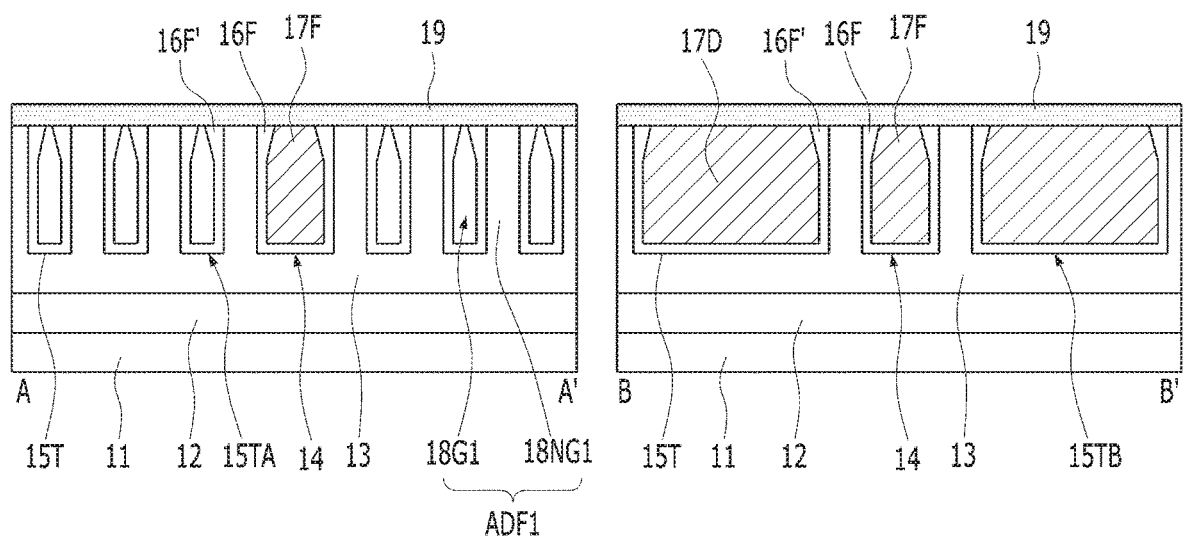

As shown in FIG. 15D, a capping layer 19 may be formed. The capping layer 19 may be formed on the interlayer dielectric layer 13 including the fusing line 17F and the first air dummy fuse ADF1. The capping layer 19 may be or include, for example, a nitride. The top of the first air dummy fuse ADF1 may be closed by the capping layer 19. The capping layer 19 may cover the tops of the fusing line 17F and the first air gaps 18G1. The capping layer 19 may serve as an etch stop layer which prevents the first air gaps 18G1 from being exposed during a subsequent process.

Figure 15E:
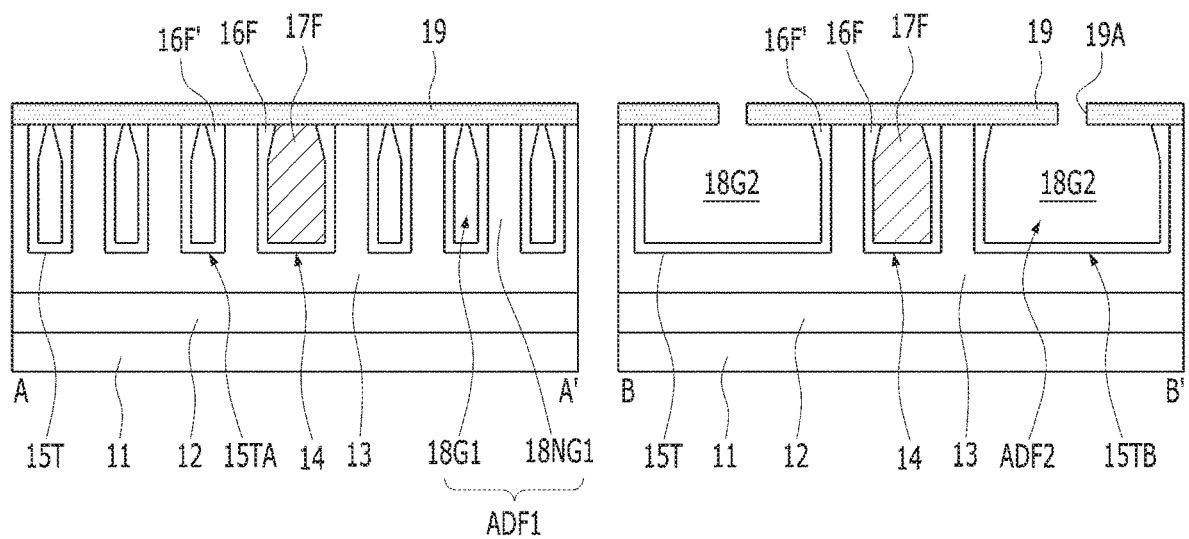

As shown in FIG. 15E, an opening 19A may be formed in the capping layer 19. The size and position of the opening 19A may be adjusted to enhance the removal efficiency of the dummy metal layer 17D. The opening 19A may expose the central portion of the dummy metal layer 17D.

The dummy metal layer 17D may be removed. For removing the dummy metal layer 17D, wet etching may be applied, for example. For example, the dummy metal layer 17D may be removed by using an SC1 chemical. The SC1 chemical is a solution including ammonia ($NH_4OH$), hydrogen peroxide ($H_2O_2$) and water ($H_2O$) are mixed at an appropriate ratio. The space from which the dummy metal layer 17D is removed may remain as a second air gap 18G2.

The second air gap 18G2 may construct a second air dummy fuse ADF2.

In this way, the first and second air dummy fuses ADF1 and ADF2 may form a double-toothed, comp-like shape air dummy fuse.

FIGS. 16A to 16G are views taken in correspondence to the lines A-A' and B-B' of FIG. 10 illustrating a method for manufacturing the fuse structure 700 of FIG. 10. The method of FIGS. 16A to 16G are similar to the method of FIGS. 13A to 13F.

Figure 16A:
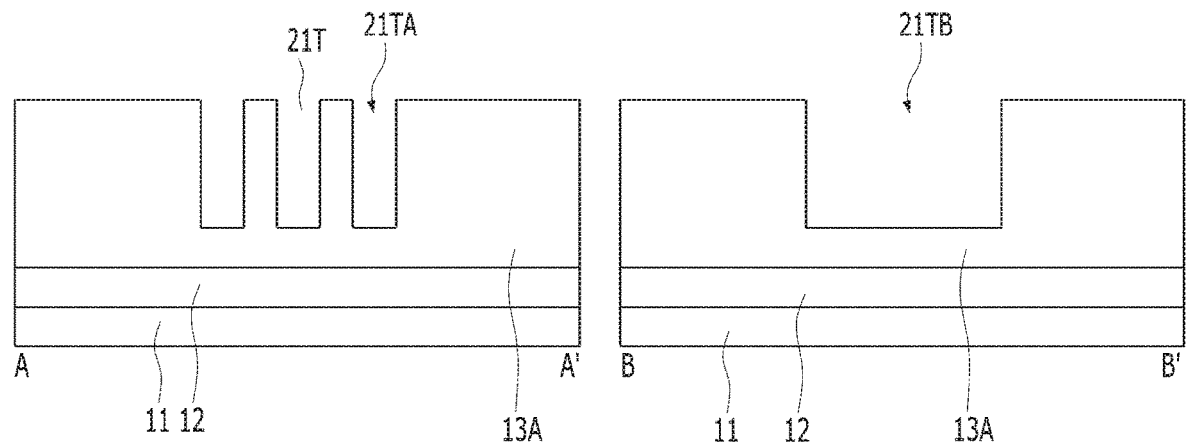
FIGS. 16A to 16G are views illustrating a method for manufacturing the fuse structure of FIG. 10.

As shown in FIG. 16A, an isolation layer 12 may be formed in a substrate 11. A first interlayer dielectric layer 13A may be formed on the substrate 11. The first interlayer dielectric layer 13A may include a low-k material. The first interlayer dielectric layer 13A may include an ultra-low-k material.

A plurality of dummy trenches 21T may be formed. The dummy trenches 21T may be formed, for example, by etching portions of the first interlayer dielectric layer 13A. The dummy trenches 21T may be positioned under a subsequent fusing line.

The dummy trenches 21T may include a plurality of first portions 21TA extending in the first direction Y (see FIG. 10). The plurality of first portions 21TA of the dummy trenches 21T may be spaced apart at a regular interval in the second direction X (see FIG. 10). The dummy trenches 21T may further include a second portion 21TB extending in the second direction X. The first and second portions 21TA and 21TB may communicate with each other. Unlike FIG. 13A, when forming the dummy trenches 21T, a plurality of pillars are not formed in the second portion 21TB. Therefore, the second portion 21TB of the dummy trenches 21T may be a single trench having a rectangular shape. Also, the second portion 21TB of the dummy trenches 21T may have an area wider than the second portion 21B of FIG. 13A.

Figure 16B:
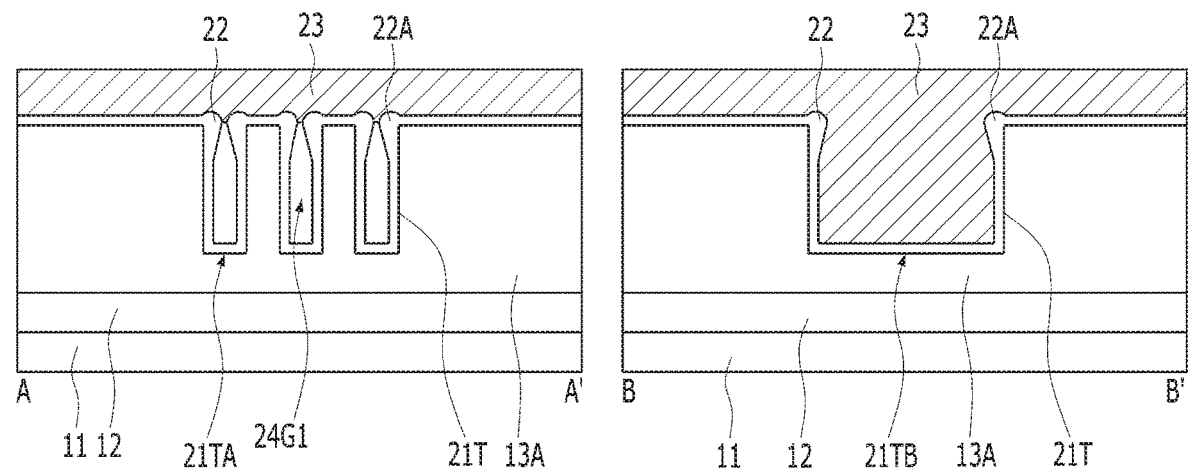

As shown in FIG. 16B, a first barrier layer 22 may be formed. The first barrier layer 22 may be formed on the dummy trenches 21T. The first barrier layer 22 may include overhangs 22A.

A first metal layer 23 may be formed. While portions of the first metal layer 23 may be formed in the dummy trenches 21T, metal layer does not fill the dummy trenches 21T because the width of the dummy trenches 21T is narrow, hence, the insides of the first portions 21TA of the dummy trenches 21T remain empty to become first air gaps 24G1 when forming the first metal layer 23. Entrances of the first air gaps 24G1 may be capped by the first metal layer 23. The first metal layer 23 may be or include, for example, copper. The first metal layer 23 may be formed, for example, by electroplating. The first air gaps 24G1 may be formed in the first portions 21TA of the dummy trenches 21T. Because the second portion 21TB of the dummy trenches 21T has a width larger than the first portions 21TA, the first metal layer 23 may fill the second portion 21TB of the dummy trenches 21T on the first barrier layer 22.

The first barrier layer 22 may be or include, for example, titanium, a titanium nitride, a tungsten nitride or a combination thereof. The first barrier layer 22 may be formed, for example, by physical vapor deposition (PVD). In the case of using physical vapor deposition, the first barrier layer 22 may have poor step coverage. Therefore, as the first barrier layer 22 is deposited in excess on top edges of the dummy trenches 21T, the overhangs 22A may be formed. Entrances of the first portions 21TA of the dummy trenches 21T may be closed by the overhangs 22A which are formed during the deposition process of the first barrier layer 22, and the first air gaps 24G1 may be formed when forming the first metal layer 23. Therefore, the width of the first portions 21TA of the dummy trenches 21T is important in forming the first air gaps 24G1.

Figure 16C:
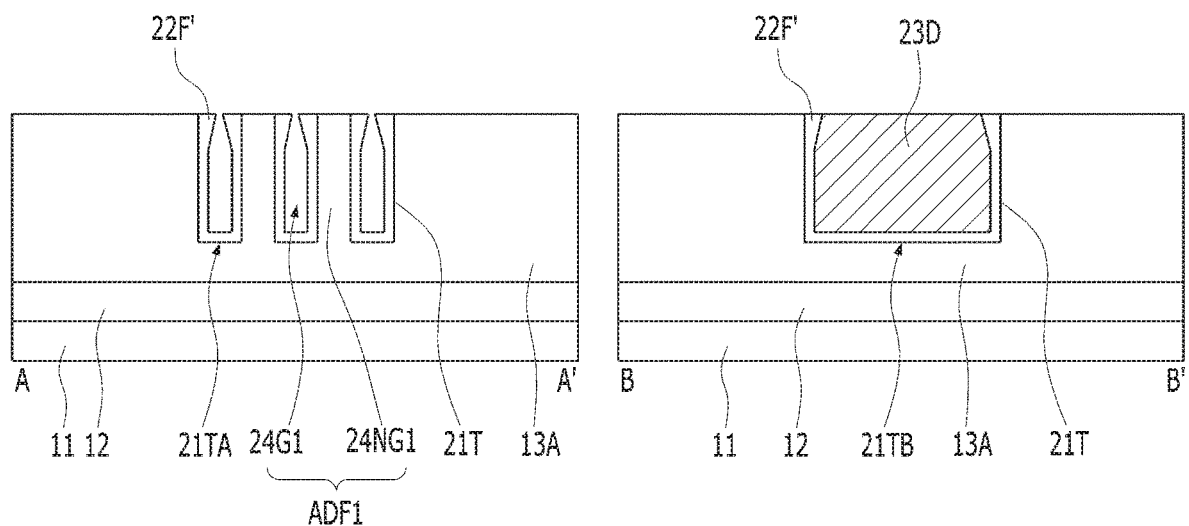

As shown in FIG. 16C, the first metal layer 23 may be planarized. Accordingly, the first air gaps 24G1 may be opened in the first portions 21TA of the dummy trenches 21T. After planarizing the first metal layer 23, the first barrier layer 22 may be removed from the top surface of the first interlayer dielectric layer 13A. Accordingly, a dummy barrier 22F' and a dummy metal layer 23D may remain in the second portion 21TB of the dummy trenches 21T. In the first portions 21TA of the dummy trenches 21T, dummy barriers 22F' may remain and the first metal layer 23 may not remain.

A plurality of first non-air gaps 24NG1 may be formed between the plurality of first air gaps 24G1. The plurality of first non-air gaps 24NG1 may be portions of the first interlayer dielectric layer 13A.

The plurality of first and second air gaps 24G1 and 24NG1 may form a first air dummy fuse ADF1. The first air dummy fuse ADF1 corresponds to the first air dummy fuse 706 of FIG. 10.

Figure 16D:
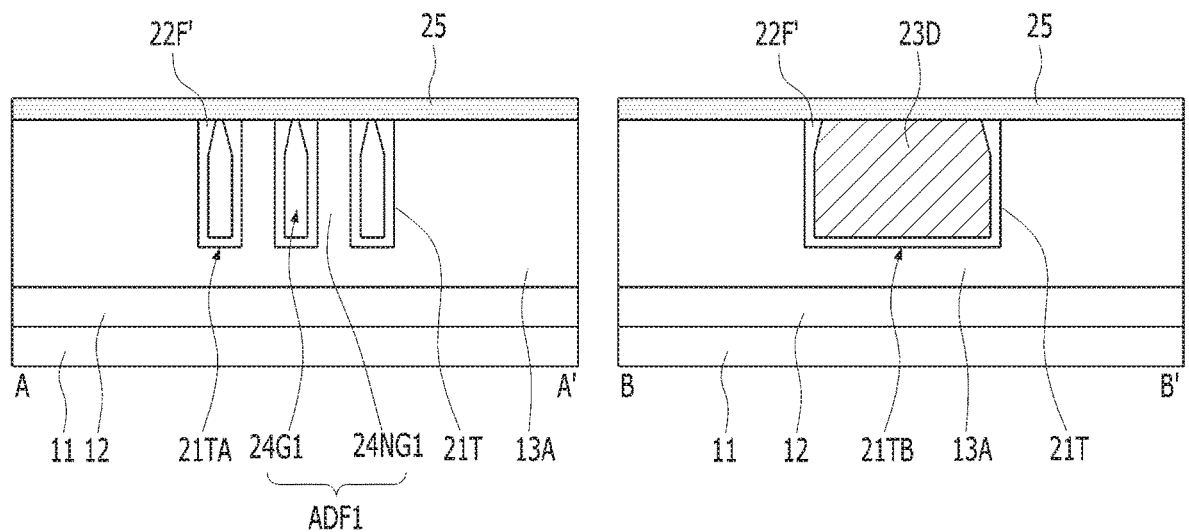

As shown in FIG. 16D, a first capping layer 25 may be formed. The first capping layer 25 may be formed on the first interlayer dielectric layer 13A including the first air dummy fuse ADF1. The first capping layer 25 may be or include, for example, a nitride. The top of the first air dummy fuse ADF1 may be closed by the first capping layer 25. The first capping layer 25 may cover tops of the first air gaps 24G1. The first capping layer 25 may serve as an etch stop layer which prevents the first air gaps 24G1 from being exposed during a subsequent process.

Figure 16E:
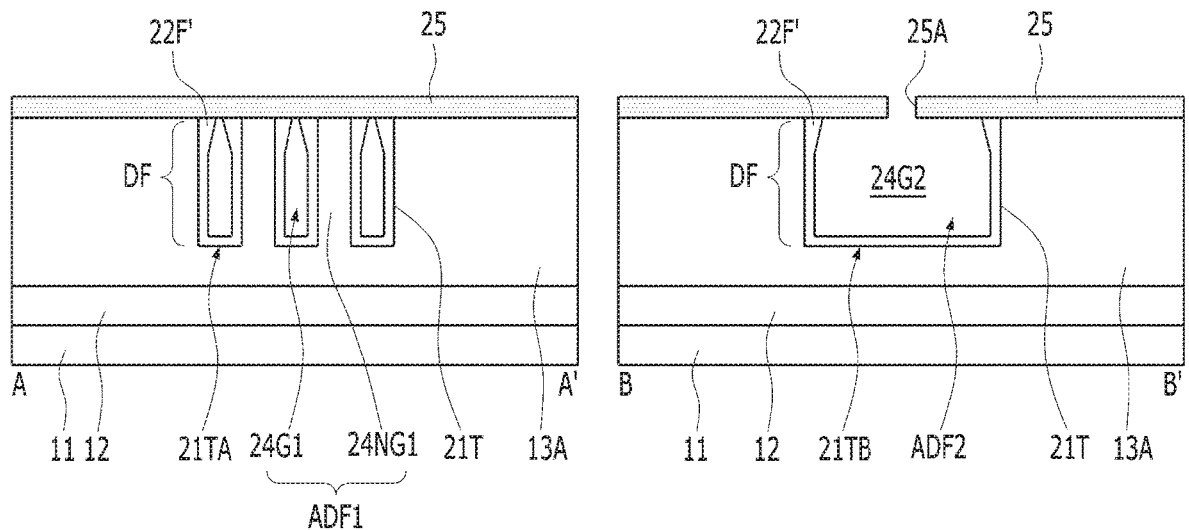

As shown in FIG. 16E, an opening 25A may be formed in the first capping layer 25. The size and position of the opening 25A may be adjusted to enhance the removal efficiency of the dummy metal layer 23D. The opening 25A may expose the central portion of the dummy metal layer 23D.

The dummy metal layer 23D may be removed. For removing the dummy metal layer 23D, wet etching may be applied, for example. For example, the dummy metal layer 23D may be removed by using an SC1 chemical. The SC1 chemical is a solution including ammonia ($NH_4OH$), hydrogen peroxide ($H_2O_2$) and water ($H_2O$) mixed at an appropriate ratio, as it is well known in the art. The space from which the dummy metal layer 23D is removed may remain as a second air gap 24G2.

The second air gap 24G2 may construct a second air dummy fuse ADF2.

In this way, the first and second air dummy fuses ADF1 and ADF2 may form a dummy fuse DF, and the dummy fuse DF may form a double-toothed, comp-like shape air dummy fuse.

Figure 16F:
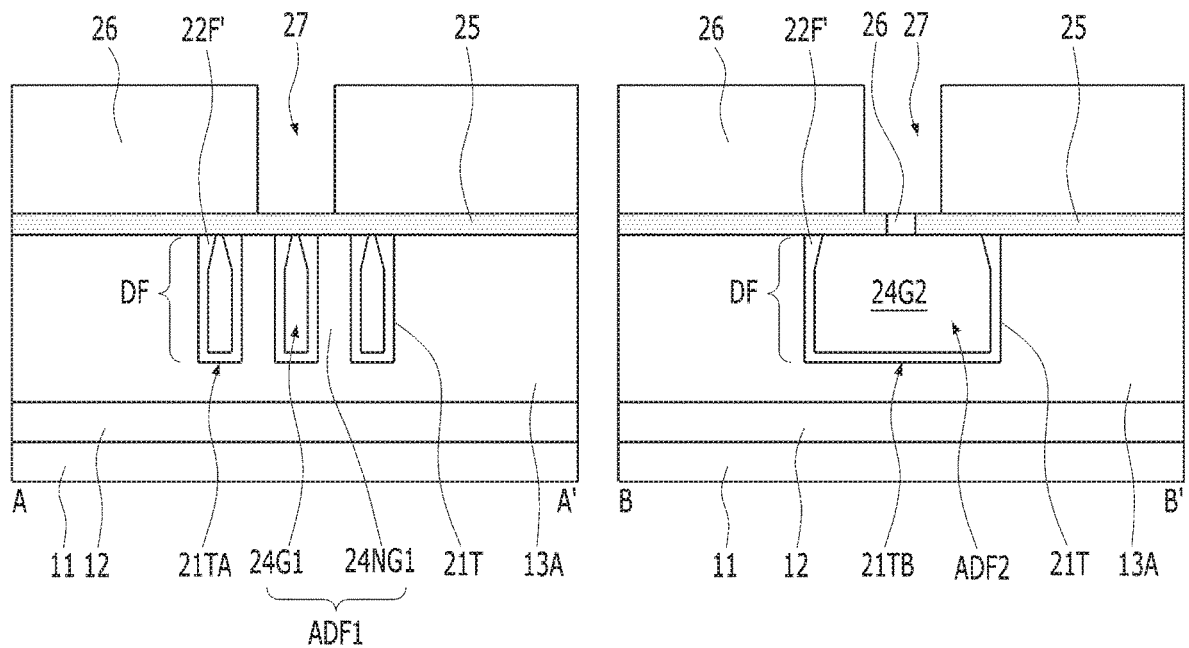

As shown in FIG. 16F, a second interlayer dielectric layer 26 may be formed on the first capping layer 25 including the second air dummy fuse ADF2. The second interlayer dielectric layer 26 may include a low-k material. The second interlayer dielectric layer 26 may include an ultra-low-k material. A portion of the second interlayer dielectric layer 26 may fill the opening 25A. Because the width of the opening 25A is narrow, the second air gap 24G2 is not filled with the second interlayer dielectric layer 26.

A fuse trench 27 may be formed. The fuse trench 27 may be formed, for example, by etching the second interlayer dielectric layer 26. The fuse trench 27 may be an elongated element extending in any one direction. The fuse trench 27 may be a single trench.

Figure 16G:
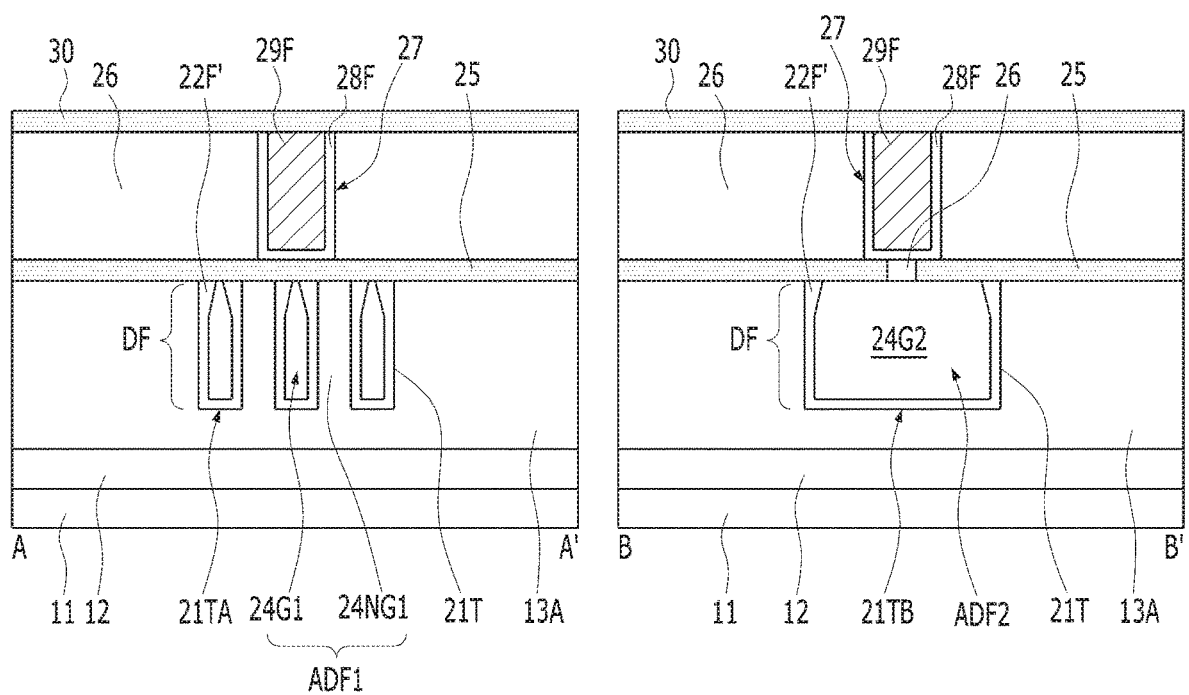

As shown in FIG. 16G, a fuse barrier 28F and a fusing line 29F may be formed in the fuse trench 27. The fusing line 29F and the fuse barrier 28F may be formed by depositing and then planarizing, for example, through CMP a second barrier layer and a second metal layer.

The fusing line 29F may partially or entirely overlap with the dummy fuse DF in the vertical direction. Therefore, the dummy fuse DF may be positioned at a lower level than the fusing line 29F.

Next, a second capping layer 3B may be formed on the fusing line 29F, the fuse barrier 28F and the second interlayer dielectric layer 26. The second capping layer 30 and the first capping layer 25 may be formed, for example, from the same material.

Figure 17A:
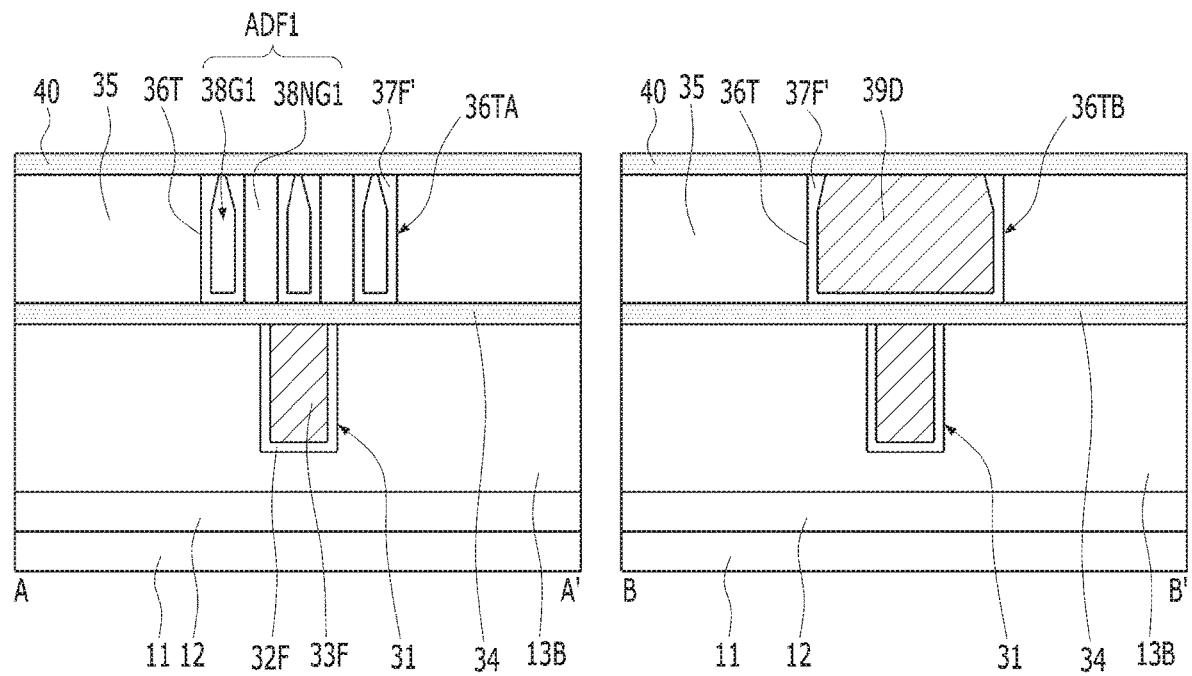
FIGS. 17A and 17B are views illustrating a method for manufacturing the fuse structure of FIG. 9.
Figure 17B:
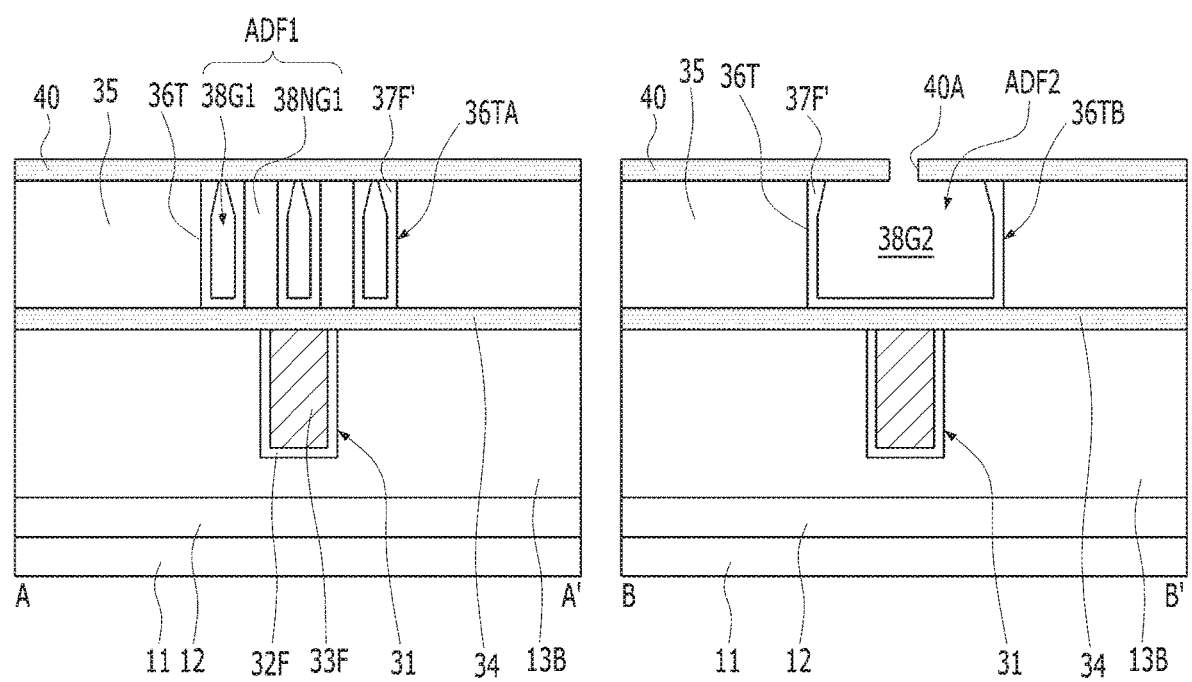

FIGS. 17A and 17B are views taken in correspondence to the lines A-A' and B-B' of FIG. 9 illustrating a method for manufacturing the fuse structure 600 of FIG. 9. The method of FIGS. 17A and 17B is similar to the method of FIGS. 14A and 14B.

As shown in FIG. 17A, an isolation layer 12 may be formed in a substrate 11. A first interlayer dielectric layer 13B may be formed on the substrate 11. The first interlayer dielectric layer 13B may include a low-k material. The first interlayer dielectric layer 13B may include an ultra-low-k material.

A fuse trench 31 may be formed. The fuse trench 31 may be formed, for example, by etching the first interlayer dielectric layer 13B. The fuse trench 31 may be an elongated element extending in any one direction, for example, in the Y direction. The fuse trench 31 may be a single trench.

A fuse barrier 32F and a fusing line 33F may be formed in the fuse trench 31. The fusing line 33F and the fuse barrier 32F may be formed by depositing and then planarizing, for example, through CMP a barrier layer and a metal layer. The fusing line 33F may be or include, for example, copper Next, a first capping layer 34 may be formed on the fusing line 33F, the fuse barrier 32F and the first interlayer dielectric layer 13B. The first capping layer 34 may be or include, for example, a nitride.

A second interlayer dielectric layer 35 may be formed on the first capping layer 34.

A plurality of dummy trenches 36T may be formed. The dummy trenches 36T may be formed, for example, by etching portions of the second interlayer dielectric layer 35. The dummy trenches 36T may be positioned over the fusing line 33F.

The dummy trenches 36T may include a plurality of first portions 36TA extending in the first direction Y (see FIG. 9). The plurality of first portions 36TA of the dummy trenches 36T may be spaced apart at a regular interval in the second direction X (see FIG. 9). The dummy trenches 36T may further include a second portion 36TB extending in the second direction X. The first and second portions 36TA and 36TB of the dummy trenches 36T may communicate with each other. The second portion 36TB of the dummy trenches 36T may have a width larger than the first portions 36TA. A plurality of pillars are not formed in the second portion 36TB of the dummy trenches 36T.

Dummy barriers 37F' and first air gaps 38G1 may be formed in the first portions 36TA of the dummy trenches 36T. A dummy barrier 37F' and a dummy metal layer 39D may be formed in the second portion 36TB of the dummy trenches 36T. The dummy barriers 37F', the first air gaps 38G1 and the dummy metal layer 39D may be formed by depositing and then planarizing, for example, through CMP a barrier layer and a metal layer. Therefore, an air gap is not formed in the second portion 36TB of the dummy trenches 36T. A plurality of first non-air gaps 38NG1 may be formed between the plurality of first air gaps 38G1. The first air and non-air gaps 38G1 and 38NG1 may form a first air dummy fuse ADF1. The first air dummy fuse ADF1 corresponds to the first air dummy fuse 606 of FIG. 9.

The first air dummy fuse ADF1 may be disposed at a level that is higher than the level of the fusing line 33F. The fusing line 33F may partially or entirely overlap with the first air dummy fuse ADF1 in the vertical direction.

Next, a second capping layer 40 may be formed on the second interlayer dielectric layer 35 including the first dummy fuse ADF1.

As shown in FIG. 17B, an opening 40A may be formed in the second capping layer 40. The size and position of the opening 40A may be adjusted to enhance the removal efficiency of the dummy metal layer 39D. The opening 40A may expose the central portion of the dummy metal layer 39D.

The dummy metal layer 39D may be removed. For removing the dummy metal layer 39D, wet etching may be applied, for example. For example, the dummy metal layer 39D may be removed by using an SC1 chemical. The SC1 chemical is a solution including ammonia ($NH_4OH$), hydrogen peroxide ($H_2O_2$) and water ($H_2O$) are mixed at an appropriate ratio. The space from which the dummy metal layer 39D is removed may remain as a second air gap 38G2.

The second air gap 38G2 may construct a second air dummy fuse ADF2. The second air dummy fuse ADF2 corresponds to the second air dummy fuse 607 of FIG. 9.

In this way, the first and second air dummy fuses ADF1 and ADF2 may form a dummy fuse DF, and the dummy fuse DF may form a double toothed comp-like shape air dummy fuse.

Figure 18A:
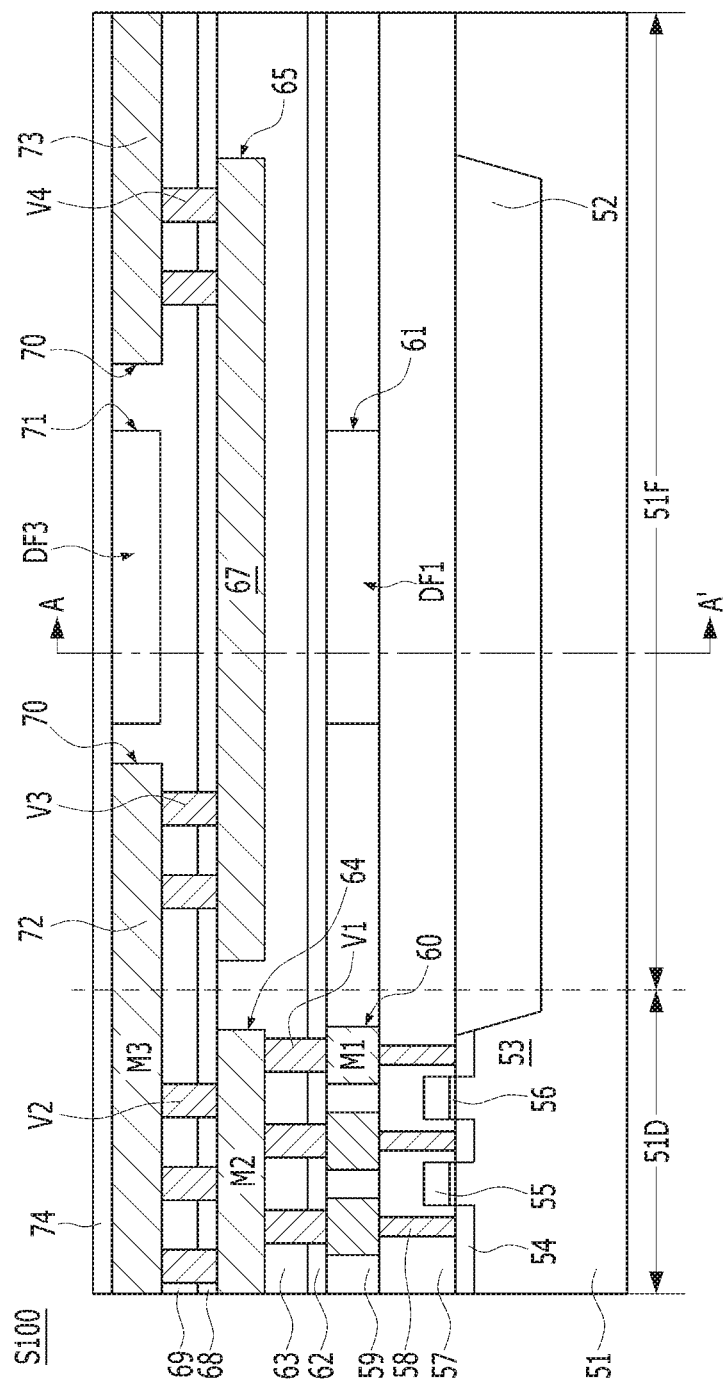
FIGS. 18A and 18B are views illustrating a semiconductor device including a fuse structure, according to embodiments of the present invention.
Figure 18B:
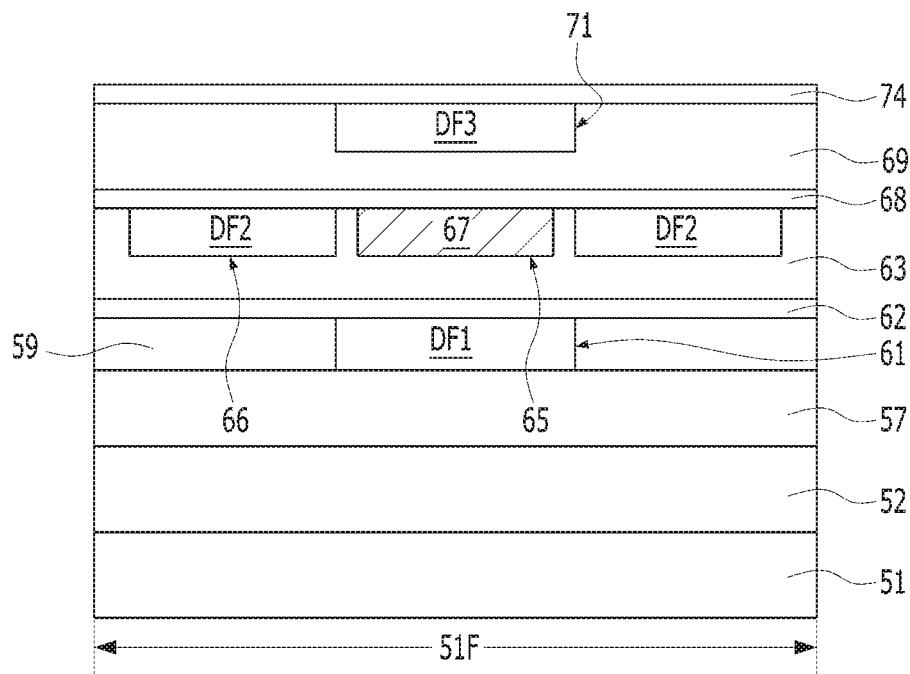

FIGS. 18A and 18B are views illustrating a semiconductor device including the fuse structures according to the embodiments of the present invention. FIG. 18B is a detailed view of a fuse region, taken along the line A-A' of FIG. 18A.

As shown in FIGS. 18A and 18B, a semiconductor device S100 may include multi-level metal lines M1 to M3 and multi-level dummy fuses DF1 to DF3. The semiconductor device S100 may further include a fusing line 67 and a plurality of transistors which are coupled to the fusing line 67.

A substrate 51 may include a driver region 51D and a fuse region 51F. Driving elements for driving the fuse of the fuse region 51F may be formed in the driver region 51D. For example, a gate array driver may be formed in the driver region 51D.

The multi-level metal lines M1 to M3 may be formed in the driver region 51D. For example, metal lines may include first metal lines M1, a second metal line M2, and a third metal line M3. The first and second metal lines M1 and M2 may be electrically coupled through first vias V1. The second and third metal lines M2 and M3 may be electrically coupled through second vias V2.

The fusing line 67 and the multi-level dummy fuses DF1 to DF3 may be formed in the fuse region 51F. The fusing line 67 and the multi-level dummy fuses DF1 to DF3 may be disposed over an isolation layer 52. For example, dummy fuses may include a first dummy fuse DF1, a second dummy fuse DF2, and a third dummy fuse DF3.

The first dummy fuse DF1 and the first metal lines M1 may be disposed at the same level. The first dummy fuse DF1 may be the dummy fuse 305 of FIGS. 6A and 6B. Accordingly, the first dummy fuse DF1 may include the first and second air dummy fuses 306 and 307. The first air dummy fuse 306 may include the plurality of first air and non-air gaps G1 and NG1. The second air dummy fuse 307 may include the second air and non-air gaps G2 and NG2. In another embodiment, the first dummy fuse DF1 may be the dummy fuse 705 of FIG. 10. Accordingly, the first dummy fuse DF1 may include the first and second air dummy fuses 706 and 707. The first air dummy fuse 706 may include the plurality of first air and non-air gaps G1 and NG1. The second air dummy fuse 707 may include the second air gap G2.

The fusing line 67, the second dummy fuse DF2 and the second metal line M2 may be disposed at the same level. The second dummy fuse DF2 may be the dummy fuse 105 of FIGS. 4A and 4B. Accordingly, the second dummy fuse DF2 may include the first and second air dummy fuses 106 and 107. The first air dummy fuse 106 may include the plurality of first air and non-air gaps G1 and NG1. The second air dummy fuse 107 may include the second air and non-air gaps G2 and NG2. In another embodiment, the second dummy fuse DF2 may be the dummy fuse 505 of FIG. 8. Accordingly, the second dummy fuse DF2 may include the first and second air dummy fuses 506 and 507. The first air dummy fuse 506 may include the plurality of first air and non-air gaps G1 and NG1. The second air dummy fuse 507 may include the second air gap G2.

The third dummy fuse DF3 and the third metal line M3 may be disposed at the same level. The third dummy fuse DF3 may be the dummy fuse 205 of FIGS. 5A and 5B. Accordingly, the third dummy fuse DF3 may include the first and second air dummy fuses 206 and 207. The first air dummy fuse 206 may include the plurality of first air and non-air gaps G1 and NG1. The second air dummy fuse 207 may include the second air and non-air gap G2 and NG2. In another embodiment, the third dummy fuse DF3 may be the dummy fuse 605 of FIG. 9. Accordingly, the third dummy fuse DF3 may include the first and second air dummy fuses 606 and 607. The first air dummy fuse 606 may include the plurality of first air and non-air gaps G1 and NG1. The second air dummy fuse 607 may include the second air gap G2.

The second dummy fuse DF2 may be disposed at the same level as the fusing line 67 on both sides of the fusing line 67. The first dummy fuse DF1 may be disposed at a lower level than the fusing line 67, and the first dummy fuse DF1 and the fusing line 67 may partially or entirely overlap with each other in the vertical direction. The third dummy fuse DF3 may be disposed at a higher level than the fusing line 67, and the third dummy fuse DF3 and the fusing line 67 may partially or entirely overlap with each other in the vertical direction.

Portions, that is, extensions, of the third metal line M3 may serve as a cathode electrode 72 and an anode electrode 73. The cathode electrode 72 and the anode electrode 73 may be coupled to both ends of the fusing line 67 through third vias V3 and fourth vias V4, respectively. As shown in the above-described embodiments, the fusing line 67 may include the first portion F1, the second portion F2 and the central portion FC.

The substrate 51 may be a material that is appropriate for semiconductor processing. The substrate 51 may be or include a semiconductor substrate. The substrate 51 may be formed of a silicon-containing material. The substrate 51 may be or include silicon, monocrystalline silicon, polysilicon, amorphous silicon, silicon germanium, monocrystalline silicon germanium, polycrystalline silicon germanium, carbon-doped silicon, a combination thereof, or a multi-layer thereof. The substrate 51 may include another semiconductor material such as, germanium. The substrate 51 may include a III/V group semiconductor substrate. The substrate 51 may be or include, for example, a compound semiconductor substrate, such as, gallium arsenide (GaAs). The substrate 51 may include a silicon-on-insulator (SOI) substrate.

The isolation layer 52 that defines an active region 53 may be formed in the substrate 51. The isolation layer 52 may be an STI region. The isolation layer 52 may be formed by filling a dielectric material in a shallow trench, for example, an isolation trench. The isolation layer 52 may include a silicon oxide, a silicon nitride or a combination thereof. The active region 53 may be formed in the driver region 51D. The isolation layer 52 may be formed in the fuse region 51F.

A plurality of driving elements may be formed in the driver region 51D. In the present embodiment, the driving elements may include transistors. In another embodiment, the driving elements may include other elements capable of serving as switches. The driving elements may include MOSFETs. The driving elements may include transistors, such as, FINFETs. Each of the driving elements may include source/drain regions 54 and a gate electrode 55. The source/drain regions 54 may be formed in the active region 53. The gate electrode 55 may be formed on the active region 53 between the source/drain regions 54. Each driving element may further include a gate dielectric layer 56. The gate dielectric layer 56 may be formed between the gate electrode 55 and the active region 53. While not shown, each driving element may further include gate spacers which are formed on both sidewalls of the gate electrode 55. The gate dielectric layer 56 may include a silicon oxide, a silicon nitride, a silicon oxynitride, a high-k material or a combination thereof. A high-k material may include a material that has a dielectric constant higher than the dielectric constant of a silicon oxide. For example, a high-k material may include a material that has a dielectric constant higher than 3.9. For another example, a high-k material may include a material that has a dielectric constant higher than 10. For still another example, a high-k material may include a material that has a dielectric constant of 10 to 70. A high-k material may include at least one metallic element. A high-k material may include a hafnium-containing material. A hafnium-containing material may include a hafnium oxide, a hafnium silicon oxide, a hafnium silicon oxynitride or a combination thereof. In another embodiment, a high-k material may include a lanthanum oxide, a lanthanum aluminum oxide, a zirconium oxide, a zirconium silicon oxide, a zirconium silicon oxynitride, an aluminum oxide or a combination thereof. As a high-k material, other high-k materials known in the art may be selectively used. The gate electrode 55 may include polysilicon, a metal, a metal silicide or a combination thereof. The source/drain regions 54 may be regions which are doped with a conductivity type dopant. For example, a conductivity type dopant may include phosphorus (P), arsenic (As), antimony (Sb) or boron (B).

A first interlayer dielectric layer 57 may be formed on the substrate 51 which is formed with the driving elements. The first interlayer dielectric layer 57 may include a low-k material. The first interlayer dielectric layer 57 may cover both the driver region 51D and the fuse region 51F.

Contact plugs 58 may be formed in the first interlayer dielectric layer 57. The contact plugs 58 may be filled in contact holes. For example, contact holes that expose source/drain regions 54 may be formed, for example, by etching portions of the first interlayer dielectric layer 57. Next, by filling a metal layer in the contact holes and then performing planarization such as CMP, the contact plugs 58 may be formed. The contact plugs 58 may include, for example, tungsten. In another embodiment, the contact plugs 58 may further include a barrier layer. The barrier layer may be or include, for example, titanium, a titanium nitride or a combination thereof. The barrier layer may be conformally formed before forming a tungsten layer. The contact plugs 58 may be formed in the driver region 51D.

A second interlayer dielectric layer 59 may be formed on the first interlayer dielectric layer 57 which is formed with the contact plugs 58. The second interlayer dielectric layer 59 may include a low-k material. The second interlayer dielectric layer 59 may include an ultra-low-k (ULK) material.

First trenches 60 may be formed. The first trenches 60 may be formed, for example, by etching the second interlayer dielectric layer 59. The contact plugs 58 may be exposed by the first trenches 60. The first trenches 60 may be elongated elements extending in any one direction, for example, the first Y direction. The first trenches 60 may be formed in the driver region 51D. A plurality of first trenches 60 may be formed.

First dummy trenches 61 may be formed. The first dummy trenches 61 may be formed at the same time when forming the first trenches 60 or after forming the first trenches 60. The first dummy trenches 61 may be formed, for example, by etching portions of the second interlayer dielectric layer 59. The first dummy trenches 61 may be formed in the fuse region 51F. The first dummy trenches 61 and the first trenches 60 may have different widths. The first trenches 60 and the first dummy trenches 61 may be disposed at the same level. The first trenches 60 and the first dummy trenches 61 may have the same depth. The first trenches 60 may be formed in the driver region 51D, and the first dummy trenches 61 may be formed in the fuse region 51F.

The first metal lines M1 may be formed in the first trenches 60. The first dummy fuse DF1 may be formed in the first dummy trenches 61. The first metal lines M1 and the first dummy fuse DF1 may be disposed at the same level. In this way, the first dummy fuse DF1 may be formed at the level of the first metal lines M1.

A first capping layer 62 may be formed. The first capping layer 62 may be formed on the second interlayer dielectric layer 59 including the first metal lines M1 and the first dummy fuse DF1. The top of the first dummy fuse DF1 may be closed by the first capping layer 62.

A third interlayer dielectric layer 63 may be formed on the first capping layer 62. The third interlayer dielectric layer 63 may include a low-k material. The third interlayer dielectric layer 63 may include an ultra-low-k material.

A second trench 64, a fuse trench 65 and second dummy trenches 66 may be formed. The second trench 64, the fuse trench 65 and the second dummy trenches 66 may be formed, for example, by etching the third interlayer dielectric layer 63. The second trench 64 may be formed in the driver region 51D, and the fuse trench 65 and the second dummy trenches 66 may be formed in the fuse region 51F.

The second metal line M2 may be formed in the second trench 64. The fusing line 67 may be formed in the fuse trench 65. The second dummy fuse DF2 may be formed in the second dummy trenches 66. The second metal line M2, the fusing line 67 and the second dummy fuse DF2 may be disposed at the same level. In this way, the fusing line 67 and the second dummy fuse DF2 may be formed at the level of the second metal line M2.

Meanwhile, via holes may be additionally formed under the second trench 64, and the first vias V1 may be formed in the via holes.

A second capping layer 68 may be formed. The second capping layer 68 may be formed on the third interlayer dielectric layer 63 including the second metal line M2, the fusing line 67 and the second dummy fuse DF2. The top of the second dummy fuse DF2 may be closed by employing the second capping layer 68. The first and second metal lines M1 and M2 may be electrically coupled through the first vias V1. For example, the third metal line M3 and the second vias V2 may be formed by a dual damascene process. The dual damascene process is as follows. Vias holes and a trench may be first formed, and then, vias and a metal line may be concurrently formed by gapfilling and then planarizing, for example, through CMP a metal layer. The dual damascene process may be realized by a via-first process. The dual damascene process may be realized by a trench-first process.

A fourth interlayer dielectric layer 69 may be formed on the second capping layer 68. The fourth interlayer dielectric layer 69 may include a low-k material. The fourth interlayer dielectric layer 69 may include an ultra-low-k material.

A third trench 70 and third dummy trenches 71 may be formed. The third trench 70 and the third dummy trenches 71 may be formed, for example, by etching the fourth interlayer dielectric layer 69. The third trench 70 may be formed in the driver region 51D, and the third dummy trenches 71 may be formed in the fuse region 51F.

The third metal line M3 may be formed in the third trench 70. The third dummy fuse DF3 may be formed in the third dummy trenches 71. The third metal line M3 and the third dummy fuse DF3 may be disposed at the same level. In this way, the third dummy fuse DF3 may be formed at the level of the third metal line M3.

Meanwhile, via holes may be additionally formed under the third trench 70, and the second vias V2 may be formed in the via holes. For example, the third metal line M3 and the second vias V2 may be formed, for example, by the dual damascene process. The second metal lines M2 and the third metal line M3 may be electrically coupled through the second vias V2.

Portions of the third metal line M3 may serve as the cathode electrode 72 and the anode electrode 73 which are coupled to both ends of the fusing line 67. The fusing line 67 and the cathode electrode 72 may be electrically coupled through the third vias V3. The fusing line 67 and the anode electrode 73 may be electrically coupled through the fourth vias V4. The second vias V2, the third vias V3 and the fourth vias V4 may be formed, for example, from the same material and be formed concurrently. The cathode electrode 72 and the third vias V3 may be formed, for example, by the dual damascene process. The anode electrode 73 and the fourth vias V4 may be formed, for example, by the dual damascene process.

A third capping layer 74 may be formed. The third capping layer 74 may be formed on the fourth interlayer dielectric layer 69 including the third metal line M3, the third dummy fuse DF3, the cathode electrode 72 and the anode electrode 73. The top of the third dummy fuse DF3 may be closed by the third capping layer 74.

The semiconductor device S100 of FIGS. 18A and 18B includes the first to third dummy fuses DF1 to DF3. That is to say, the semiconductor device S100 includes multi-level dummy fuses. In another embodiment, a semiconductor device may include a single level dummy fuse selected among the first to third dummy fuses DF1 to DF3. In still another embodiment, a semiconductor device may include dual level dummy fuses selected among the first to third dummy fuses DF1 to DF3.

FIGS. 19A to 19G are examples of views illustrating a method for manufacturing the semiconductor device of FIGS. 18A and 18B. Hereinbelow, detailed descriptions will be made for a method for manufacturing the metal lines M1 to M3, the fusing line 67 and the dummy fuses DF1 to DF3 except for the driving elements. A method for manufacturing the first dummy fuse DF1 will be described with reference to FIGS. 13A to 13F. A method for manufacturing the second dummy fuse DF2 and the fusing line 67 will be described with reference to FIGS. 12A to 12D. A method for manufacturing the third dummy fuse DF3 will be described with reference to FIGS. 14A and 14B.

First, a second interlayer dielectric layer 59 may be formed on a first interlayer dielectric layer 57 which is formed with transistors and contact plugs 58 (see FIG. 18A).

Figure 19A:
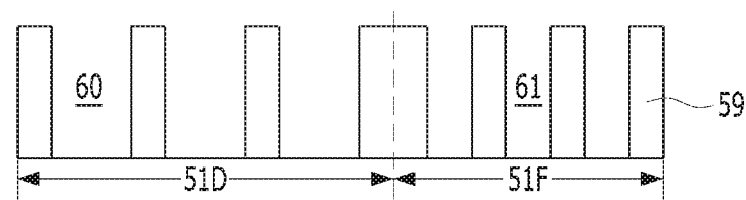
FIGS. 19A to 19G are views illustrating a method for manufacturing the semiconductor device of FIGS. 18A and 18B.

As shown in FIG. 19A, a plurality of first trenches 60 and a plurality of first dummy trenches 61 may be formed in the second interlayer dielectric layer 59. The first trenches 60 may be formed in a driver region 51D, and the first dummy trenches 61 may be formed in a fuse region 51F. The first trenches 60 and the first dummy trenches 61 may be formed, for example, by etching portions of the second interlayer dielectric layer 59. The first dummy trenches 61 correspond to the dummy trenches 21 of FIG. 13A.

Figure 19B:
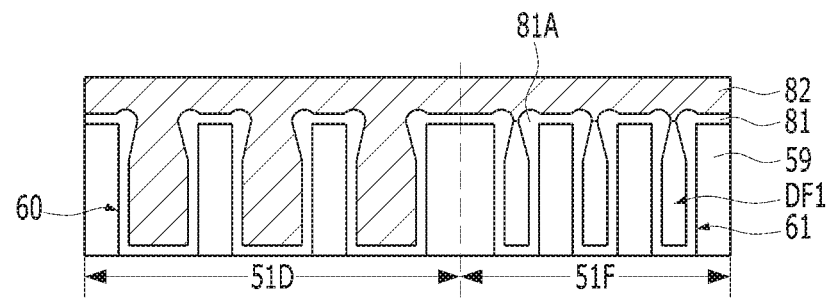

As shown in FIG. 19B, a first barrier layer 81 may be formed. The first barrier layer 81 may be formed on the first trenches 60 and the first dummy trenches 61 while having overhangs 81A. The first barrier layer 81 may be or include, for example, titanium, a titanium nitride, a tungsten nitride or a combination thereof. The first barrier layer 81 may be formed, for example, by physical vapor deposition (PVD). In the case of using physical vapor deposition, the first barrier layer 81 may have poor step coverage. Therefore, as the first barrier layer 81 is deposited in excess on top edges of the first dummy trenches 61, and the overhangs 81A may be formed.

A first metal layer 82 may be formed on the first barrier layer 81. The first metal layer 82 may fill the first trenches 60 without a void. While portions of the first metal layer 82 may be formed in the first dummy trenches 61, the metal layer does not fill the first dummy trenches 61 because the widths of the first dummy trenches 61 are narrow, insides of the first dummy trenches 61 may remain empty to be a first dummy fuse DF1 when forming the first metal layer 82. The entrances of the first dummy fuse DF1 may be capped by the first metal layer 82. The first metal layer 82 may be or include, for example, copper. The first metal layer 82 may be formed, for example, by electroplating.

Figure 19C:
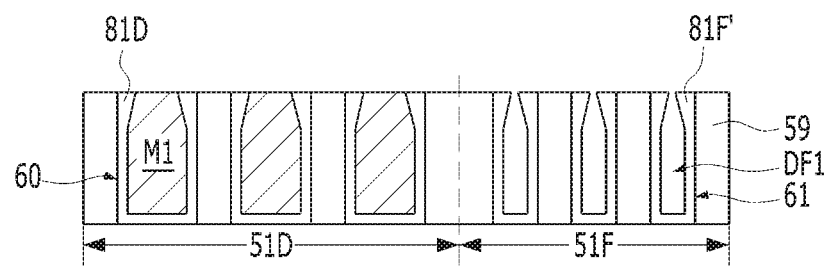

As shown in FIG. 19C, the first metal layer 82 may be planarized. Accordingly, first metal lines M1 may be formed in the first trenches 60. Subsequently, the first barrier layer 81 may be planarized, and accordingly, first barriers 81D may be formed in the first trenches 60. The first dummy fuse DF1 may be opened in the first dummy trenches 61, and first dummy barriers 81F' may be formed on the bottoms and sidewalls of the first dummy trenches 61. The top of the first dummy fuse DF1 may be opened. In order to form the first metal lines M1, the first metal layer 82 may be removed from the top surface of the second interlayer dielectric layer 59. In order to form the first barriers 81D and the first dummy barriers 81F', the first barrier layer 81 may be removed from the top surface of the second interlayer dielectric layer 59.

The first dummy fuse DF1 corresponds to the dummy fuse DF of FIG. 13C. Accordingly, the first dummy fuse DF1 may include the first and second air dummy fuses ADF1 and ADF2.

Figure 19D:
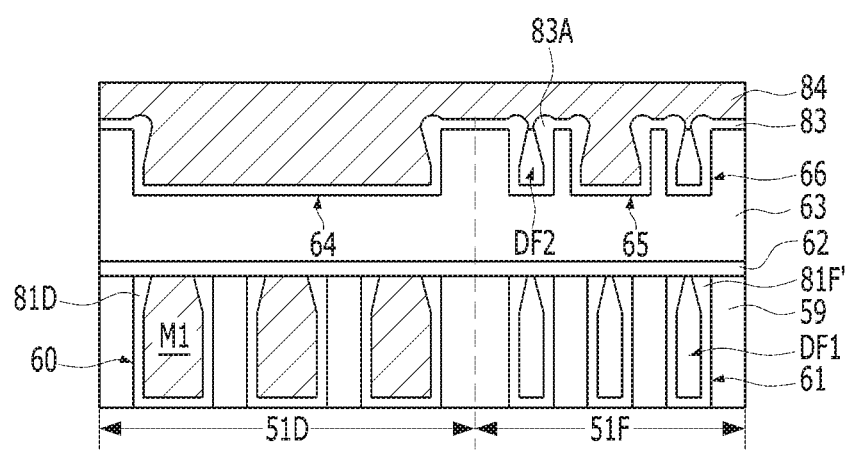

As shown in FIG. 19D, a first capping layer 62 may be formed. The first capping layer 62 may be formed on the second interlayer dielectric layer 59 including the first metal lines M1 and the first dummy fuse DF1. The first capping layer 62 may be or include, for example, a nitride. The top of the first dummy fuse DF1 may be closed by the first capping layer 62.

A third interlayer dielectric layer 63 may be formed on the first capping layer 62. The third interlayer dielectric layer 63 may include a low-k material. The third interlayer dielectric layer 63 may include an ultra-low-k material.

A second trench 64, a fuse trench 65 and second dummy trenches 66 may be formed. The second trench 64, the fuse trench 65 and the second dummy trenches 66 may be formed, for example, by etching the third interlayer dielectric layer 63. The second trench 64 may be formed in the driver region 51D, and the fuse trench 65 and the second dummy trenches 66 may be formed in the fuse region 51F. The fuse trench 65 and the second dummy trenches 66 correspond to the fuse trench 14 and the dummy trenches 15 of FIG. 12A.

A second barrier layer 83 may be formed. The second barrier layer 83 may be formed on the second trench 64, the fuse trench 65 and the second dummy trenches 66 while having overhangs 83A. The second barrier layer 83 may be or include, for example, titanium, a titanium nitride, a tungsten nitride or a combination thereof. The second barrier layer 83 may be formed, for example, by physical vapor deposition (PVD). In the case of using physical vapor deposition, the second barrier layer 83 may have poor step coverage. Therefore, as the second barrier layer 83 is deposited in excess on top edges of the second dummy trenches 66, the overhangs 83A may be formed.

A second metal layer 84 may be formed on the second barrier layer 83. The second metal layer 84 may fill the second trench 64 and the fuse trench 65 without a void. While portions of the second metal layer 84 may be formed in the second dummy trenches 66, metal layer does not fill the second dummy trenches 66 because the widths of the second dummy trenches 66 are narrow, insides of the second dummy trenches 66 may remain empty to be a second dummy fuse DF2 when forming the second metal layer 84. The entrances of the second dummy fuse DF2 may be capped by employing the second metal layer 84. The second metal layer 84 may be or include, for example, copper. The second metal layer 84 may be formed, for example, by electroplating.

Figure 19E:
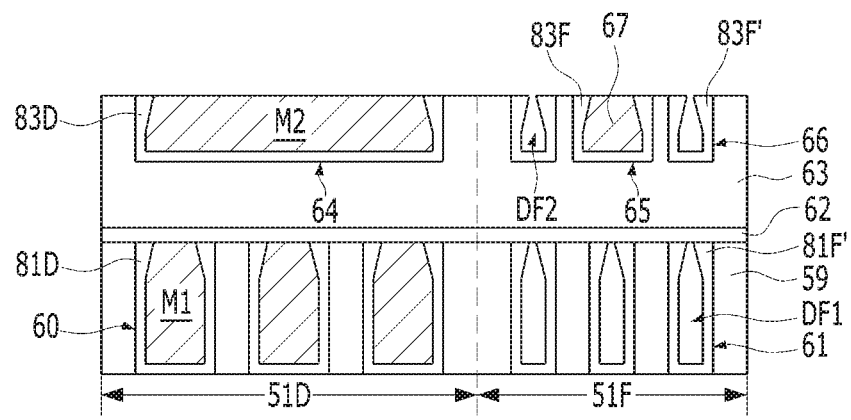

As shown in FIG. 19E, the second metal layer 84 may be planarized. Accordingly, a second metal line M2 may be formed in the second trench 64. Subsequently, the second barrier layer 83 may be planarized, and accordingly, a second barrier 83D may be formed in the second trench 64. A fusing line 67 and a fuse barrier 83F may be formed in the fuse trench 65. The second dummy fuse DF2 may be opened in the second dummy trenches 66, and second dummy barriers 83F' may be formed on the bottoms and sidewalls of the second dummy trenches 66. The top of the second dummy fuse DF2 may be opened. In order to form the second metal line M2, the second metal layer 84 may be removed from the top surface of the third interlayer dielectric layer 63. In order to form the second barrier 83D, the fuse barrier 83F and the second dummy barriers 83F', the second barrier layer 83 may be removed from the top surface of the third interlayer dielectric layer 63. While not shown, referring again to FIG. 18A, the second metal line M2 and the first metal lines M1 may be electrically coupled through first vias V1. The first vias V1 may be formed before forming the second trench 64. Otherwise, via holes may be formed at the same time when forming the second trench 64, and the second metal layer 84 may fill the via holes when forming the second metal line M2. This way, the first vias V1 may be formed by employing the second metal layer 84.

The second dummy fuse DF2 corresponds to the dummy fuse DF of FIG. 12C. Accordingly, the second dummy fuse DF2 may include the first and second air dummy fuses ADF1 and ADF2.

Figure 19F:
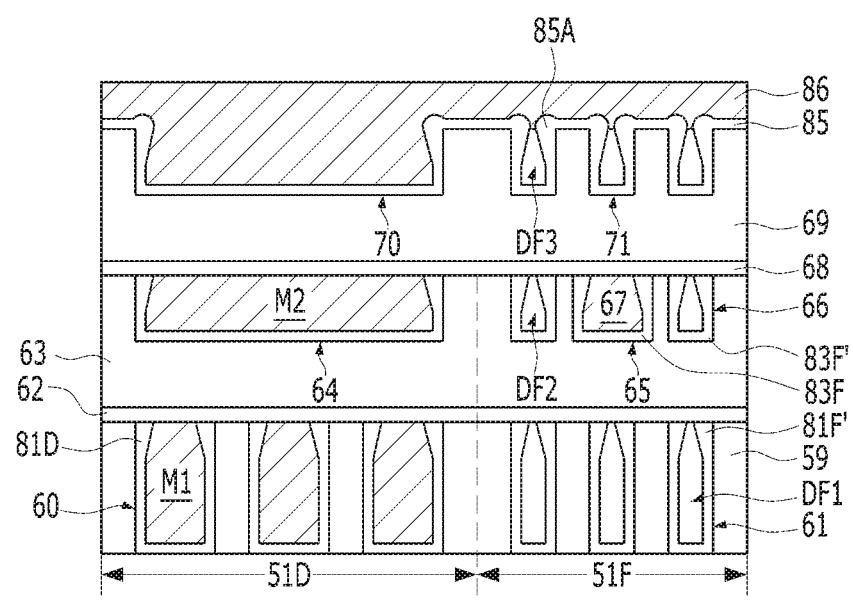

As shown in FIG. 19F, a second capping layer 68 may be formed. The second capping layer 68 may be formed on the third interlayer dielectric layer 63 including the second metal line M2, the fusing line 67 and the second dummy fuse DF2. The second capping layer 68 may be or include, for example, a nitride. The top of the second dummy fuse DF2 may be closed by employing the second capping layer 68.

A fourth interlayer dielectric layer 69 may be formed on the second capping layer 68. The fourth interlayer dielectric layer 69 may include a low-k material. The fourth interlayer dielectric layer 69 may include an ultra-low-k material.

A third trench 70 and third dummy trenches 71 may be formed in the fourth interlayer dielectric layer 69. The third trench 70 may be formed in the driver region 51D, and the third dummy trenches 71 may be formed in the fuse region 51F. The third trench 70 and the third dummy trenches 71 may be formed, for example, by etching portions of the fourth interlayer dielectric layer 69. When viewed from the top, the third dummy trenches 71 may be an S shape (see FIGS. 5A and 5B) or a T shape (see FIG. 9). The third dummy trenches 71 correspond to the dummy trenches 36 of FIG. 14B. Accordingly, the third dummy trenches 71 may include the first and second portions 36A and 36B.

A third barrier layer 85 may be formed. The third barrier layer 85 may be formed on the third trench 70 and the third dummy trenches 71 while having overhangs 85A. The third barrier layer 85 may be or include, for example, titanium, a titanium nitride, a tungsten nitride or a combination thereof. The third barrier layer 85 may be formed, for example, by physical vapor deposition (PVD). In the case of using physical vapor deposition, the third barrier layer 85 may have poor step coverage. Therefore, as the third barrier layer 85 is deposited in excess on top edges of the third dummy trenches 71, and the overhangs 85A may be formed.

A third metal layer 86 may be formed on the third barrier layer 85. The third metal layer 86 may fill the third trench 70 without a void. While portions of the third metal layer 86 may be formed in the third dummy trenches 71, the metal layer does not fill the third dummy trenches 71 because the widths of the third dummy trenches 71 are narrow, insides of the third dummy trenches 71 may remain empty to be a third dummy fuse DF3 when forming the third metal layer 86. The entrances of the third dummy fuse DF3 may be capped by the third metal layer 86. The third metal layer 86 may be or include, for example, copper. The third metal layer 86 may be formed, for example, by electroplating.

The third dummy fuse DF3 corresponds to the dummy fuse DF of FIG. 14B. Accordingly, the third dummy fuse DF3 may include the first and second air dummy fuses ADF1 and ADF2.

Figure 19G:
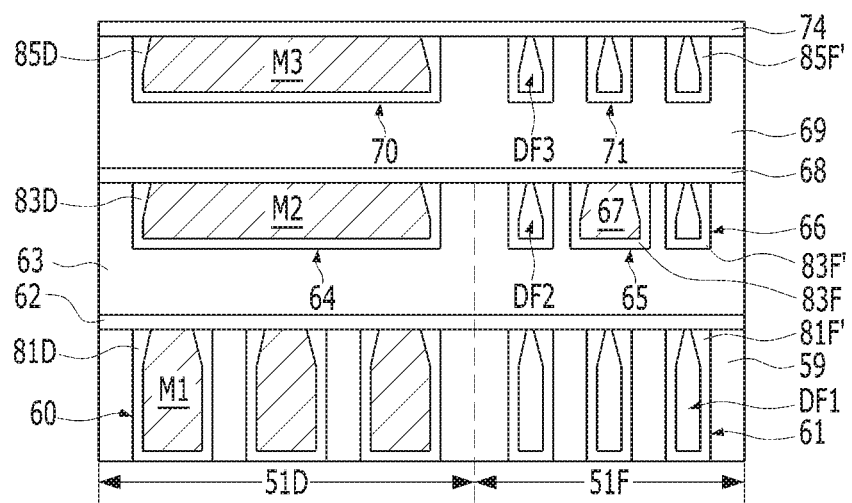

As shown in FIG. 19G, the third metal layer 86 may be planarized. Accordingly, a third metal line M3 may be formed in the third trench 70. Subsequently, the third barrier layer 85 may be planarized, and accordingly, a third barrier 85D may be formed in the third trench 70. The third dummy fuse DF3 may be opened in the third dummy trenches 71, and third dummy barriers 85F' may be formed on the bottoms and sidewalls of the third dummy trenches 71. The top of the third dummy fuse DF3 may be opened. In order to form the third metal line M3, the third metal layer 86 may be removed from the top surface of the fourth interlayer dielectric layer 69. In order to form the third barrier 85D and the third dummy barriers 85F', the third barrier layer 85 may be removed from the top surface of the fourth interlayer dielectric layer 69. While not shown, referring again to FIG. 18A, portions, that is, extensions, of the third metal line M3 may serve as the cathode electrode 72 and the anode electrode 73. The cathode electrode 72 and the anode electrode 73 may be coupled to both ends of the fusing line 67 through the third vias V3 and the fourth vias V4, respectively. The third vias V3 and the fourth vias V4 may be formed before forming the third trench 70. Otherwise, via holes may be formed at the same time when forming the third trench 70, and the third metal layer 86 may fill the via holes when forming the third metal line M3. By this fact, the third vias V3 and the fourth vias V4 may be formed by the third metal layer 86. The second and third metal lines M2 and M3 may be electrically coupled through the second vias V2. The second vias V2 may be formed before forming the third trench 70. Otherwise, via holes may be formed at the same time when forming the third trench 70, and the third metal layer 86 may fill the via holes when forming the third metal line M3. By this fact, the second vias V2 may be formed by the third metal layer 86. The second vias V2, the third vias V3 and the fourth vias V4 may be formed concurrently.

A third capping layer 74 may be formed. The third capping layer 74 may be formed on the fourth interlayer dielectric layer 69 including the third metal line M3 and the third dummy fuse DF3. The third capping layer 74 may be or include, for example, a nitride. The top of the third dummy fuse DF3 may be closed by the third capping layer 74.

The fuse structures 500, 600, 700 and 800 according to the fifth to eighth embodiments may be formed in a back end of line (BEOL) process. For a semiconductor device including the fuse structures 500, 600, 700 and 800 according to the fifth to eighth embodiments and a method for manufacturing the same, reference may be made to FIGS. 19A to 19G. Further, for a method for removing dummy metal layers, reference may be made to FIGS. 15A to 15E, 16A to 16G, and 17A and 17B.

Since the present technology adds an air dummy fuse to a copper e-fuse, characteristics of a semiconductor device may be improved, and the following effects may be achieved.

The present technology may obtain stable cutting yield of fuses. A cutting condition harder than a standard cutting condition may be used in consideration of the state of a wafer, and due to this fact, damage to not only e-fuses but also surroundings of the e-fuses may be prevented, whereby stable cutting yield may be secured.

The present technology may control Joule heating. When an air dummy fuse is used, since a speed at which Joule heating diffuses may be decreased due to low heat conductivity of air, stable cutting yield may be secured at a low voltage condition.

The present technology may substantially prevent damage to and crack formation of an interlayer dielectric layer. Because the air dummy fuse provides a space for volume expansion, damage to the interlayer dielectric layer may be substantially prevented. Also, even though a crack occurs, since the air dummy fuse serves as a stopper, damage to the interlayer dielectric layer may be minimized.

Although various embodiments have been described for illustrative purposes, it will be apparent to those skilled in the art that various changes and modifications may be made without departing from the spirit and scope of the invention as defined in the following claims.

What is claimed is:

1. A semiconductor device comprising:
a fuse structure; and
a transistor coupled to any one portion of the fuse structure,
wherein the fuse structure comprises:
a fusing line including a first portion, a second portion, and a central portion between the first portion and the second portion;
a dummy fuse neighboring the fusing line, and
wherein the dummy fuse comprising:
a first air dummy fuse including a plurality of first air gaps extending in a first direction parallel to the fusing line; and
a second air dummy fuse including a second air gap extending in a second direction crossing the fusing line.

2. The semiconductor device of claim 1,
further comprising:
a first metal line formed over the transistor;
a second metal line formed over the first metal line; and
a third metal line formed over the second metal line,
wherein the first metal line and the second metal line are coupled through a first via, the second metal line and the third metal line are coupled through a second via, and the transistor and the first metal line are coupled through a contact plug.

3. The semiconductor device of claim 2, wherein the dummy fuse is disposed at the same level as the fusing line and the second metal line, and is disposed on both sides of the fusing line.

4. The semiconductor device of claim 2, wherein the dummy fuse disposed at the same level as the first metal line is disposed under the fusing line, and overlaps with the fusing line in a vertical direction.

5. The semiconductor device of claim 2, wherein the dummy fuse disposed at the same level as the third metal line is disposed over the fusing line, and overlaps with the fusing line in a vertical direction.

6. The semiconductor device of claim 2, wherein the dummy fuse comprises:
a first dummy fuse which is disposed at the same level as the first metal line;
a second dummy fuse which is disposed at the same level as the second metal line and the fusing line; and
a third dummy fuse which is disposed at the same level as the third metal line.

7. The semiconductor device of claim 1, wherein the fusing line comprises copper.

* * * * *